(12) United States Patent
Murase et al.

(10) Patent No.: US 8,441,002 B2
(45) Date of Patent: May 14, 2013

(54) ORGANIC SEMICONDUCTOR COMPOSITE, ORGANIC TRANSISTOR MATERIAL AND ORGANIC FIELD EFFECT TRANSISTOR

(75) Inventors: Seiichiro Murase, Shiga (JP); Yukari Jo, Shiga (JP); Jun Tsukamoto, Shiga (JP); Junji Mata, Shiga (JP)

(73) Assignee: Toray Industries, Inc., Tokyo (JP)

( * ) Notice: Subject to any disclaimer, the term of this patent is extended or adjusted under 35 U.S.C. 154(b) by 365 days.

(21) Appl. No.: 12/524,714

(22) PCT Filed: Jan. 25, 2008

(86) PCT No.: PCT/JP2008/051032
§ 371 (c)(1),
(2), (4) Date: Jul. 27, 2009

(87) PCT Pub. No.: WO2008/090969
PCT Pub. Date: Jul. 31, 2008

(65) Prior Publication Data
US 2010/0102299 A1    Apr. 29, 2010

(30) Foreign Application Priority Data

Jan. 26, 2007  (JP) ................. 2007-016228
May 11, 2007  (JP) ................. 2007-126371
Jul. 18, 2007  (JP) ................. 2007-186680
Jul. 18, 2007  (JP) ................. 2007-186681

(51) Int. Cl.
*H01L 51/30*    (2006.01)
*H01L 51/54*    (2006.01)
*C09K 11/06*    (2006.01)

(52) U.S. Cl.
USPC .............. 257/40; 428/690; 428/917; 252/510

(58) Field of Classification Search .......... None
See application file for complete search history.

(56) References Cited

U.S. PATENT DOCUMENTS 7,282,742 B2   10/2007  Tsukamoto
2006/0081882 A1*  4/2006  Malenfant et al. ............ 257/203

FOREIGN PATENT DOCUMENTS

| EP | 09241356 | | 3/1996 |
| EP | 1679752 A1 | | 7/2006 |
| JP | 63158556 A | * | 7/1988 |
| JP | 2005-268550 | | 9/2005 |
| JP | 2006-24908 | | 1/2006 |
| JP | 2006-93699 | | 4/2006 |
| JP | 2006128601 A | * | 5/2006 |
| JP | 2006-265534 | | 10/2006 |
| WO | 03/089515 | | 10/2003 |
| WO | 2006/038459 | | 4/2006 |
| WO | 2006025274 A1 | | 9/2006 |

OTHER PUBLICATIONS

Cravino et al. Triphenylamine-Oligothiphene Conjugated Systems as Organic Semiconductors for Opto-Electronics. Chem. Mater. 2006, 18, 2584-2590. Date of on-line publication: Apr. 11, 2006.*
Wei et al. "Synthesis and Electronic Properties of Aldehyde End-Capped Thiophene Oligomers and Other Substituted Sexithiophenes" Chem. Mater. 1996, 8, 2659-2666. Year of publication: 1996.*
Machine translation of the abstract of JP63-158556. Date of publication: Jul. 1, 1988.*
Machine translation of JP09-241356. Date of publication: Sep. 16, 1997.*
Tian et al. "Novel thiophene-aryl co-oligomers for organic thin film transistors" J. Mater. Chem. 2005, 15, 3026-3033. Date of on-line publication: Jun. 13, 2005.*
Machine translation of JP2006-128601. Date of publication: May 18, 2006.*
Videlot-Ackermann, C., Environmentally stable organic thin-films transistors: terminal styryl vs central divinyl benzene building blocks for p-type oligothiophene semiconductors. ScienceDirect, (2006), 465-473 7.

* cited by examiner

*Primary Examiner* — Lynda Salvatore
*Assistant Examiner* — Andrew K Bohaty
(74) *Attorney, Agent, or Firm* — Pillsbury Winthrop Shaw Pittman LLP

(57) ABSTRACT

The present invention provides an organic semiconductor composite containing a certain thiophene compound and carbon nanotubes, which can be formed into a film by a coating process such as an inkjet process, has high charge mobility and can maintain a high on/off ratio even in air, an organic transistor material and an organic field effect transistor.

12 Claims, 1 Drawing Sheet

ORGANIC SEMICONDUCTOR COMPOSITE, ORGANIC TRANSISTOR MATERIAL AND ORGANIC FIELD EFFECT TRANSISTOR

TECHNICAL FIELD

The present invention relates to an organic semiconductor composite containing a thiophene compound and carbon nanotubes, an organic transistor material containing a thiophene compound and an organic field effect transistor.

BACKGROUND ART

Conventional field effect transistor devices (hereinafter, referred to as FET devices) use inorganic semiconductors such as silicon or germanium and require several stages of processes requiring much production cost such as photolithography and vacuum vapor deposition for forming circuit patterns. In semiconductor industries employing such production processes, requests for the reduction in production cost or large-area production in display are increased. However, it is difficult to realize the reduction in production cost or the enlargement of area in the inorganic semiconductor due to the constraints of manufacturing facilities. Further, since the process for forming a film of inorganic semiconductor such as silicon is operated at extremely high temperature, there has been a problem that the variety of materials capable of being used as a substrate are limited.

Therefore, organic field effect transistor devices, in which an organic semiconductor having excellent formability is used as a semiconductor layer, are proposed. By using the organic semiconductor as ink, it becomes possible to form circuit patterns directly on a substrate by ink-jet technology or screening technology.

Important parameters of the FET device performance include mobility and an on/off ratio. An improvement in mobility means that the on-current is increased. On the other hand, an improvement in on/off ratio means that the on-current is increased and the off-current is decreased. Both these improvements mean that a switching characteristic of the FET device is improved, and for example, in liquid crystal displays, this leads to realize high gradation. For example, in the case of liquid crystal display, mobility of 0.1 cm$^2$/V·sec or more and an on/off ratio of $10^5$ or more are required.

As organic semiconductors used for FET devices, low molecular organic semiconductors such as acene-based compounds including pentacene and tetracene, and metal phthalocyanine compounds are disclosed. However, for the low molecular organic semiconductors, a vacuum process such as vapor deposition is often employed and therefore there has been a problem that it is difficult to enlarge the substrate size and reduce in costs. Therefore, polymer organic semiconductors such as conjugated polymers and polythiophenes are disclosed. However, in conjugated polymers typified by poly (p-phenylene vinylene), it is difficult to obtain high orientation and adequate mobility has not been achieved. On the other hand, with respect to polythiophenes typified by poly (3-hexylthiophene) (P3HT), a great deal of research has been done because they are soluble in organic solvents and films can be formed from the solution by ink-jet technology or screening technology. However, there has been a problem that most of the polythiophenes are oxidatively doped with ambient oxygen to cause the increase in off-current and the decrease in on/off ratio.

In recent years, organic semiconductor materials containing soluble oligothiophenes are disclosed (for example, Patent Document 1 and Patent Document 2). However, in the FET devices using these materials, adequate mobility has not been achieved.

Further, as a technique for enhancing the mobility, a method of using a composite in which carbon nanotubes are dispersed in a film of an polymer organic semiconductor such as polythiophenes (for example, Patent Document 3), and a method of using a solid composition in which carbon nanorods or nanotubes are dispersed in organic semiconductor molecules (for example, Patent Document 4) are disclosed, but in all these methods, adequate mobility has not been achieved.

Patent Document 1: JP 2006-128601A (CLAIMS)
Patent Document 2: JP 2006-24908A (CLAIMS)
Patent Document 3: JP 2006-265534A (CLAIMS)
Patent Document 4: JP 2006-93699A (CLAIMS)

DISCLOSURE OF THE INVENTION

Problem to be Solved by the Invention

It is the object of the present invention to provide an organic semiconductor composite which can be formed into a film by a coating process such as an inkjet process, has high charge mobility and can maintain a high on/off ratio even in air, an organic transistor material and an organic field effect transistor.

Means for Solving the Problems

The present invention pertains to an organic semiconductor composite containing carbon nanotubes and a thiophene compound represented by the following general formula (1):

[Formula 1]

$$B^2\text{-}A^1\text{-}B^1 \quad (1)$$

wherein $B^1$ and $B^2$ may be the same or different and each represents a group represented by the following general formula (2), and $A^1$ represents a bivalent linking group represented by any one of the following general formulas (3) to (11);

[Formula 2]

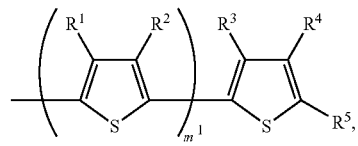

$$(2)$$

wherein $R^1$ to $R^5$ may be the same or different and each is selected from the group consisting of hydrogen, an alkyl group, a cycloalkyl group, a heterocyclic group, an alkenyl group, a cycloalkenyl group, an alkynyl group, an alkoxy group, an alkylthio group, an aryl ether group, an arylthio ether group, an aryl group, a heteroaryl group, a halogen atom, a cyano group, a formyl group, an alkylcarbonyl group, an arylcarbonyl group, a carboxyl group, an alkoxycarbonyl group, an aryloxycarbonyl group, an alkylcarbonyloxy group, an arylcarbonyloxy group, a carbamoyl group, an amino group and a silyl group, and in $R^1$ to $R^5$, adjacent substituents may form a ring with each other, $m^1$ is an integer of 0 to 11, and $R^1$s and $R^2$s may be the same or different when $m^1$ is 2 or more; and

[Formula 3]

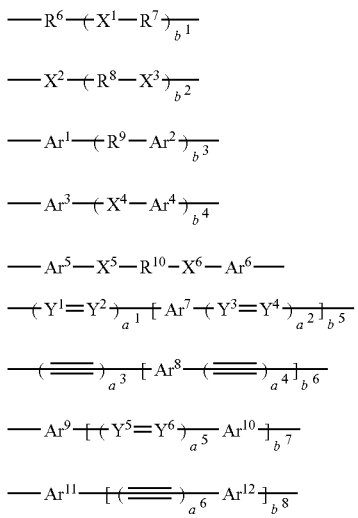

(3)
(4)
(5)
(6)
(7)
(8)
(9)
(10)
(11)

wherein $R^6$ to $R^{10}$ may be the same or different and each represents an alkylene group, a cycloalkylene group, a bivalent heterocyclic group, a carbonyl group, an oxycarbonyl group or a carbonyloxy group, $Ar^1$ to $Ar^{12}$ may be the same or different and each represents an arylene group or a heteroarylene group, $X^1$ to $X^6$ may be the same or different and each represents —O—, —S—, —$NR^{11}$— or —$SiR^{12}R^{13}$—, $Y^1$ to $Y^6$ may be the same or different and each represents —$CR^{14}$= or =N=, $R^{11}$ to $R^{14}$ are selected from the same group as $R^1$ to $R^5$ described above, $a^1$ to $a^6$ represent 1 or 2, and $b^1$ to $b^8$ represent an integer of 0 to 4. Provided that, when $b^3$, $b^4$, $b^7$ or $b^8$ is zero, each of $Ar^1$, $Ar^3$, $Ar^8$ and $Ar^{11}$ represents an arylene group, a heteroarylene group containing at least one nitrogen atom or a condensed heteroarylene group.

Further, the present invention pertains to an organic transistor material containing the organic semiconductor composite.

Further, the present invention pertains to an organic transistor material containing a thiophene compound represented by the following general formula (12):

[Formula 4]

$$B^4\text{-}A^2\text{-}B^3 \quad (12)$$

wherein $B^3$ and $B^4$ may be the same or different and each represents a group represented by the following general formula (13) and $A^2$ represents a bivalent linking group represented by any one of the following general formulas (14) to (18);

[Formula 5]

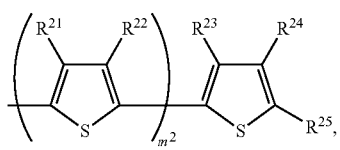

(13)

wherein $R^{21}$ to $R^{25}$ may be the same or different and each is selected from the group consisting of hydrogen, an alkyl group, a cycloalkyl group, a heterocyclic group, an alkenyl group, a cycloalkenyl group, an alkynyl group, an alkoxy group, an alkylthio group, an aryl ether group, an arylthio ether group, an aryl group, a heteroaryl group, a halogen atom, a cyano group, a formyl group, an alkylcarbonyl group, an arylcarbonyl group, a carboxyl group, an alkoxycarbonyl group, an aryloxycarbonyl group, an alkylcarbonyloxy group, an arylcarbonyloxy group, a carbamoyl group, an amino group and a silyl group, and in $R^{21}$ to $R^{25}$, adjacent substituents may form a ring with each other, $m^2$ is an integer of 0 to 11, and $R^{21}$s and $R^{22}$s may be the same or different when $m^2$ is 2 or more; and

[Formula 6]

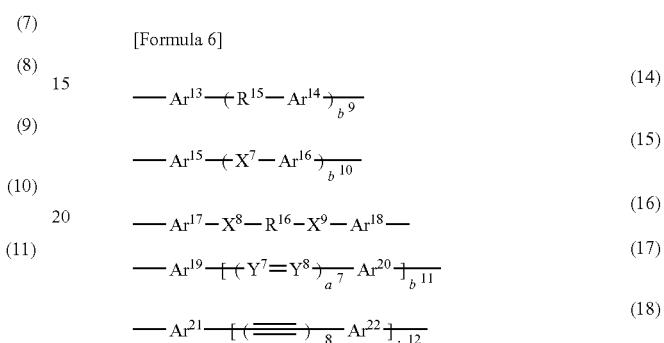

(14)
(15)
(16)
(17)
(18)

wherein $R^{15}$ and $R^{16}$ may be the same or different and each represents an alkylene group, a cycloalkylene group, a bivalent heterocyclic group, a carbonyl group, an oxycarbonyl group or a carbonyloxy group, $Ar^{13}$ to $Ar^{22}$ may be the same or different and each represents an arylene group or a heteroarylene group having a six-membered ring, $X^7$ to $X^9$ may be the same or different and each represents —O—, —S—, —$NR^{17}$— or —$SiR^{18}R^{19}$—, $Y^7$ and $Y^8$ may be the same or different and each represents —$CR^{20}$= or =N=, $R^{17}$ to $R^{20}$ are selected from the same group as $R^1$ to $R^5$ described above, $a^7$ and $a^8$ represent 1 or 2, and $b^9$ to $b^{12}$ represent an integer of 1 to 4.

Further, the present invention pertains to an organic field effect transistor having a gate electrode, an insulating layer, a semiconductor layer, a source electrode and a drain electrode, wherein the semiconductor layer contains the organic transistor material.

Effect of the Invention

In accordance with the present invention, it is possible to provide an organic semiconductor composite which can be formed into a film by a coating process such as an inkjet process, has high charge mobility and can maintain a high on/off ratio even in air, an organic transistor material and an organic field effect transistor.

Figure 1:
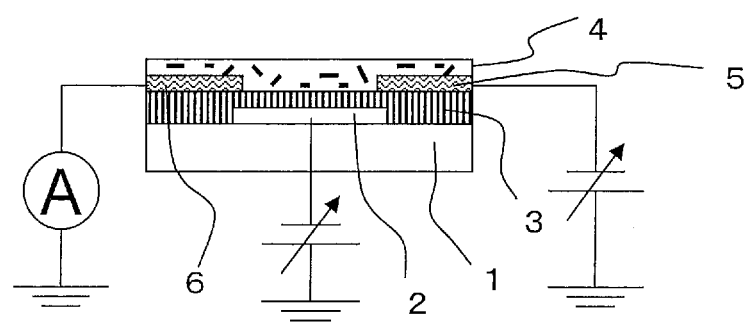
FIG. 1 is a schematic sectional view showing an FET device which is an aspect of the present invention.

DESCRIPTION OF THE REFERENCE
NUMERALS AND SYMBOLS 1 substrate
2 gate electrode
3 insulating layer
4 semiconductor layer
5 source electrode
6 drain electrode

BEST MODE FOR CARRYING OUT THE INVENTION

A detail description will be made about a thiophene compound represented by the following general formula (1):
[Formula 7]

of the present invention,
wherein $B^1$ and $B^2$ may be the same or different and each represents a group represented by the following general formula (2):

[Formula 8]

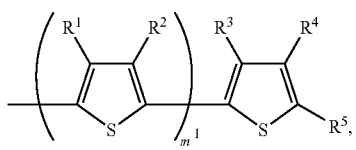

wherein $R^1$ to $R^5$ may be the same or different and each is selected from hydrogen, an alkyl group, a cycloalkyl group, a heterocyclic group, an alkenyl group, a cycloalkenyl group, an alkynyl group, an alkoxy group, an alkylthio group, an aryl ether group, an arylthio ether group, an aryl group, a heteroaryl group, a halogen atom, a cyano group, a formyl group, an alkylcarbonyl group, an arylcarbonyl group, a carboxyl group, an alkoxycarbonyl group, an aryloxycarbonyl group, an alkylcarbonyloxy group, an arylcarbonyloxy group, a carbamoyl group, an amino group and a silyl group, and in $R^1$ to $R^5$, adjacent substituents may form a ring with each other, $m^1$ is an integer of 0 to 11, and $R^1$s and $R^2$s may be the same or different when $m^1$ is 2 or more; and The alkyl groups of $R^1$ to $R^5$ represent saturated aliphatic hydrocarbon groups such as a methyl group, an ethyl group, an n-propyl group, an isopropyl group, an n-butyl group, a sec-butyl group and a tert-butyl group, and these alkyl groups may have a substituent or may have no substituent. An additional substituent in the case of having a substituent is not particularly limited, examples of this substituent include an alkoxy group, an aryl group, and a heteroaryl group, and these additional substituents may further have a substituent. Further, the number of carbon atoms of the alkyl group is not particularly limited but it is preferably 1 or more and 20 or less, and more preferably 1 or more and 8 or less from the viewpoint of availability and cost.

The cycloalkyl group represents a saturated alicyclic hydrocarbon group such as a cyclopropyl group, a cyclohexyl group, a norbornyl group and an adamantly group, and this cycloalkyl group may have a substituent or may have no substituent. In the case of having a substituent, the substituent is not particularly limited and examples of the substituent include an alkyl group, an alkoxy group, an aryl group, and a heteroaryl group, and these substituents may further have a substituent. The descriptions about these substituents are common to the following descriptions. The number of carbon atoms of the cycloalkyl group is not particularly limited but it is preferably 3 or more and 20 or less.

The heterocyclic group represents a group derived from an aliphatic ring, which has atoms other than carbon in the ring, such as a pyran ring, a piperidine ring and an amido ring, and this heterocyclic group may have a substituent or may have no substituent. The number of carbon atoms of the heterocyclic group is not particularly limited but it is preferably within the range of 2 or more and 20 or less.

The alkenyl group represents an unsaturated aliphatic hydrocarbon group containing a double bond such as a vinyl group, an allyl group and a butadienyl group, and this alkenyl group may have a substituent or may have no substituent. The number of carbon atoms of the alkenyl group is not particularly limited but it is preferably within the range of 2 or more and 20 or less.

The cycloalkenyl group represents an unsaturated alicyclic hydrocarbon group containing a double bond such as a cyclopentenyl group, a cyclopentadienyl group and a cyclohexenyl group; and this cycloalkenyl group may have a substituent or may have no substituent. The number of carbon atoms of the cycloalkenyl group is not particularly limited but it is preferably within the range of 2 or more and 20 or less.

The alkynyl group represents an unsaturated aliphatic hydrocarbon group containing a double bond such as an ethynyl group, and this alkynyl group may have a substituent or may have no substituent. The number of carbon atoms of the alkynyl group is not particularly limited but it is preferably within the range of 2 or more and 20 or less.

The alkoxy group represents a functional group formed by substituting an aliphatic hydrocarbon group for one end of the ether bond such as a methoxy group, an ethoxy group and a propoxy group, and this aliphatic hydrocarbon group may have a substituent or may have no substituent. The number of carbon atoms of the alkoxy group is not particularly limited but it is preferably within the range of 1 or more and 20 or less.

The alkylthio group represents a group formed by substituting a sulfur atom for the oxygen atom of the ether bond of the alkoxy group. An aliphatic hydrocarbon group of the alkylthio group may have a substituent or may have no substituent. The number of carbon atoms of the alkylthio group is not particularly limited but it is preferably within the range of 1 or more and 20 or less.

The aryl ether group represents a functional group formed by substituting an aromatic hydrocarbon group for one end of the ether bond such as a phenoxy group and a naphthoxy group, and this aromatic hydrocarbon group may have a substituent or may have no substituent. The number of carbon atoms of the aryl ether group is not particularly limited but it is preferably within the range of 6 or more and 40 or less.

The arylthio ether group represents a group formed by substituting a sulfur atom for the oxygen atom of the ether bond of the aryl ether group. An aromatic hydrocarbon group of the arylthio ether group may have a substituent or may have no substituent. The number of carbon atoms of the arylthio ether group is not particularly limited but it is preferably within the range of 6 or more and 40 or less.

The aryl group represents an aromatic hydrocarbon group such as a phenyl group, a naphthyl group, a biphenyl group, an anthracenyl group, a phenanthryl group, a terphenyl group and a pyrenyl group, and this aryl group may have a substituent or may have no substituent. The number of carbon atoms of the aryl group is not particularly limited but it is preferably within the range of 6 or more and 40 or less.

The heteroaryl group represents an aromatic group, which has one or plural atoms other than carbon in the ring, such as a furanyl group, a thiophenyl group, a benzofuranyl group, a dibenzofuranyl group, a pyridyl group and a quinolinyl group, and this heteroaryl group may have a substituent or may have no substituent. The number of carbon atoms of the heteroaryl group is not particularly limited but it is preferably within the range of 2 to 30.

The halogen atom represents fluorine, chlorine, bromine or iodine.

The carbamoyl group, the amino group and the silyl group may have a substituent or may have no substituent. Examples of the substituent include an alkyl group, a cycloalkyl group, an aryl group, and a heteroaryl group, and these substituents may further have a substituent.

The alkylcarbonyl group represents a functional group formed by substituting an aliphatic hydrocarbon group for one end of a carbonyl bond such as an acetyl group and a hexanoyl group, and this aliphatic hydrocarbon group may have a substituent or may have no substituent. The number of carbon atoms of the alkylcarbonyl is not particularly limited but it is preferably within the range of 2 or more and 20 or less.

The arylcarbonyl group represents a functional group formed by substituting an aromatic hydrocarbon group for one end of the carbonyl bond such as a benzoyl group, and this aromatic hydrocarbon group may have a substituent or may have no substituent. The number of carbon atoms of the arylcarbonyl group is not particularly limited but it is preferably within the range of 7 or more and 40 or less.

The alkoxycarbonyl group, represents a functional group formed by substituting an alkoxy group for one end of the carbonyl bond such as a methoxycarbonyl group, and this alkoxy group may have a substituent or may have no substituent. The number of carbon atoms of the alkoxycarbonyl group is not particularly limited but it is preferably within the range of 2 or more and 20 or less.

The aryloxycarbonyl group represents a functional group formed by substituting an aryloxy group for one end of the carbonyl bond such as a phenoxycarbonyl group, and this aryloxy group may have a substituent or may have no substituent. The number of carbon atoms of the aryloxycarbonyl group is not particularly limited but it is preferably within the range of 7 or more and 40 or less.

The alkylcarbonyloxy group represents a functional group formed by substituting an alkylcarbonyl group for one end of the ether bond such as an acetoxy group, and this alkylcarbonyl group may have a substituent or may have no substituent. The number of carbon atoms of the alkylcarbonyloxy group is not particularly limited but it is preferably within the range of 2 or more and 20 or less.

The arylcarbonyloxy group represents a functional group formed by substituting an arylcarbonyl group for one end of the ether bond such as a benzoyloxy group, and this arylcarbonyl group may have a substituent or may have no substituent. The number of carbon atoms of the arylcarbonyloxy group is not particularly limited but it is preferably within the range of 7 or more and 40 or less.

The case where adjacent groups are coupled with each other to form a ring means, for the case of the general formula (2), the case where any adjacent two groups (for example, $R^1$ and $R^2$) selected from the groups of $R^1$ to $R^5$ are combined with each other to form a conjugated or unconjugated fused ring. Constituent elements of the fused ring may include nitrogen, oxygen, sulfur, phosphorus or silicon in addition to carbon. The fused ring may be further combined with another ring.

$m^1$ represents an integer of 0 to 11, $a^1$ to $a^6$ represent 1 or 2, and $b^1$ to $b^8$ represent an integer of 1 to 4. If $m^1$, $a^1$ to $a^6$ and $b^1$ to $b^8$ are within the above-mentioned range, the conjugation length of the thiophene compound represented by the general formula (1) is controlled to be an adequate length, the oxidation stability is improved and a high on/off ratio can be maintained in air. Further, since the thiophene compound can be synthesized with relative ease, it becomes possible to reduce costs. These descriptions are also common to the descriptions of numerical ranges of $a^7$, $a^8$ and $b^9$ to $b^{13}$, described later. Furthermore, if $m^1$ is an integer of 0 to 7, it is preferable since the oxidation stability and ease of synthesis are further improved. Further, when $m^1$ is 2 or more, $R^1$s and $R^2$s may be the same or different. As for a molecular weight, preferably, the molecular weight of the thiophene compound represented by the general formula (1) is 3000 or less.

In consideration of compatibility with the coating process, preferably, at least one of $R^1$ to $R^5$ is an alkyl group or an alkoxy group having 4 or more carbon atoms.

Further, in the general formula (1), $A^1$ represents a bivalent linking group represented by any one of the following general formulas (3) to (11):

[Formula 9]

(3)

(4)

(5)

(6)

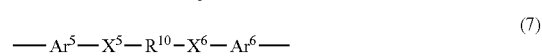
(7)

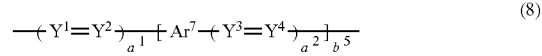
(8)

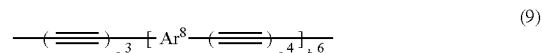
(9)

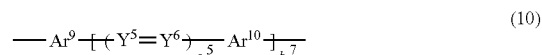
(10)

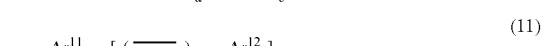
(11)

wherein $R^6$ to $R^{10}$ may be the same or different and each represents an alkylene group, a cycloalkylene group, a bivalent heterocyclic group, a carbonyl group, an oxycarbonyl group or a carbonyloxy group, $Ar^1$ to $Ar^{12}$ may be the same or different and each represents an arylene group or a heteroarylene group, $X^1$ to $X^6$ may be the same or different and each represents —O—, —S—, —$NR^{11}$— or —$SiR^{12}R^{13}$—, $Y^1$ to $Y^6$ may be the same or different and each represents —$CR^{14}$= or —N=, $R^{11}$ to $R^{14}$ are selected from the same group as $R^1$ to $R^5$ described above, $a^1$ to $a^6$ may be the same or different and each represent 1 or 2, and $b^1$ to $b^8$ may be the same or different and each represent an integer of 0 to 4. However, when $b^3$, $b^4$, $b^7$ or $b^8$ is zero, each of $Ar^1$, $Ar^3$, $Ar^g$ and $Ar^{11}$ represents an arylene group, a heteroarylene group containing at least one nitrogen atom or a condensed heteroarylene group.

The alkylene groups of $R^6$ to $R^{10}$ represent bivalent saturated aliphatic hydrocarbon groups such as a methylene group, an ethylene group and a propylene group, and these alkylene groups may have a substituent or may have no substituent. The number of carbon atoms of the alkylene group is not particularly limited but it is preferably 1 or more and 12 or less, and more preferably 1 or more and 8 or less from the viewpoint of availability and cost.

The cycloalkylene group represents a bivalent group derived from a saturated alicyclic hydrocarbon group such as cyclopropane, cyclohexane, norbornene and an adamantane, and this cycloalkylene group may have a substituent or may have no substituent. The number of carbon atoms of the cycloalkylene group is not particularly limited but it is preferably 3 or more and 20 or less.

The bivalent heterocyclic group represents a bivalent group derived from an aliphatic ring, which has atoms other than carbon in the ring, such as a pyran ring, a piperidine ring and an amido ring, and this bivalent heterocyclic group may have a substituent or may have no substituent. The number of carbon atoms of the heterocyclic group is not particularly limited but it is preferably within the range of 2 or more and 20 or less.

The arylene groups of $Ar^1$ to $Ar^{12}$ represent bivalent groups derived from aromatic hydrocarbons such as benzene, naphthalene, biphenyl, phenanthrene, terphenyl and pyrene, and these arylene groups may have a substituent or may have no substituent. The number of carbon atoms of the arylene group is not particularly limited but it is preferably within the range of 6 to 30.

The heteroarylene group represents a bivalent group derived from an aromatic group, which has one or plural atoms other than carbon in the ring, such as furan, benzothiophene, carbazole, oxadiazole and quinoxaline, and this heteroarylene group may have a substituent or may have no substituent. The number of carbon atoms of the heteroarylene group is not particularly limited but it is preferably within the range of 2 to 30.

The heteroarylene group containing at least one nitrogen atom represents a heteroarylene group, which has one or plural nitrogen atoms in the ring, such as pyridine, quinoline, oxazole and benzothiazole, and this heteroarylene group may have a substituent or may have no substituent. Further, the fused heteroarylene group represents a heteroarylene group, which is formed by condensing two or more aromatic rings, such as benzofuran, dibenzofuran, phenanthroline and benzodithiophene, and this fused heteroarylene group may have a substituent or may have no substituent.

The descriptions of $R^{11}$ to $R^{14}$ are similar to those of to $R^5$ described above.

By the linking group $A^1$ having such a structure, the oxidation stability is further improved and the good compatibility with the CNT is obtained.

$B^1$ and $B^2$ in the general formula (1) may be the same or different, but it is preferable that $B^1$ and $B^2$ are the same group, since it becomes possible to reduce the number of steps in the synthesis process to cut costs.

Further, preferably, $R^5$ in the general formula (2) is an alkyl group substituted by a group containing one or more oxygen atoms. Thereby, the solubility of the composite in the solvent can be improved while maintaining high orientation of thiophene skeletons to one another, and facilitates to prepare an FET device having high mobility by use of a solution process such as an ink-jet method.

Examples of the alkyl group substituted by a group containing one or more oxygen atoms include 2-methoxyethyl group, 2-ethoxyethyl group, 2-butoxyethyl group, 2-hexyloxyethyl group, 2-nonyloxyethyl group, 2-octyloxyethyl group, 2-decyloxyethyl group, 2-hexadecyloxyethyl group, methoxymethyl group, ethoxymethyl group, butoxymethyl group, pentyloxymethyl group, hexyloxymethyl group, nonyloxymethyl group, dodecyloxymethyl group, 3-butoxypropyl group, 3-octyloxypropyl group, 3-nonyloxypropyl group, 3-dodecyloxypropyl group, 4-botoxybutyl group, 4-octyloxybutyl group, 4-decyloxybutyl group, 4-dodecyloxybutyl group, 2-(2-methoxyethoxy)ethyl group, 2-(2-ethoxyethoxy)ethyl group, 2-(2-propoxyethoxy)ethyl group, 2-(2-butoxyethoxy)ethyl group, 2-(2-pentyloxyethoxy)ethyl group, 2-(2-hexyloxyethoxy)ethyl group, 2-(2-octyloxyethoxy)ethyl group, 2-(2-dodecyloxyethoxy)ethyl group, 2-methoxymethoxyethyl group, 2-(3-methoxypropoxy)ethyl group, 2-(2-methoxyethoxy)methyl group, 2-ethoxyethoxymethyl group, 2-propoxyethoxymethyl group, 2-hexyloxyethoxymethyl group, 3-(2-ethoxyethoxy)propyl group, 3-(2-propoxyethoxy)propyl group, 4-(2-methoxyethoxy)butyl group, 4-(2-ethoxyethoxy)butyl group, 2-(4-ethoxybutoxy)ethyl group, 2-(4-methoxybutoxy)ethyl group, 2-[2-(2-methoxyethoxy)ethoxy]ethyl group, 2-[2-(2-ethoxyethoxy)ethoxy]ethyl group, 2-[2-(2-butoxyethoxy)ethoxy]ethyl group, 2-[2-(2-pentyloxyethoxy)ethoxy]ethyl group, 2-(2-ethoxyethoxy)ethoxymethyl group, 2-(2-propoxyethoxy)ethoxymethyl group, 2-(2-butoxyethoxy)ethoxymethyl group, 2-(2-hexyloxyethoxy)ethoxymethyl group, 4-[2-(2-methoxyethoxy)ethoxy]butyl group, 4-[2-(2-ethoxyethoxy)ethoxy]butyl group, 6-[2-(2-propoxyethoxy)ethoxy]hexyl group, 3-[2-(2-pentyloxyethoxy)ethoxy]propyl group, 2-[2-(4-methoxybutoxy)ethoxy]ethyl group, 2-[2-(4-ethoxybutoxy)ethoxy]ethyl group, 2-[2-(4-ethoxybutoxy)ethoxy]ethyl group, 2-{2-[2-(2-ethoxyethoxy)ethoxy]ethoxy}ethyl group, and 2-[2-(2-ethoxyethoxy)ethoxy]ethoxymethyl group.

Further, among the thiophene compounds represented by the general formula (1), compounds having one or more liquid crystalline states are preferable. The liquid crystalline state is one of intermediate states between a crystalline state and a liquid state and it has both anisotropy of crystal and fluidity of liquid. A compound having such a liquid crystalline state (hereinafter, referred to as a liquid crystalline compound) can realize excellent molecular orientation and form an organic semiconductor thin film having extremely high crystallinity by virtue of its high self-organization ability. Furthermore, if the liquid crystalline compound is coated from a solution and then heated to a temperature at which the liquid crystalline property is exhibited, it is also possible to impart fluidity to the liquid crystalline compound and produce a highly crystalline state. By using a thiophene compound having one or more liquid crystalline states in this way, an organic semiconductor thin film having high mobility can be realized using a coating process.

Examples of the thiophene compound having one or more liquid crystalline states described above include compounds in which $R^5$ in the general formula (1) is selected from the groups consisting of an alkyl group having 2 to 20 carbon atoms, an alkyl group which is substituted by a group containing one or more oxygen atoms and has 2 to 20 carbon atoms, an alkoxy group having 1 to 20 carbon atoms, an alkoxy group which is substituted by a group containing one or more oxygen atoms and has 1 to 20 carbon atoms, an alkenyl group having 4 to 20 carbon atoms, an alkenyl group which is substituted by a group containing one or more oxygen atoms and has 4 to 20 carbon atoms, an alkynyl group having 4 to 20 carbon atoms, an alkynyl group which is substituted by a group containing one or more oxygen atoms and has 4 to 20 carbon atoms, an alkylthio group having 1 to 20 carbon atoms, an alkylthio group which is substituted by a group containing one or more oxygen atoms and has 1 to 20 carbon atoms, an alkylcarbonyl group having 3 to 20 carbon atoms, an alkylcarbonyl group which is substituted by a group containing one or more oxygen atoms and has 3 to 20 carbon atoms, an alkoxycarbonyl group having 2 to 20 carbon atoms, an alkoxycarbonyl group which is substituted by a group containing one or more oxygen atoms and has 2 to 20 carbon atoms, an alkylcarbonyloxy group having 3 to 20 carbon atoms, an alkylcarbonyloxy group which is substituted by a group containing one or more oxygen atoms and has 3 to 20 carbon atoms, a silyl group substituted by an alkyl group having 2 or more carbon atoms, and a silyl group substituted by a group containing one or more oxygen atoms and having 2 or more carbon atoms.

It is possible to check whether the thiophene compound has the liquid crystalline state or not by a differential scanning calorimeter or through the observation by a polarization microscope. In the present invention, a differential scanning calorimeter is used and the measurement is carried out over a temperature range from room temperature to the melting point of the compound under the conditions that a temperature raising rate and a temperature falling rate are both 5° C./min, and the presence or absence of a liquid crystalline state is judged based on the presence or absence of a phase transition point. If a phase transition point between liquid crystal phase and crystal phase is observed, it can be decided that the thiophene compound has a liquid crystalline state.

Among the compounds represented by the general formula (1) of the present invention, compounds represented by the following general formula (12) are more preferable. By having such a structure, it is possible to further improve the oxidation stability and obtain high mobility.

[Formula 10]

(12)

In the above formula, $B^3$ and $B^4$ may be the same or different and each represents a group represented by the following general formula (13). It is more preferable that $B^3$ and $B^4$ are the same group since it is possible to reduce the number of steps in the synthesis process to cut costs.

[Formula 11]

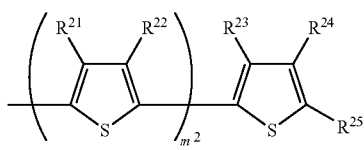
(13)

In the above formula, $R^{21}$ to $R^{25}$ may be the same or different and each is selected from the group consisting of hydrogen, an alkyl group, a cycloalkyl group, a heterocyclic group, an alkenyl group, a cycloalkenyl group, an alkynyl group, an alkoxy group, an alkylthio group, an aryl ether group, an arylthio ether group, an aryl group, a heteroaryl group, a halogen atom, a cyano group, a formyl group, an alkylcarbonyl group, an arylcarbonyl group, a carboxyl group, an alkoxycarbonyl group, an aryloxycarbonyl group, an alkylcarbonyloxy group, an arylcarbonyloxy group, a carbamoyl group, an amino group and a silyl group, and in $R^{21}$ to $R^{25}$, adjacent substituents may form a ring with each other, $m^2$ is an integer of 0 to 11, and $R^{21}$s and $R^{25}$s may be the same or different when $m^2$ is 2 or more. The descriptions of $R^{21}$ to $R^{25}$ are similar to those of $R^1$ to $R^5$ described above.

$A^2$ represents a bivalent linking group represented by any one of the following general formulas (14) to (18):

[Formula 12]

(14)

(15)

(16)

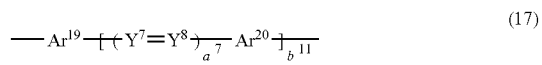
(17)

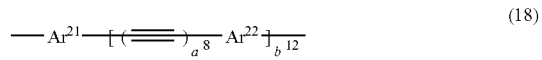
(18)

wherein $R^{15}$ and $R^{16}$ may be the same or different and each represents an alkylene group, a cycloalkylene group, a bivalent heterocyclic group, a carbonyl group, an oxycarbonyl group or a carbonyloxy group, $Ar^{13}$ to $Ar^{22}$ may be the same or different and each represents an arylene group or a heteroarylene group having a six-membered ring, $X^7$ to $X^9$ may be the same or different and each represents —O—, —S—, —NR$^{17}$— or —SiR$^{18}$R$^{19}$—, $Y^7$ and $Y^8$ may be the same or different and each represents —CR$^{20}$═ or —N═, $R^{17}$ to $R^{20}$ are selected from the same group as $R^1$ to $R^5$ described above, $a^7$ and $a^8$ represent 1 or 2, and $b^9$ to $b^{12}$ represent an integer of 1 to 4.

The descriptions of $R^{15}$ and $R^{16}$ are similar to those of $R^6$ to $R^{10}$ described above and the descriptions of $R^{17}$ to $R^{25}$ are similar to those of $R^1$ to $R^5$ described above.

The heteroarylene groups having a six-membered ring of $Ar^{13}$ to $Ar^{22}$ represent bivalent groups derived from an aromatic ring which have one or plural atoms other than carbon in the ring and has at least one six-membered ring structure such as pyridine, benzofuran, dibenzothiophene, carbazole, benzooxadiazole, quinoxaline and the like. These heteroarylene groups may have a substituent or may have no substituent. The number of carbon atoms of the heteroarylene group is not particularly limited but it is preferably within the range of 4 to 30.

The descriptions of arylene groups of $Ar^{13}$ to $Ar^{22}$ are as described above.

Furthermore, it is preferable that $A^2$ in the general formula (12) is a group represented by the following general formula (19) since the mobility is further improved.

[Formula 13]

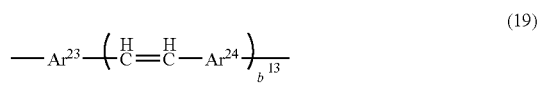
(19)

In the above formula, $A^{23}$ and $A^{24}$ may be the same or different and each represents an arylene group or a heteroarylene group having a six-membered ring. $b^{13}$ represents an integer of 1 to 4.

The descriptions of the arylene group and the heteroarylene group having a six-membered ring are as described above.

Specific examples of the bivalent linking group represented by $A^1$ or $A^2$ described above include the following groups:

[Formula 14]
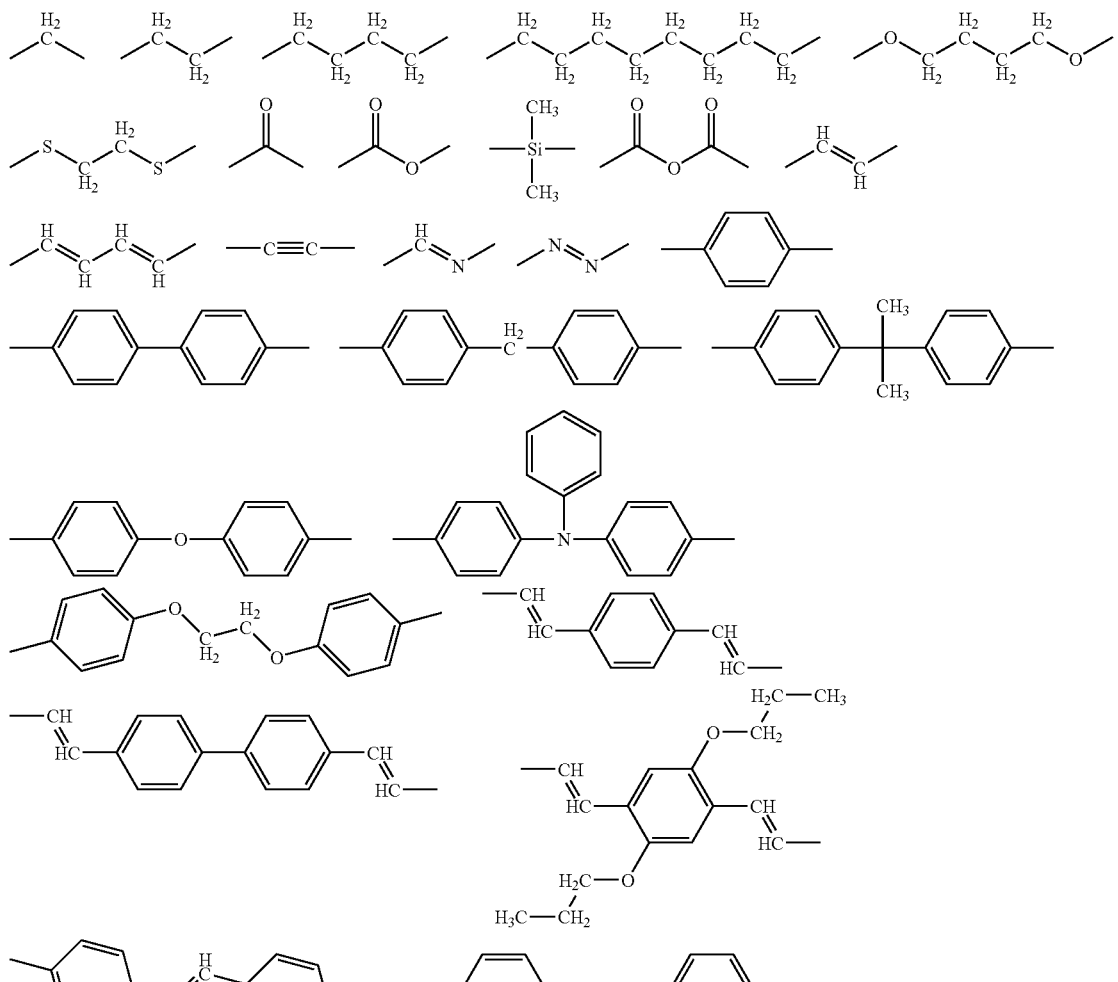
[Formula 15]
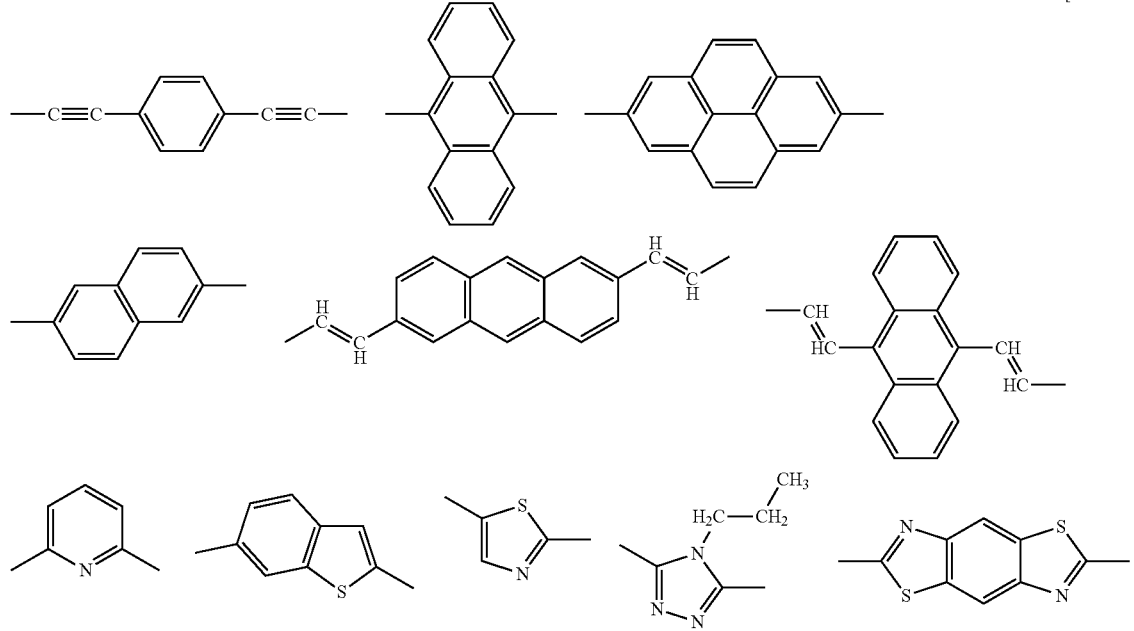

-continued
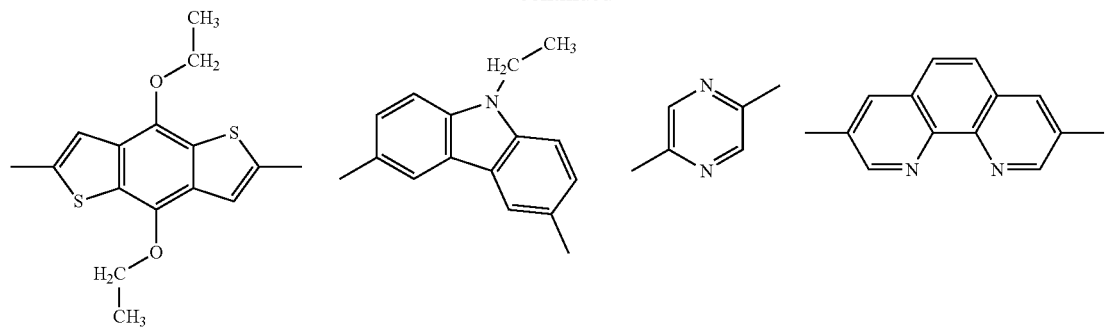
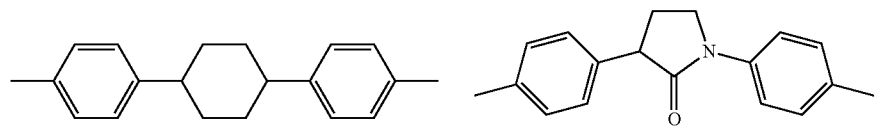
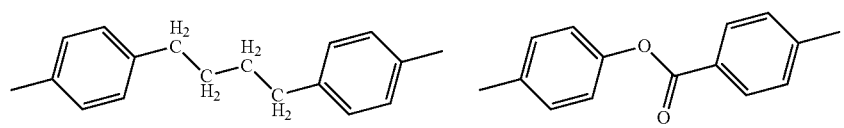
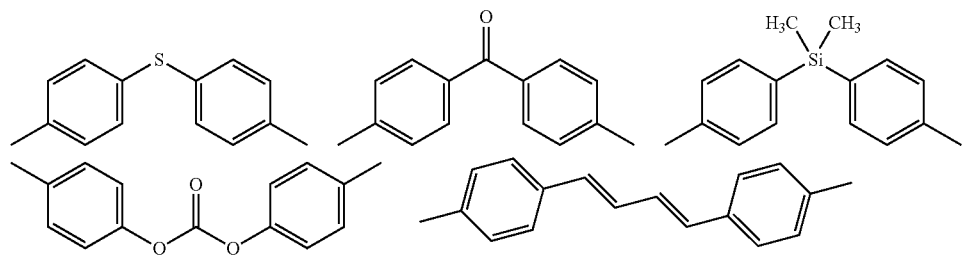
[Formula 16]
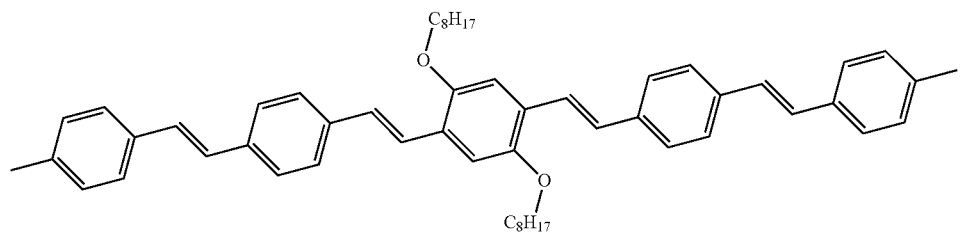
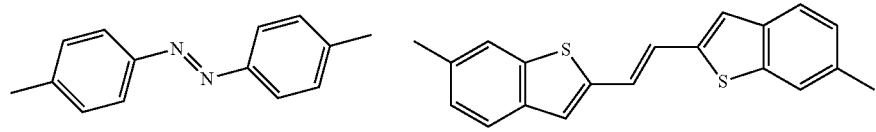
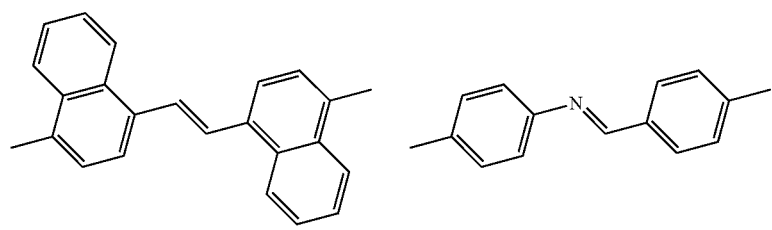
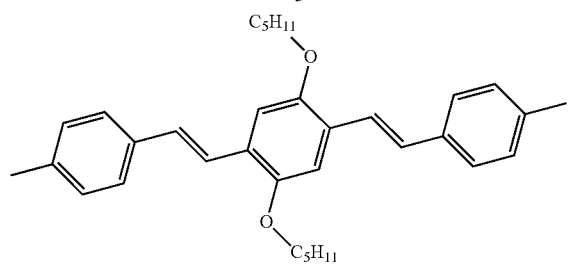

-continued
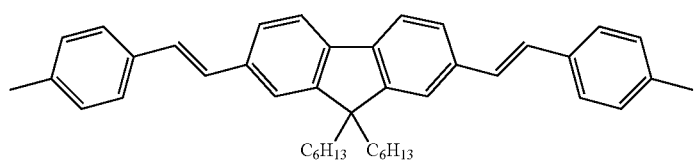
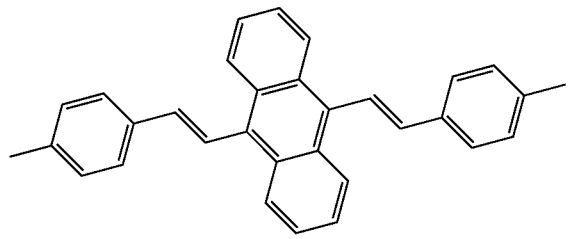
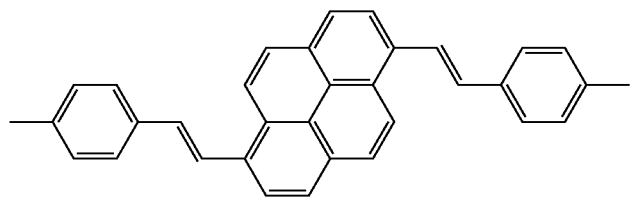
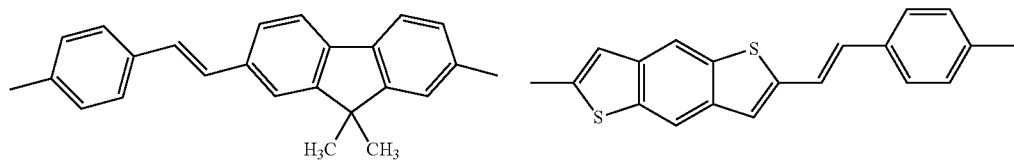
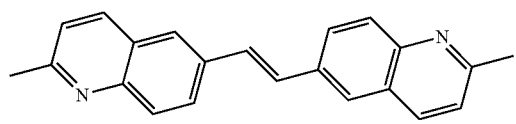
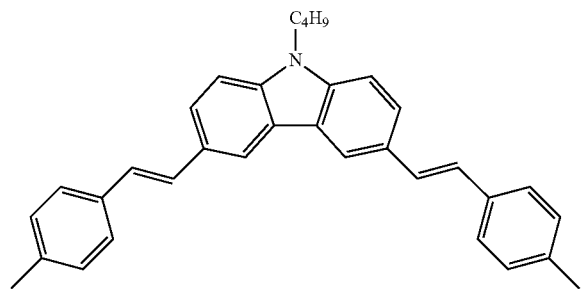
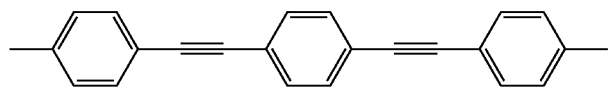
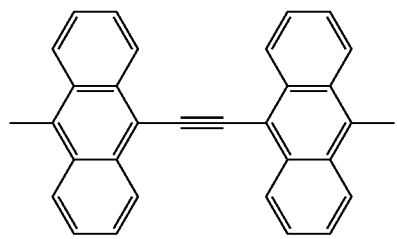

Specific examples of the thiophene compounds represented by the general formula (1), described above, include the following compounds:
[Formula 17]
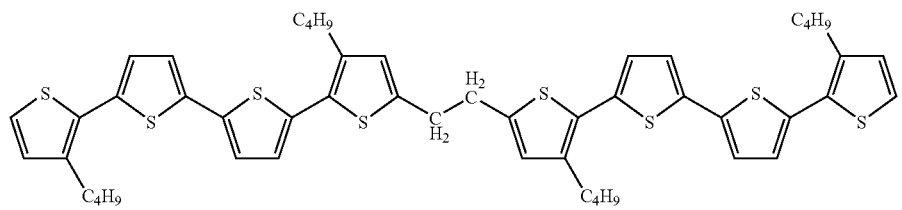
[1]
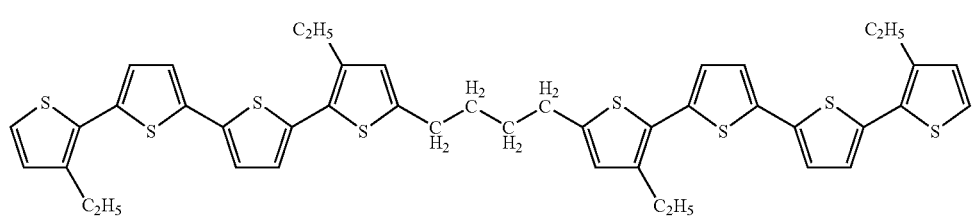
[2]
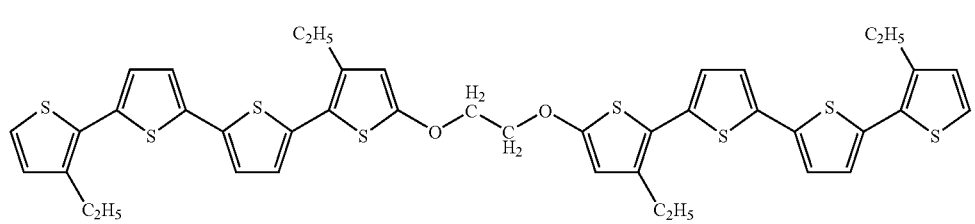
[3]
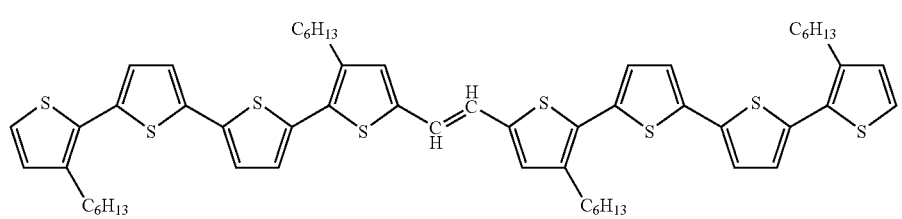
[4]
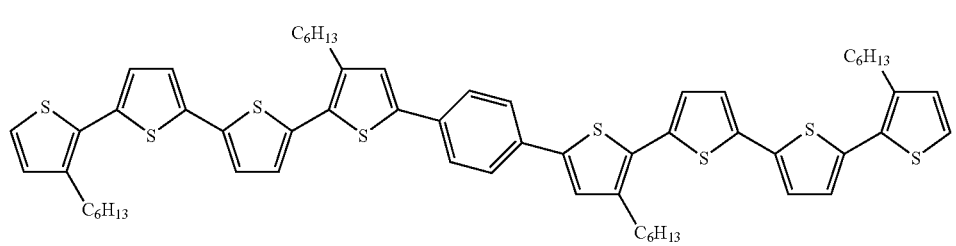
[5]
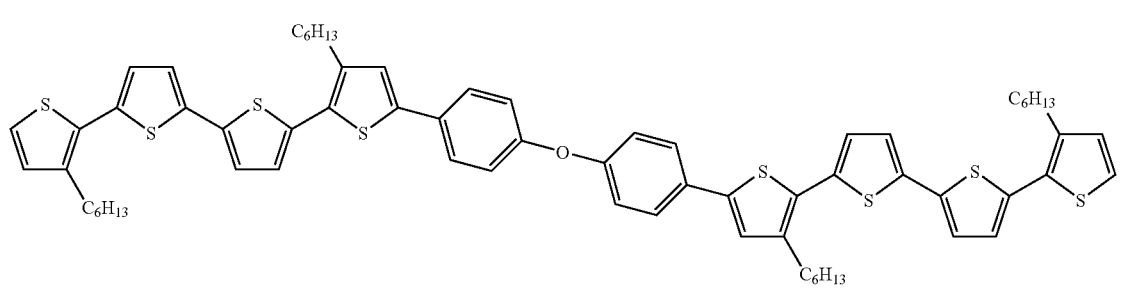
[6]

[Formula 18]
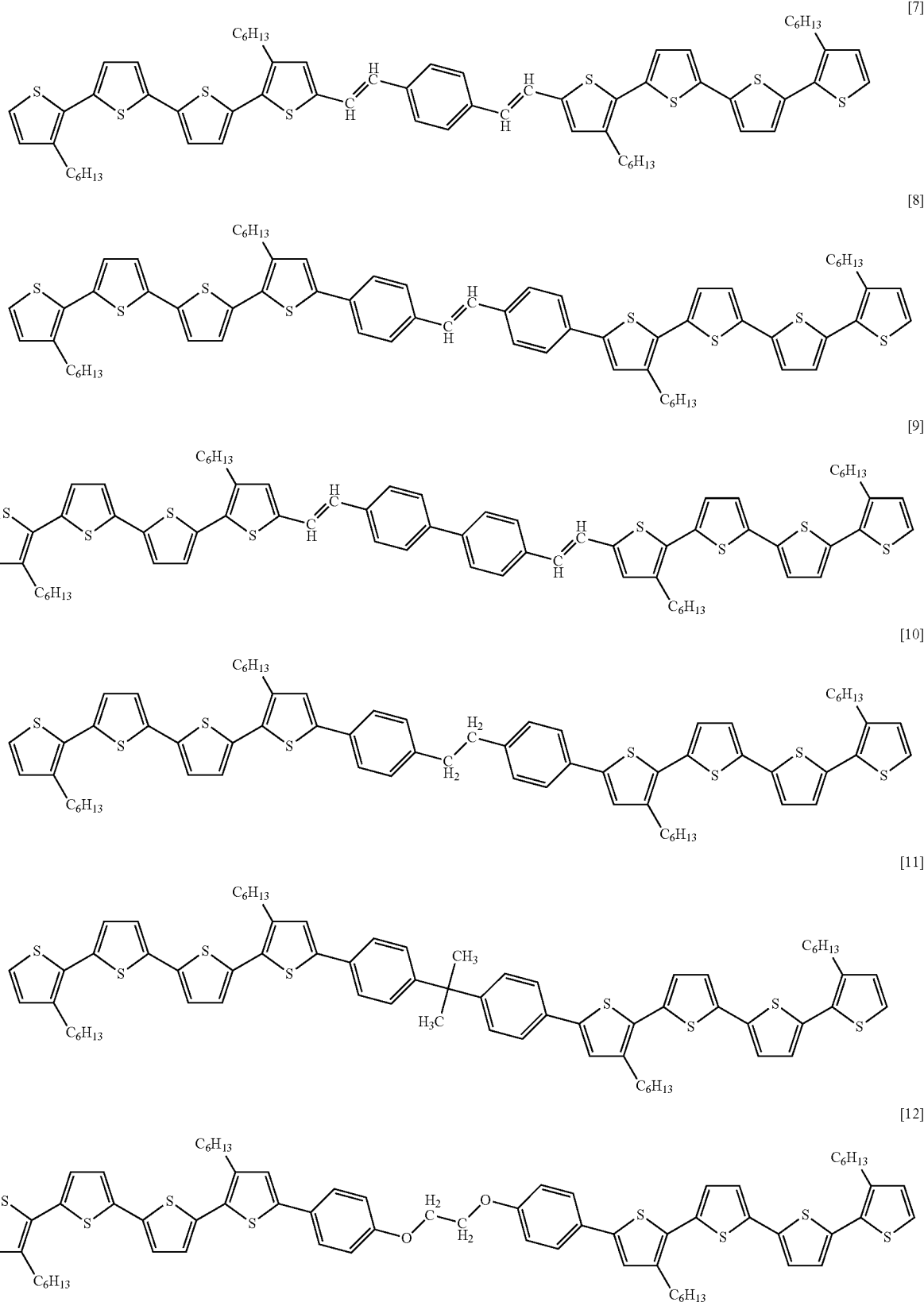

[Formula 19]
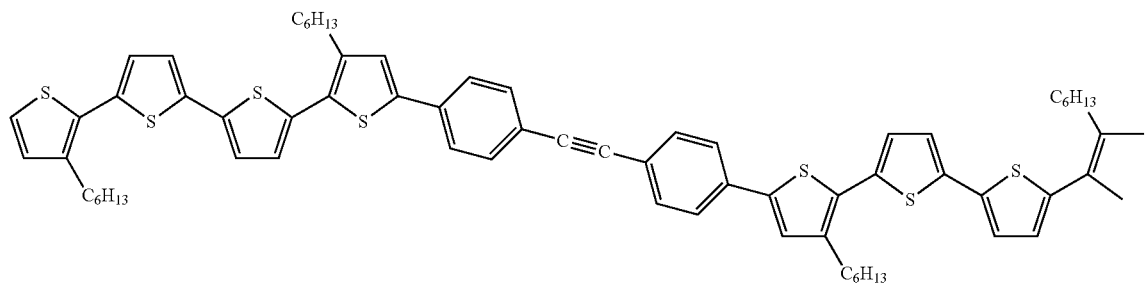
[13]
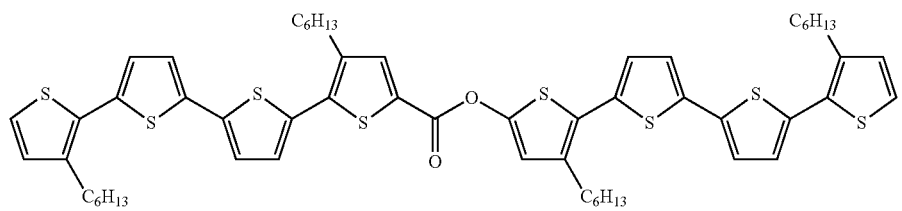
[14]
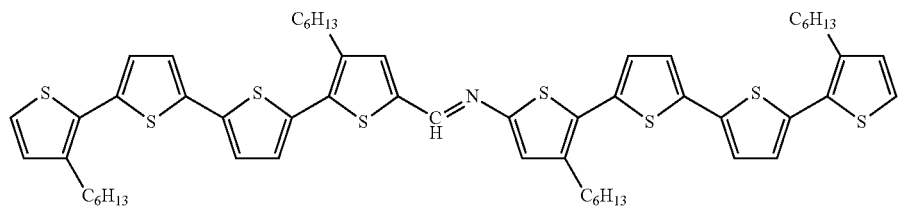
[15]
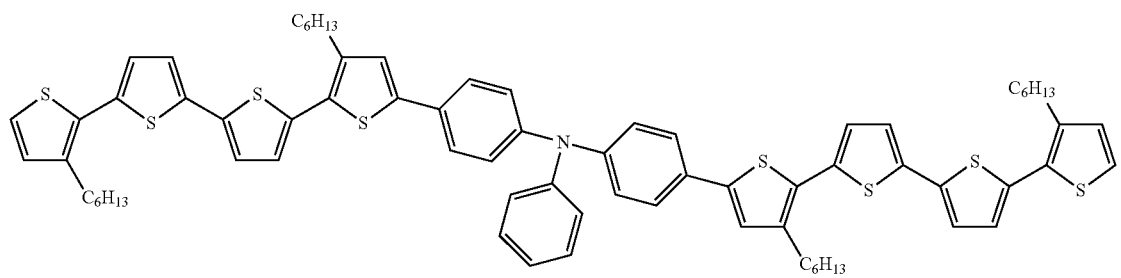
[16]
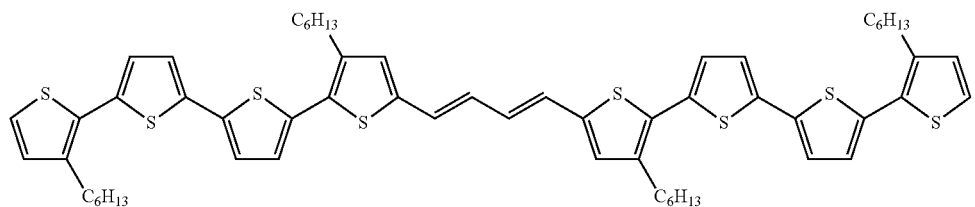
[17]
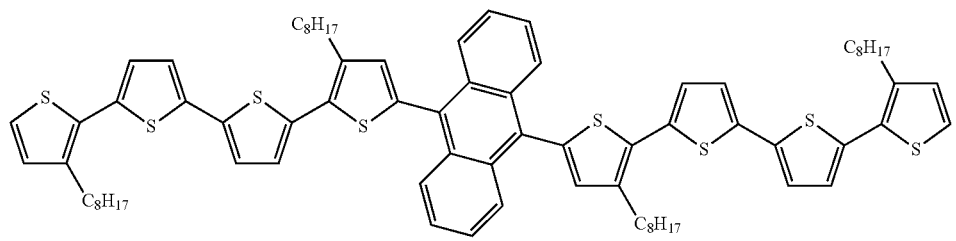
[18]

-continued
[Formula 20]
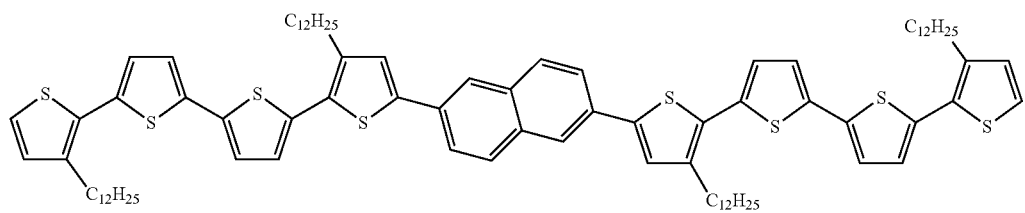
[19]
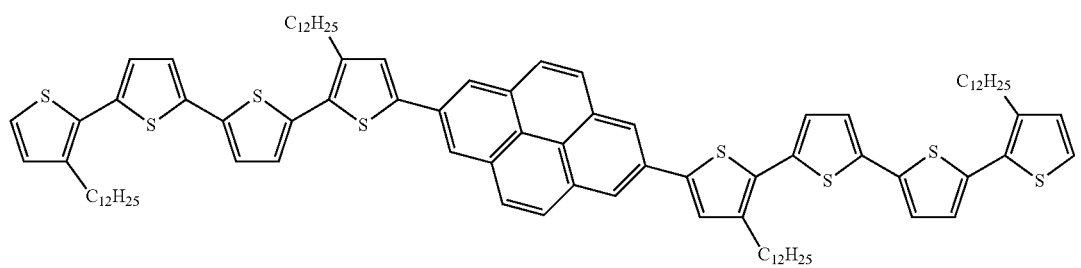
[20]
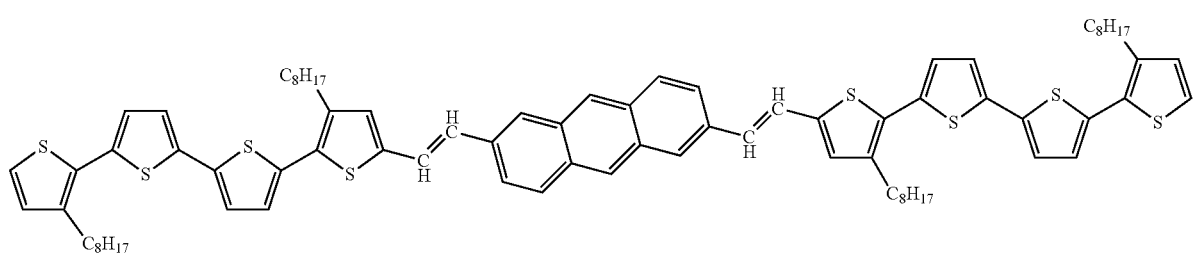
[21]
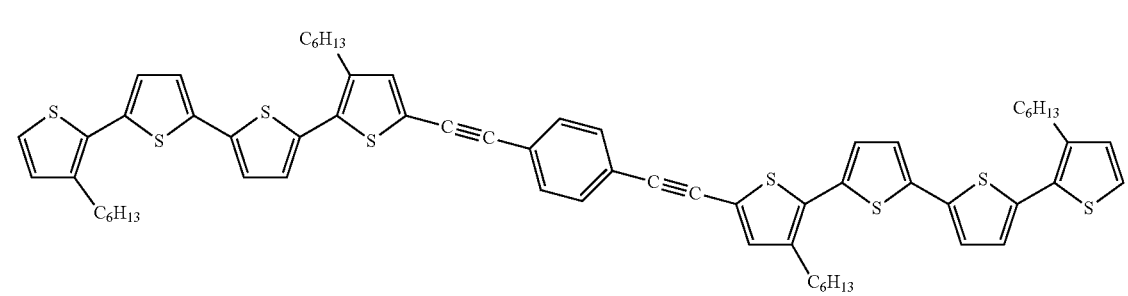
[22]
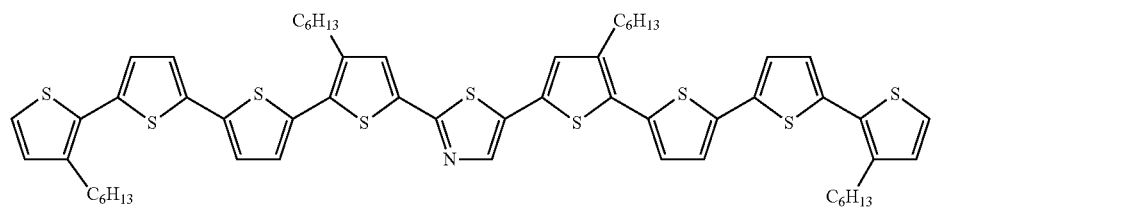
[23]
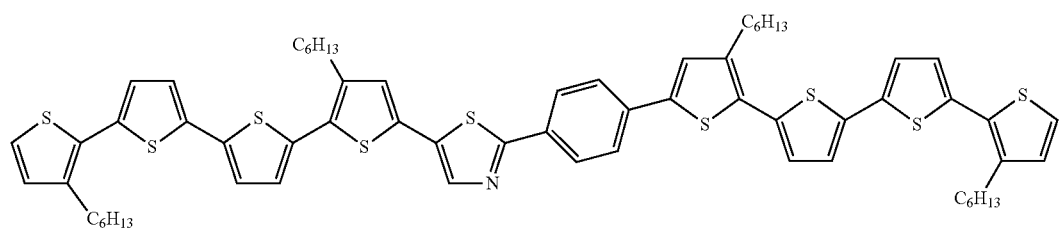
[24]

-continued
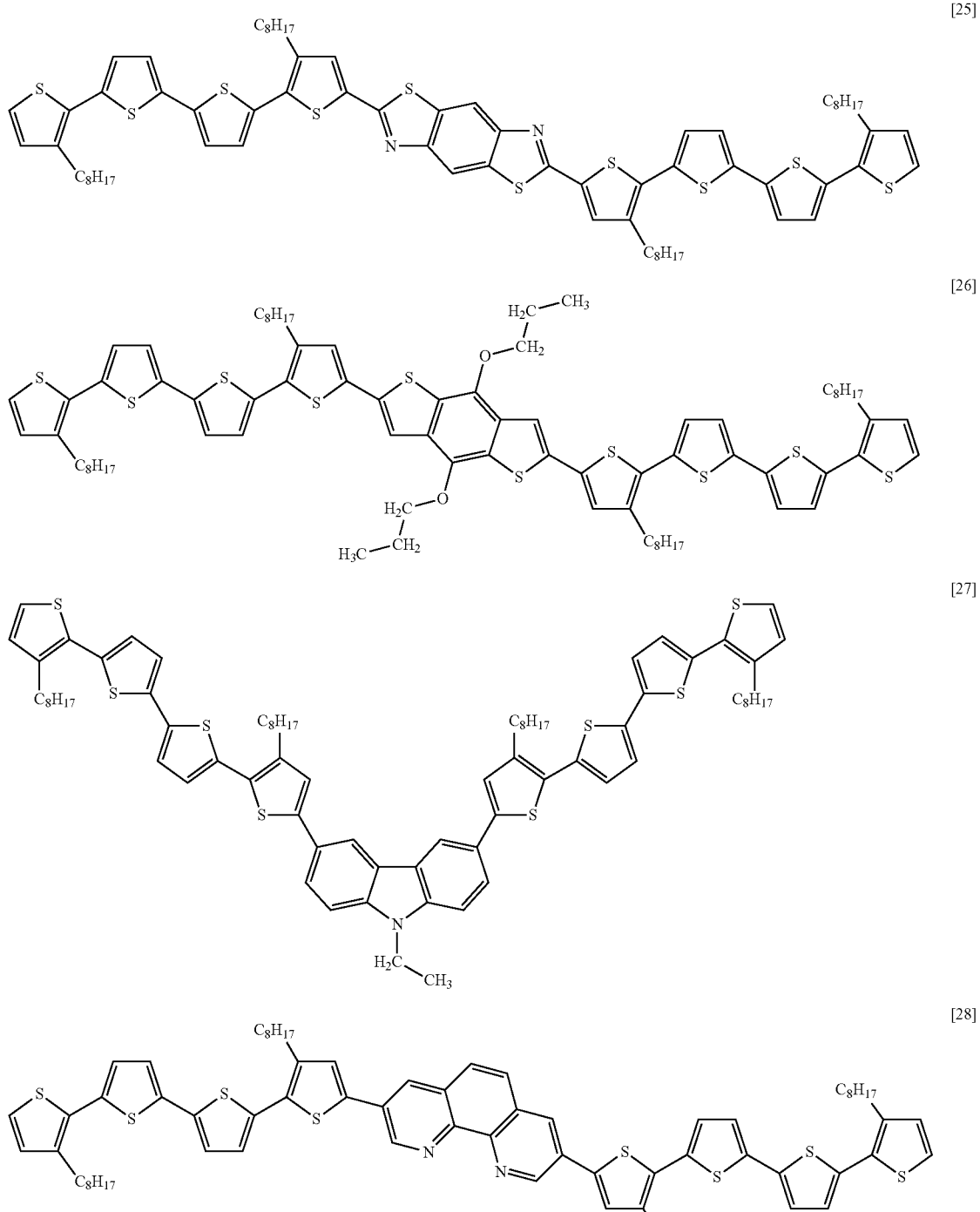
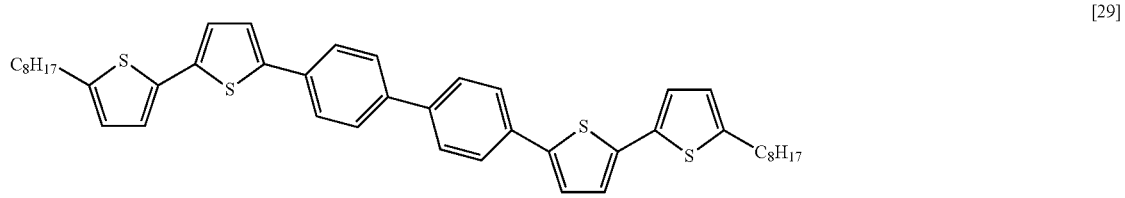

-continued
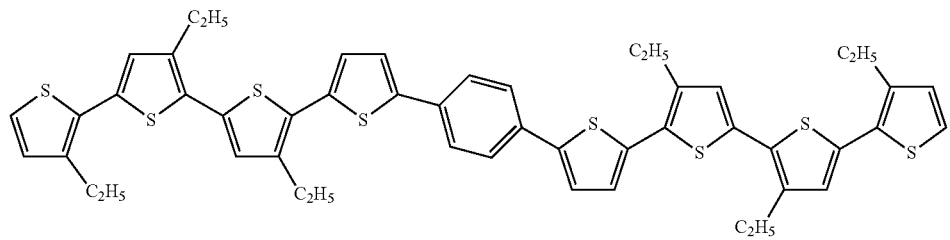
[30]
[Formula 22]
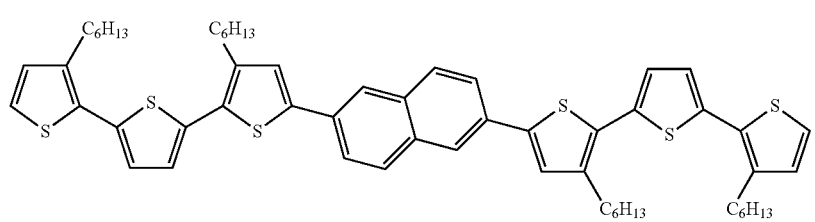
[31]
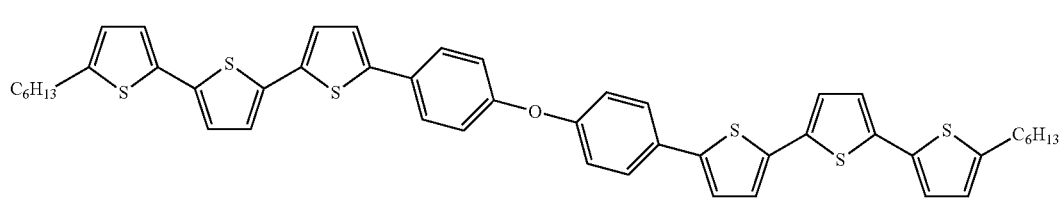
[32]
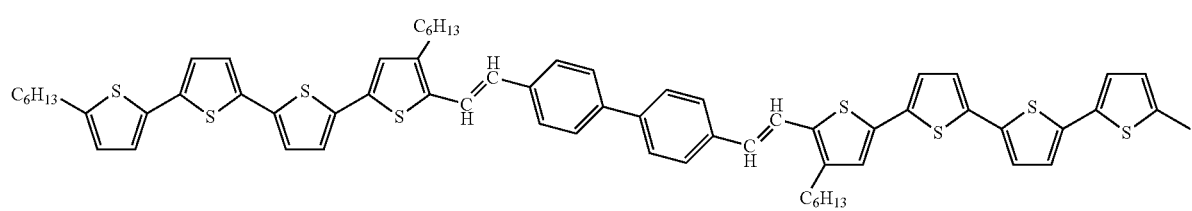
[33]
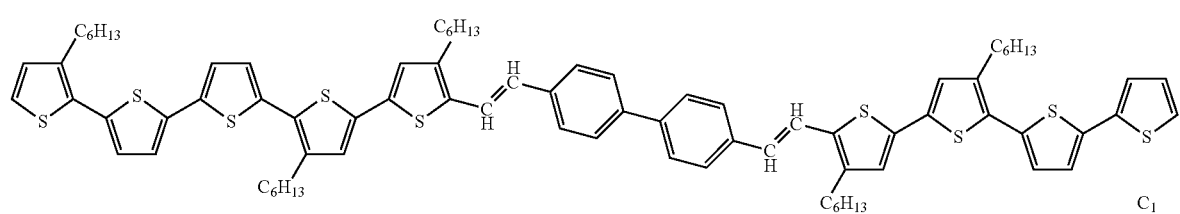
[34]
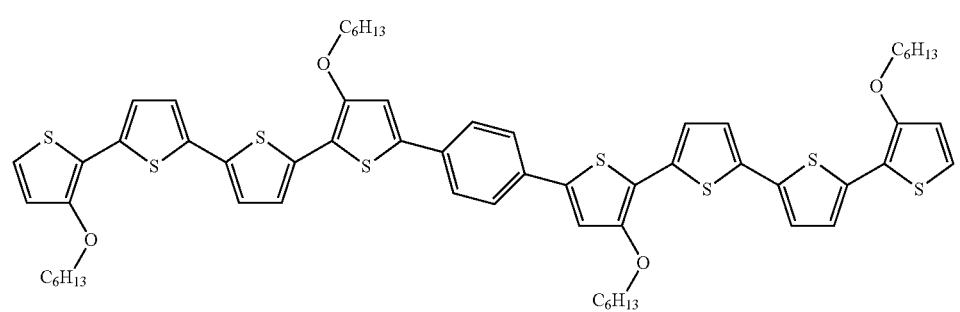
[35]

[36]
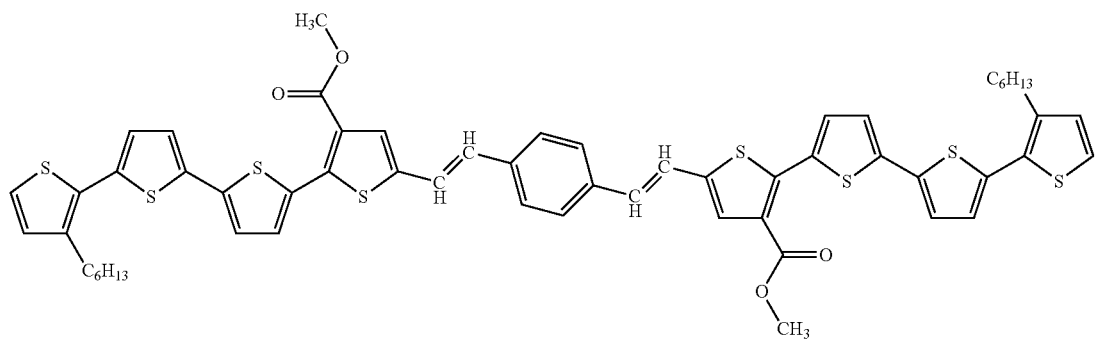
[Formula 23]
[37]
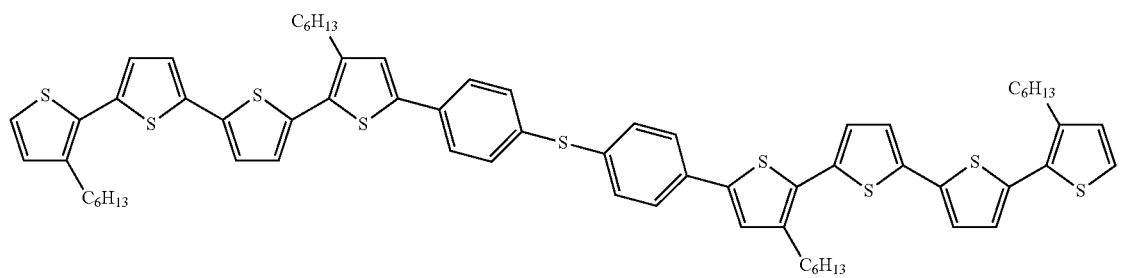
[38]
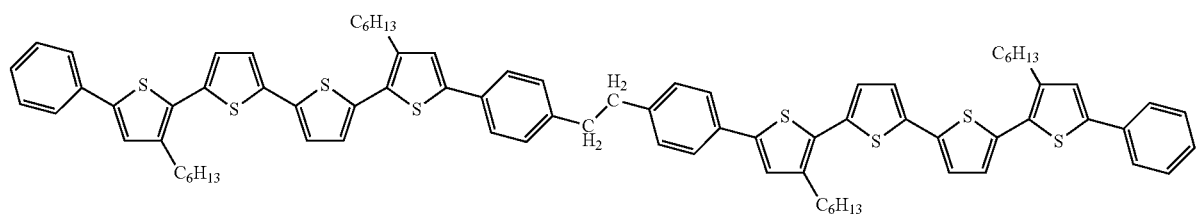
[39]
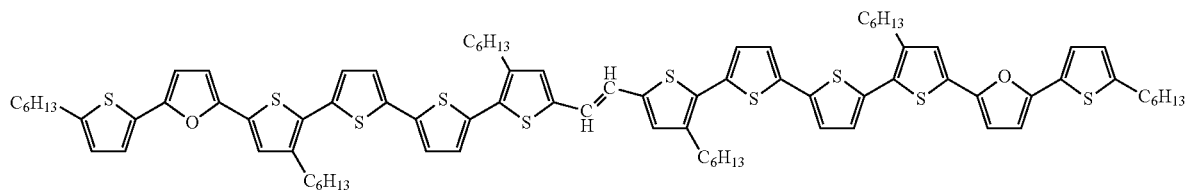
[40]
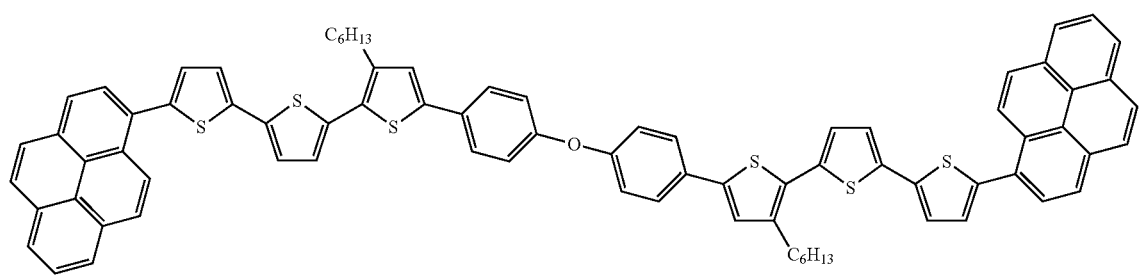

[41]
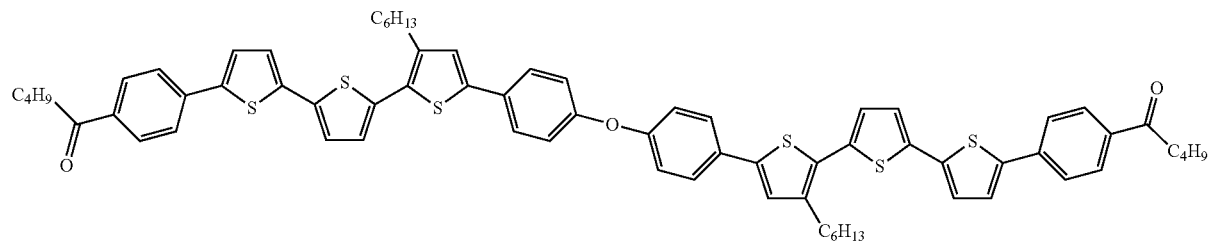
[42]
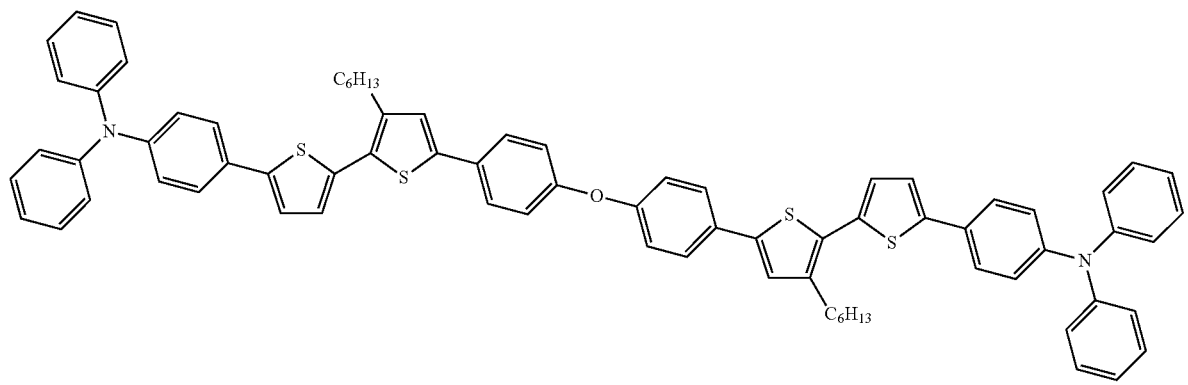
[Formula 24]
[43]
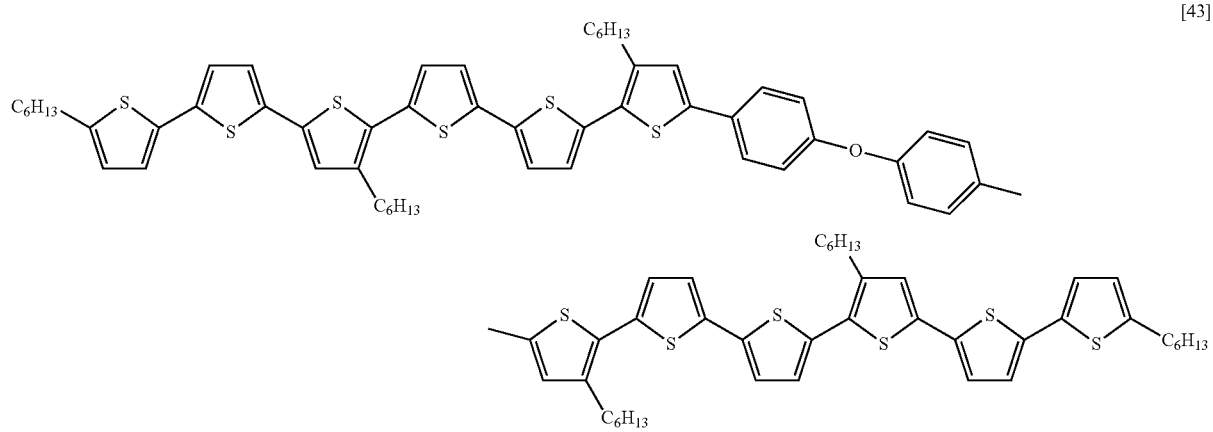
[44]
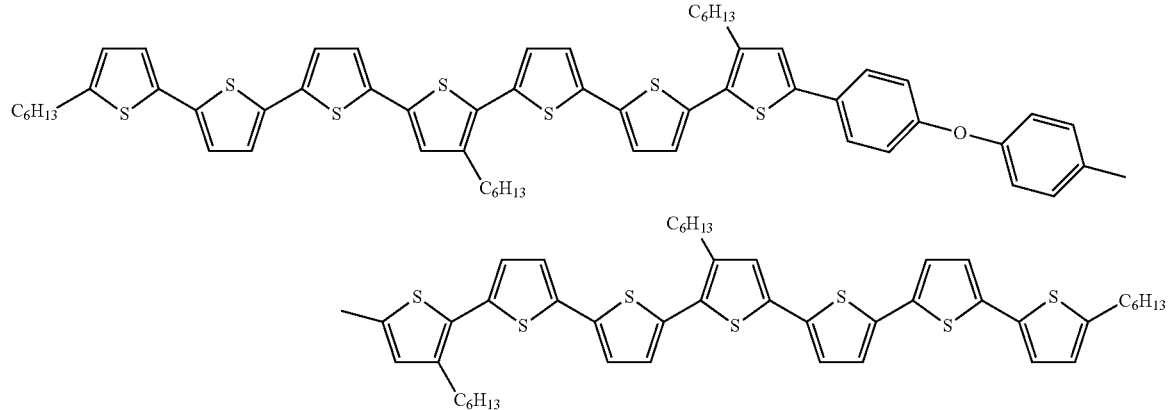

[45]
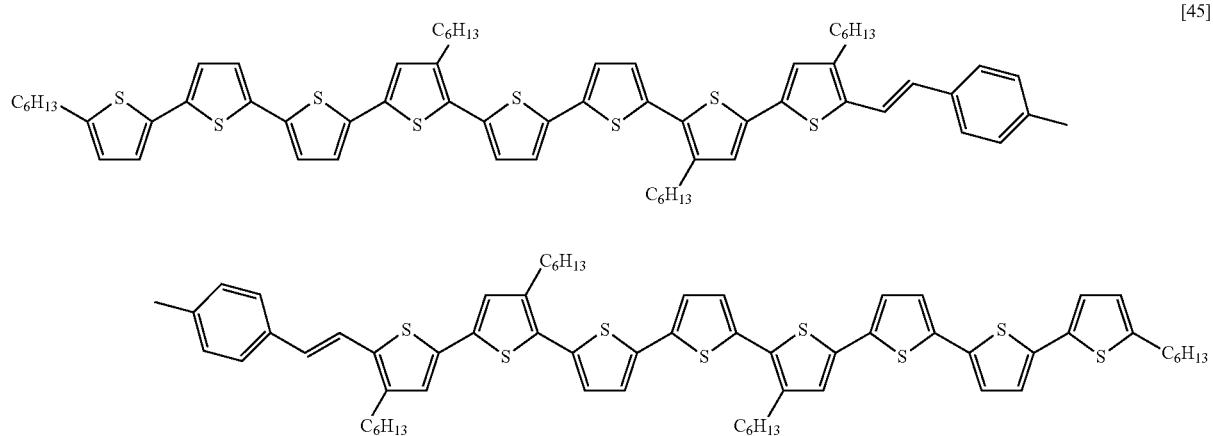
[46]
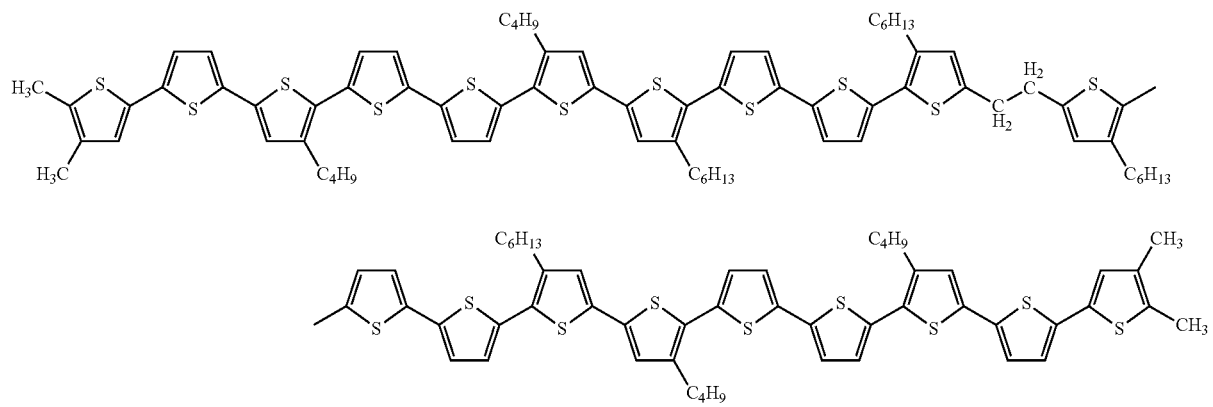
[47]
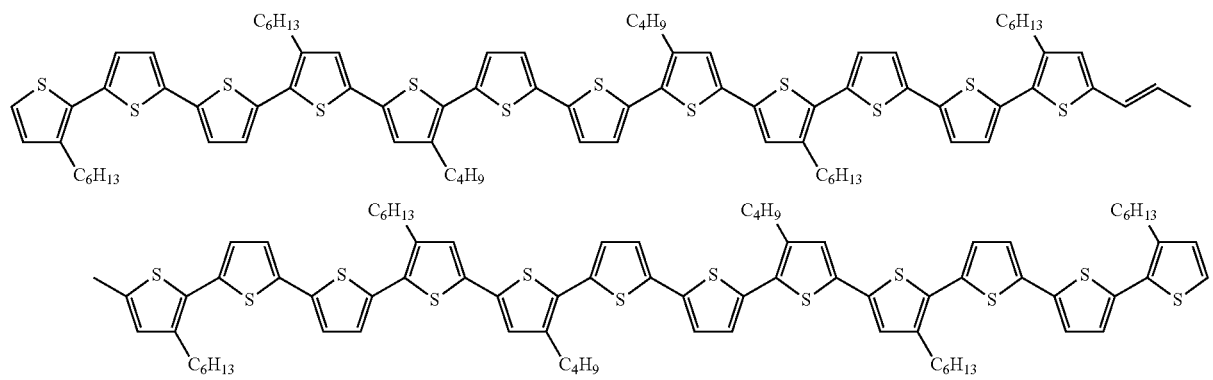
[Formula 25]
[48]
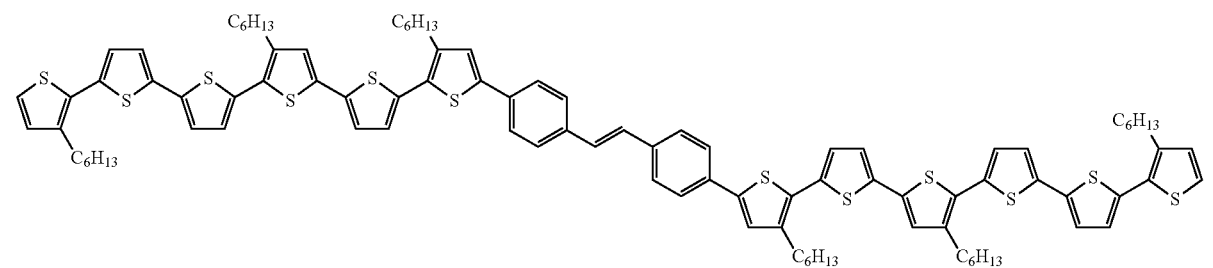

[49]
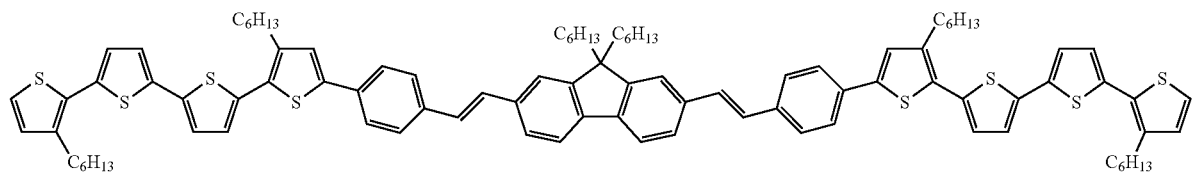
[50]
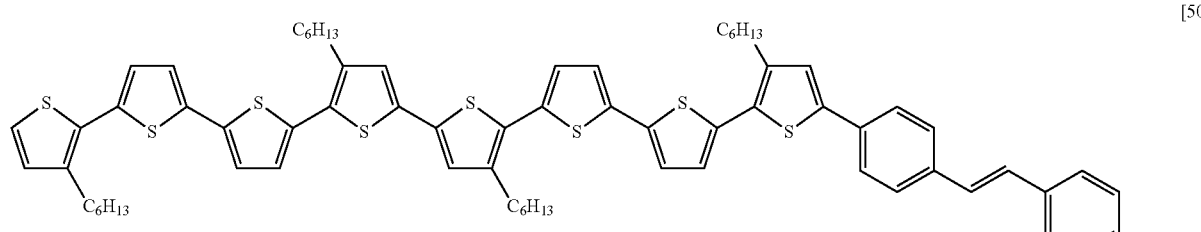
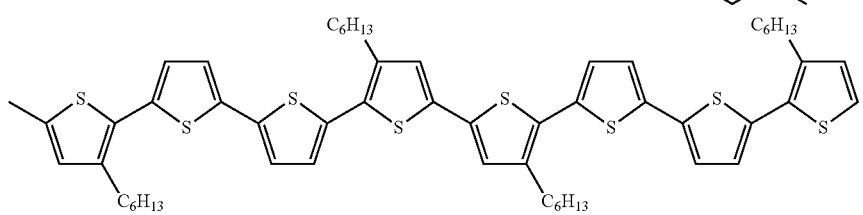
[51]
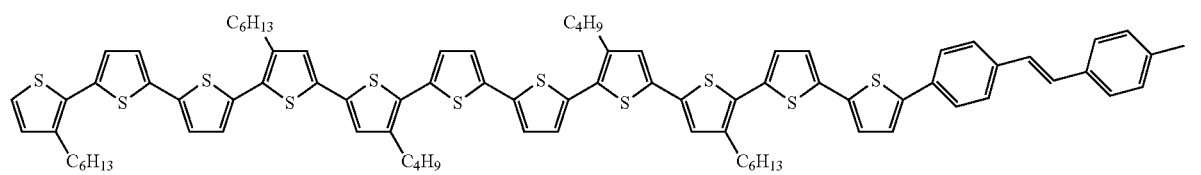
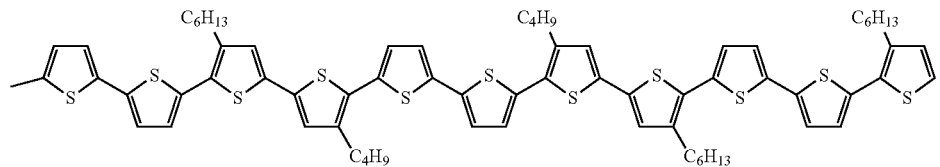
[Formula 26]
[52]
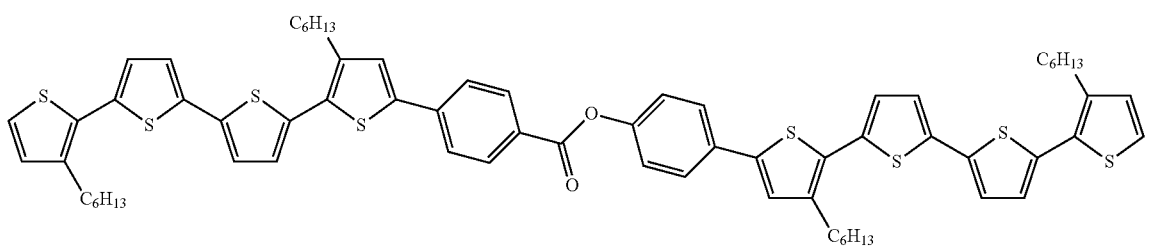
[53]
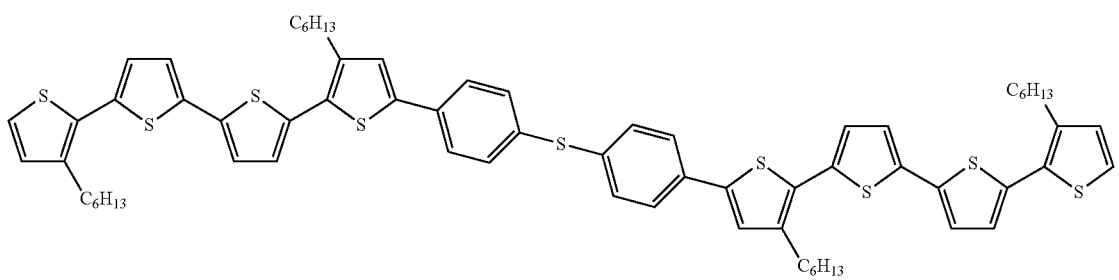

-continued
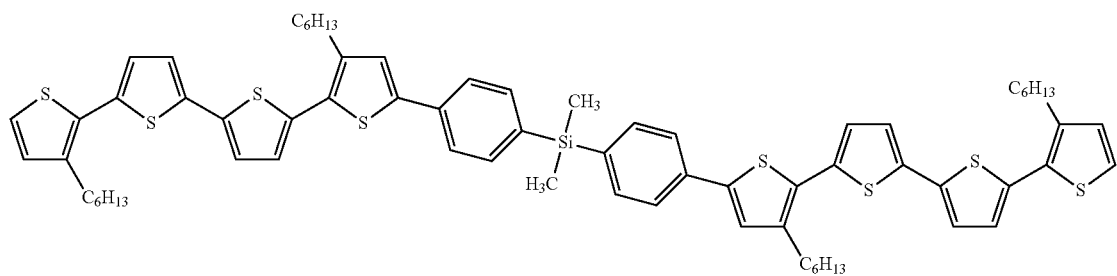
[54]
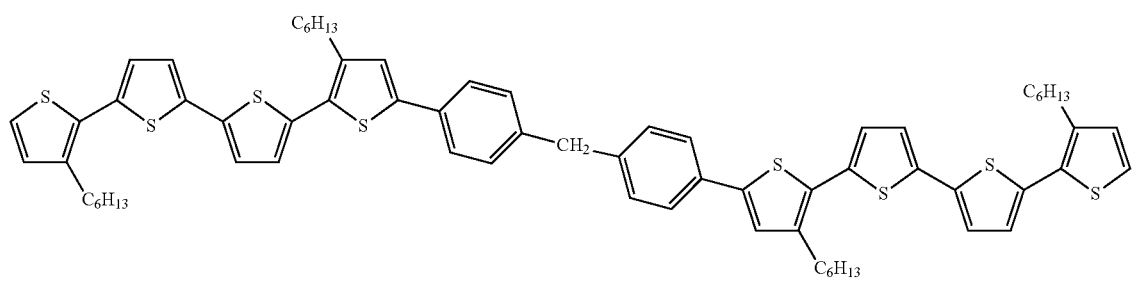
[55]
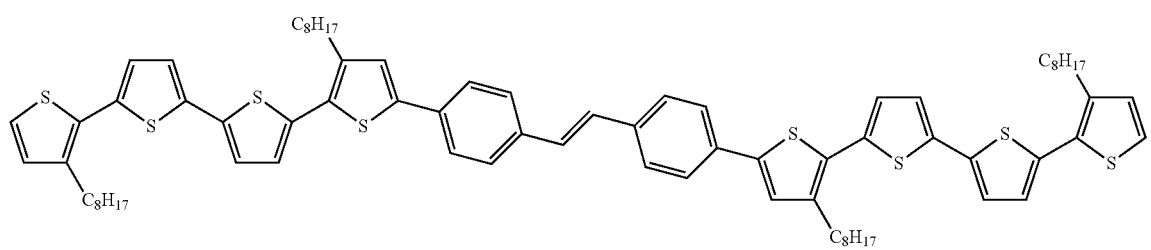
[56]
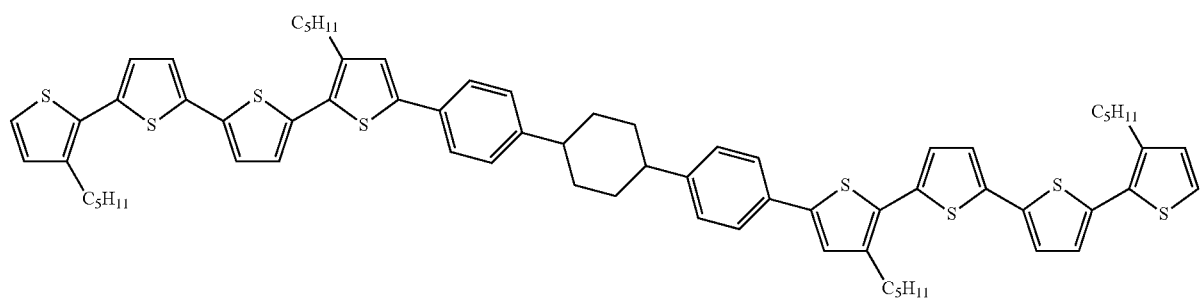
[57]
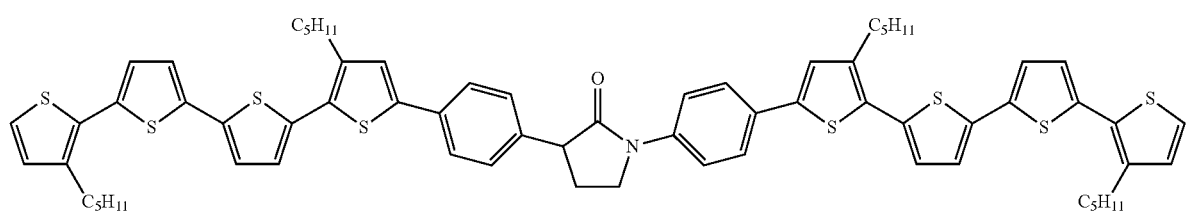
[58]

[Formula 27]
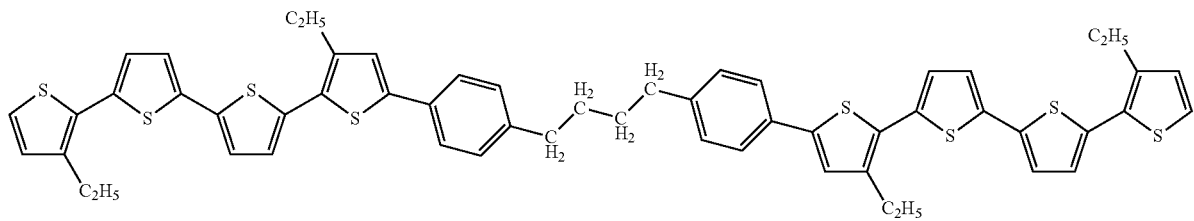
[59]
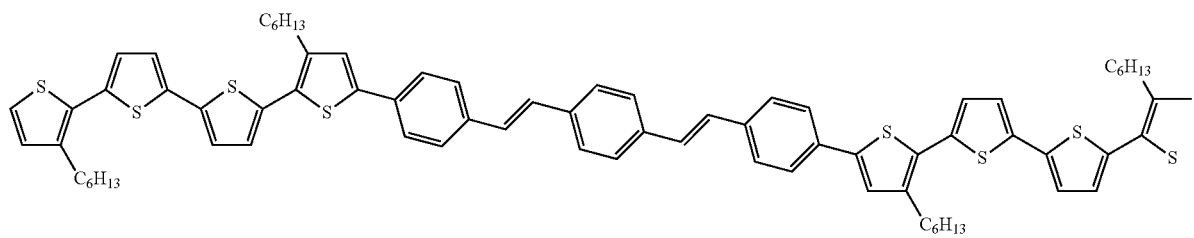
[60]
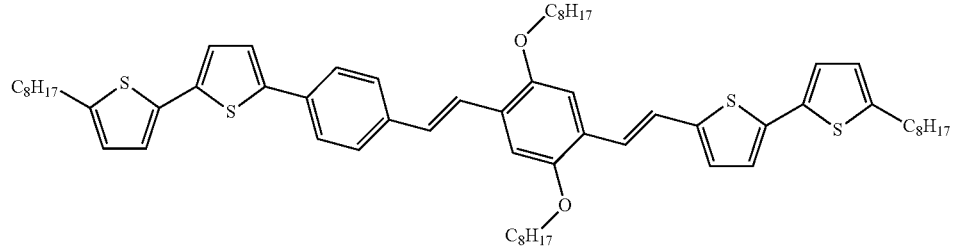
[61]
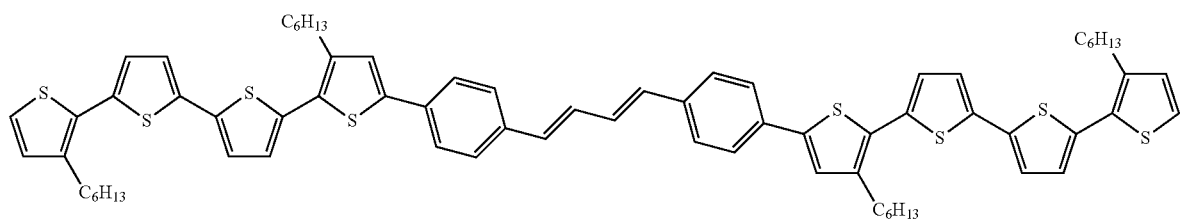
[62]
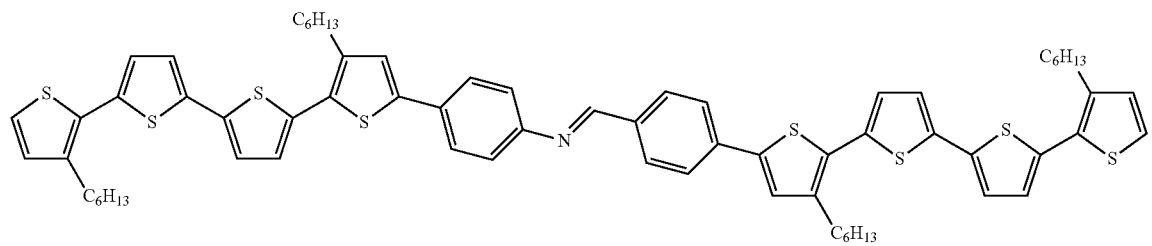
[63]
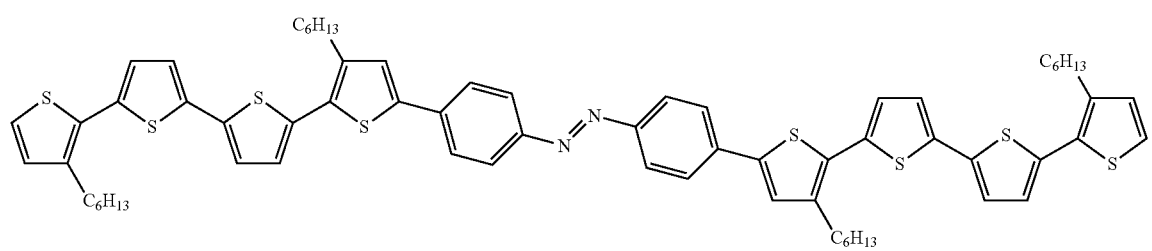
[64]

-continued
[65]
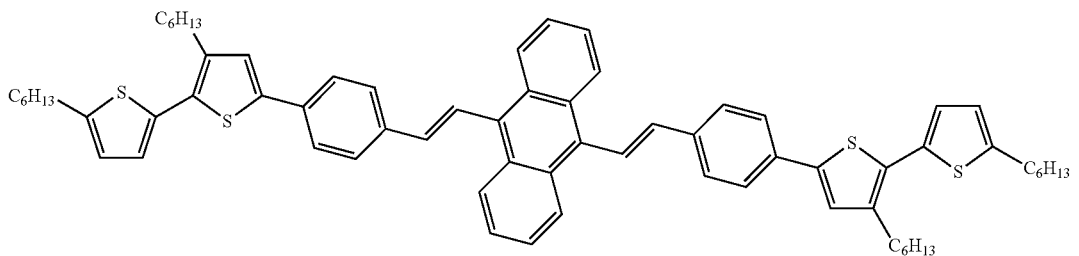
[Formula 28]
[66]
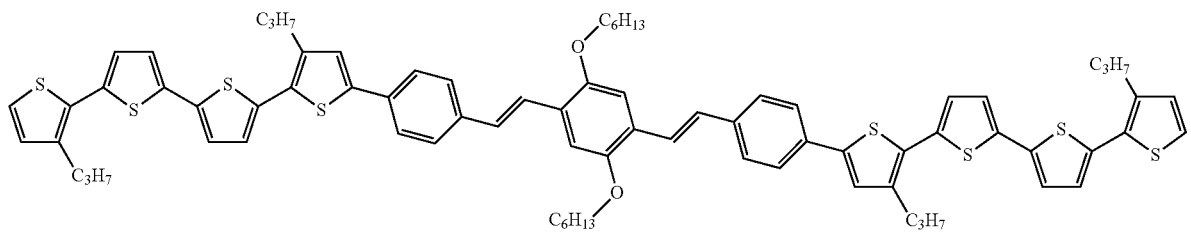
[67]
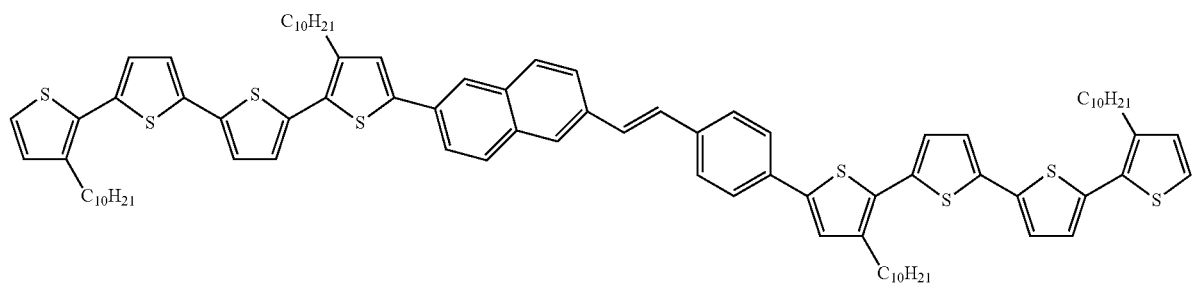
[68]
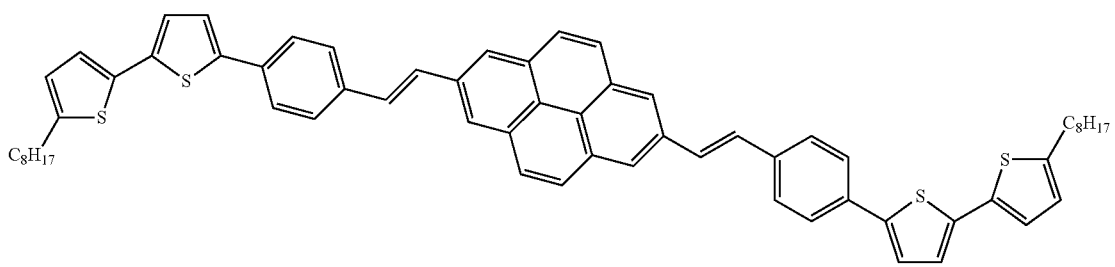
[69]
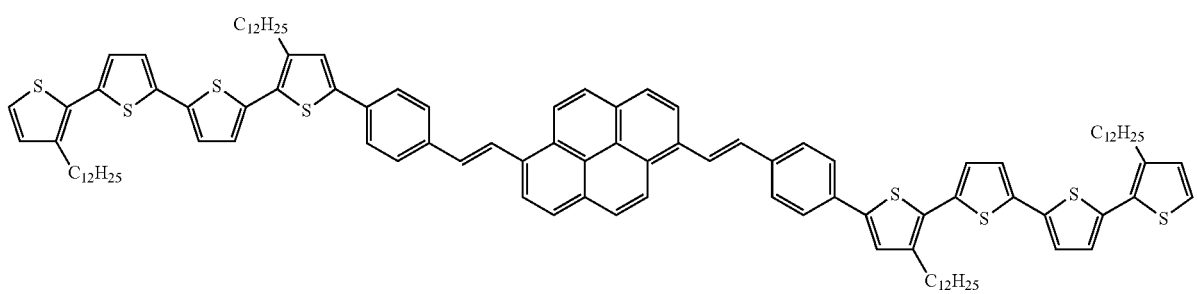

[70]
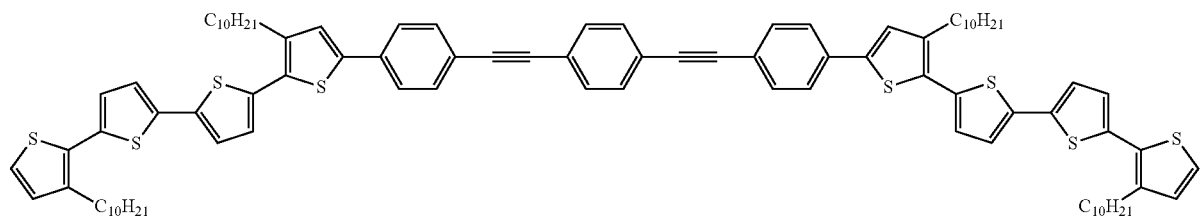
[71]
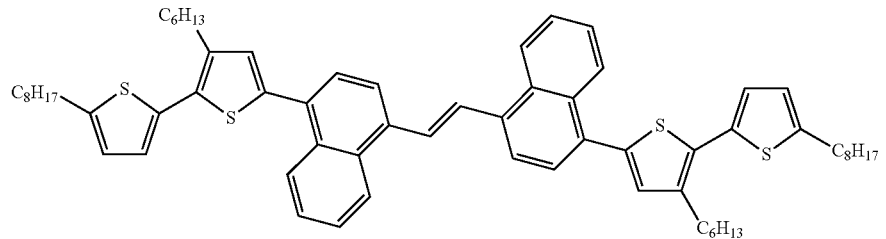
[72]
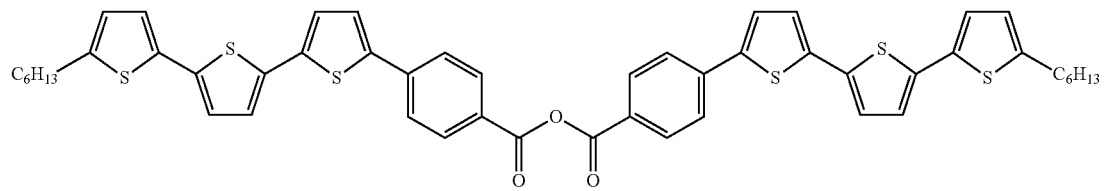
[Formula 29]
[73]
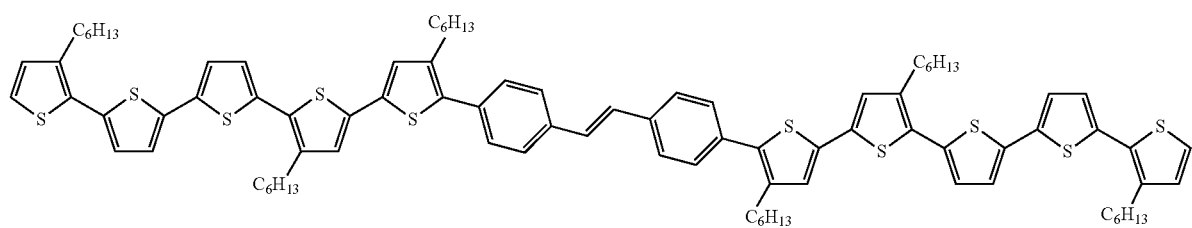
[74]
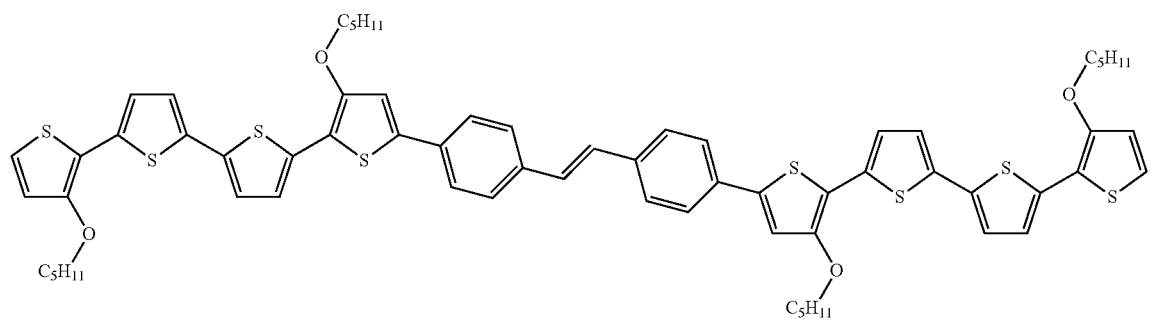
[75]
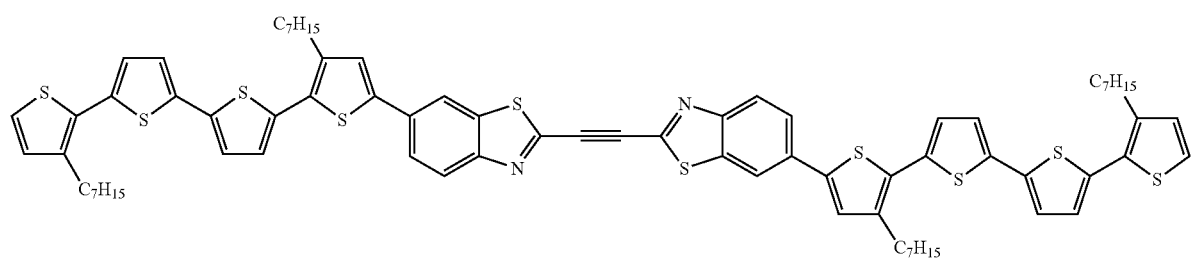

-continued
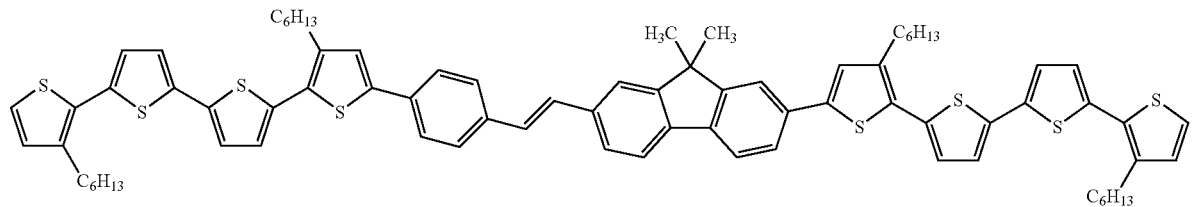
[76]
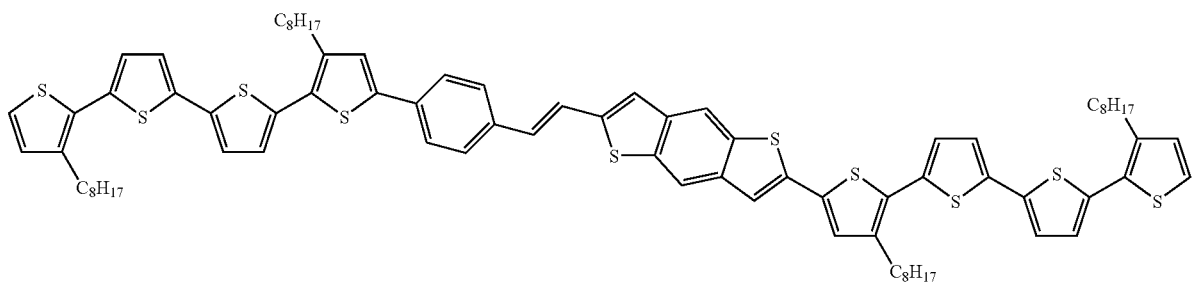
[77]
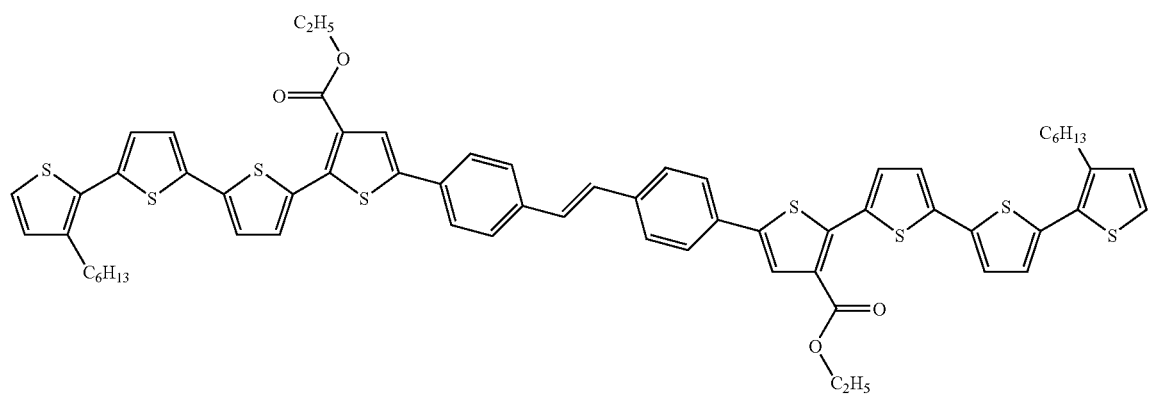
[78]
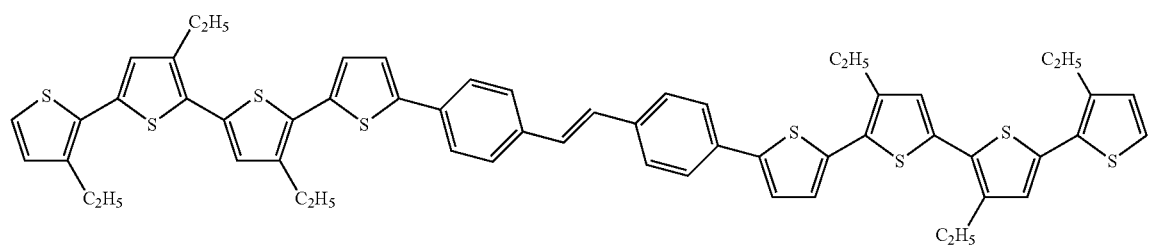
[79]
[Formula 30]
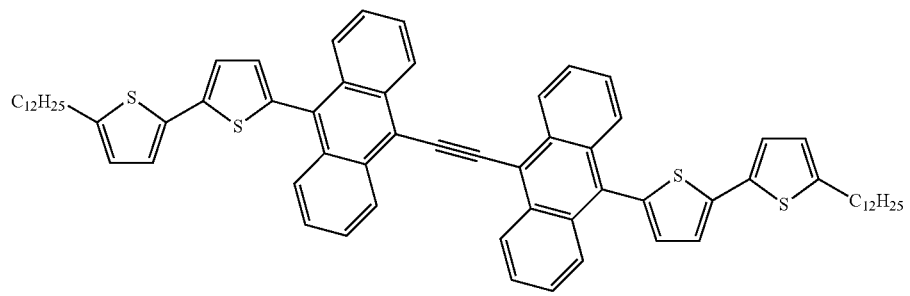
[80]

-continued
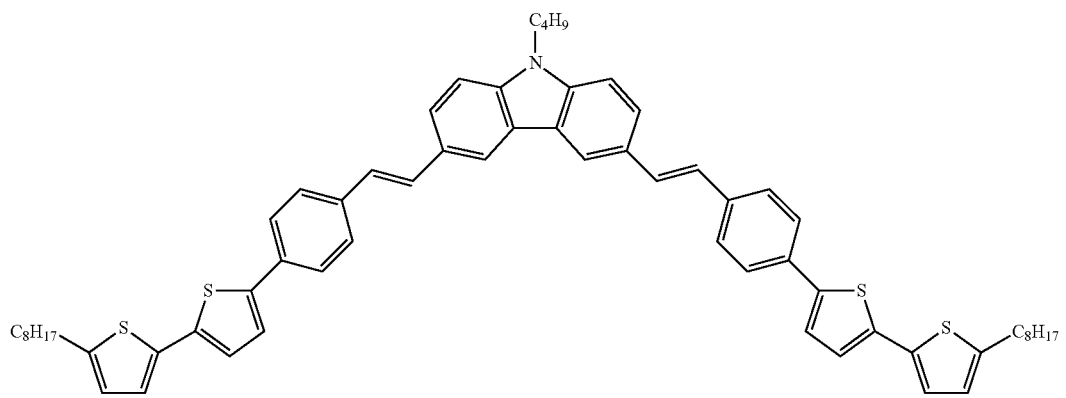
[81]
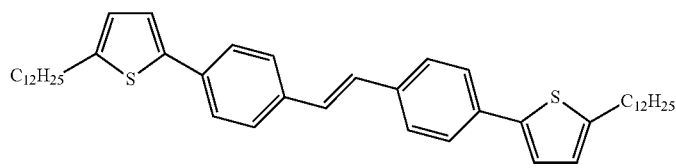
[82]
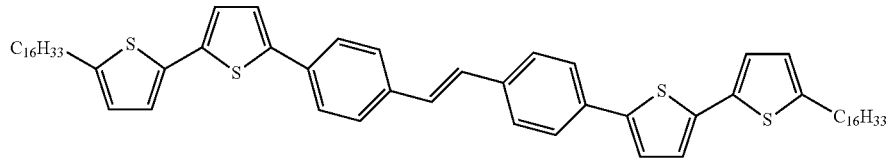
[83]
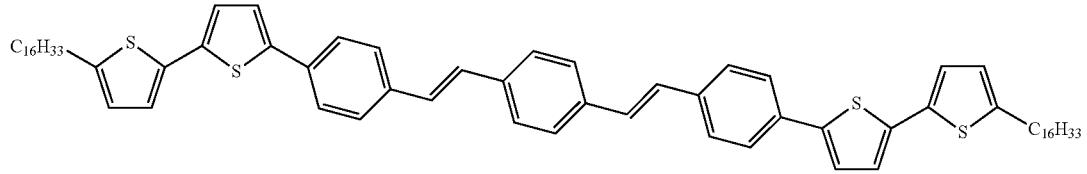
[84]
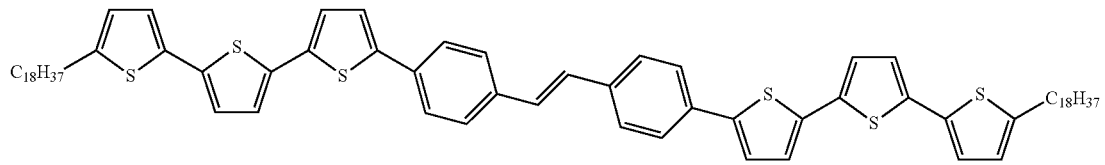
[85]
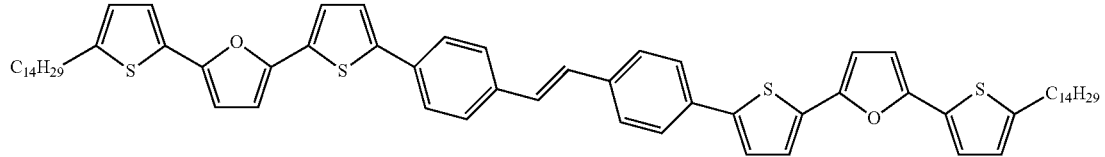
[86]
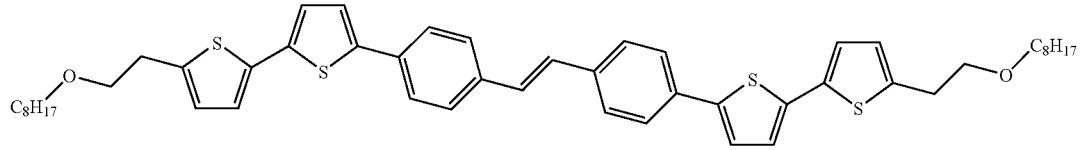
[87]
[Formula 31]
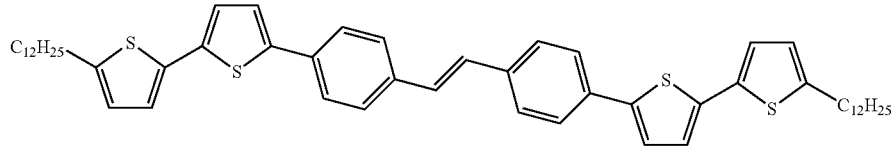
[88]

-continued
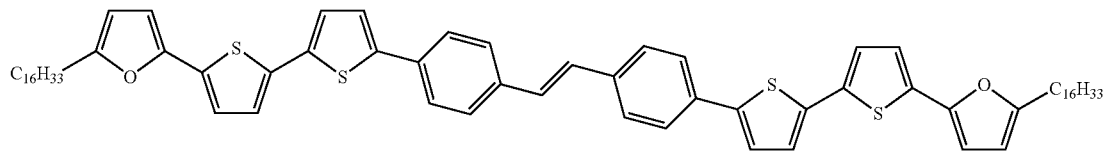
[89]
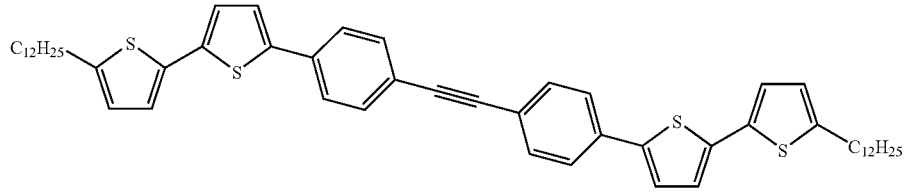
[90]
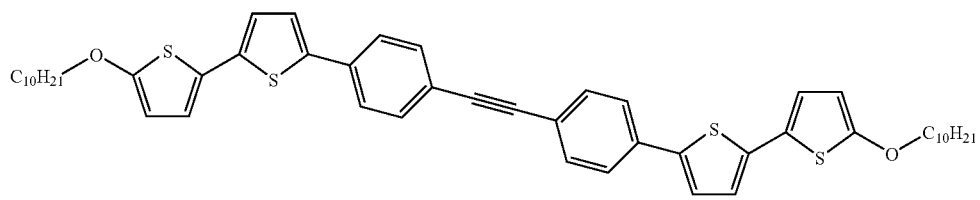
[91]
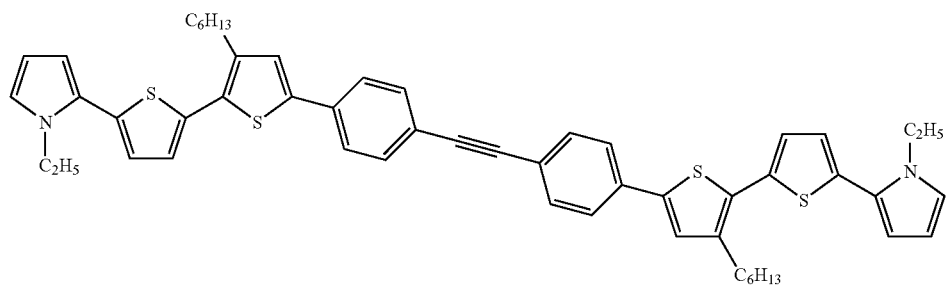
[92]
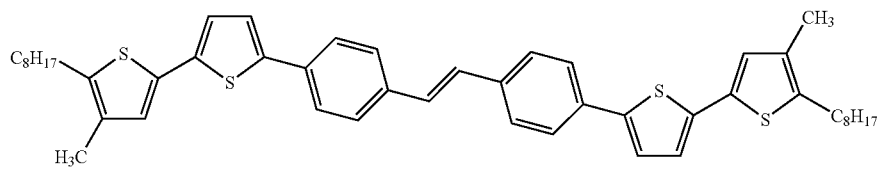
[93]
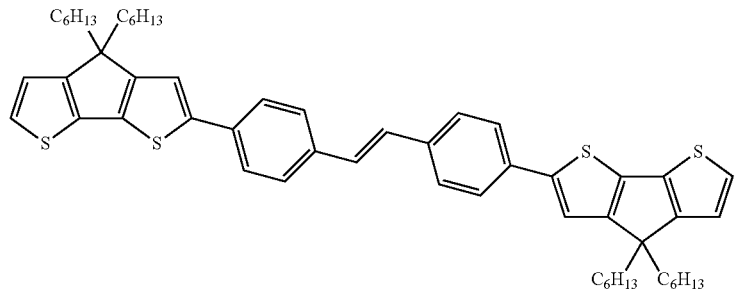
[94]
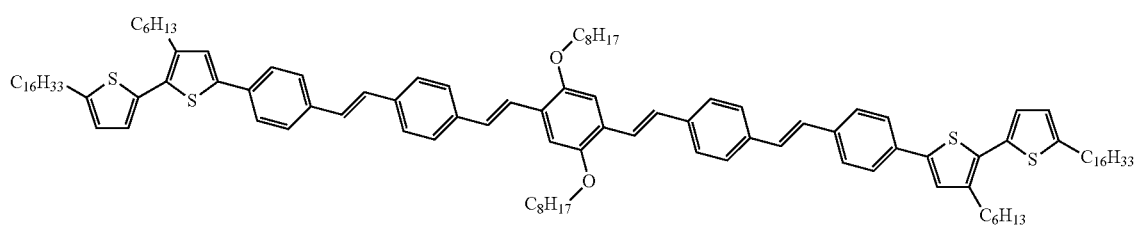
[95]

[Formula 32]
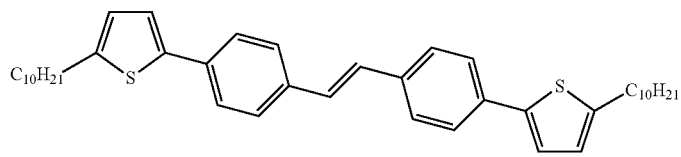
[96]
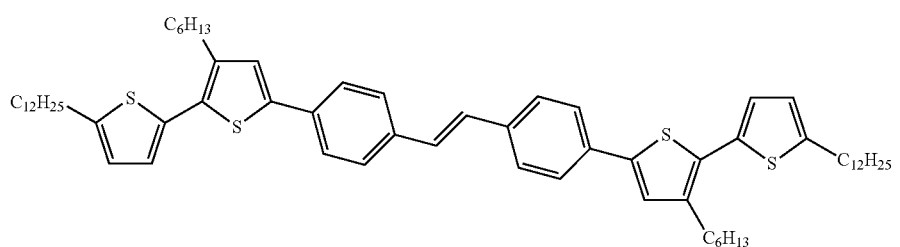
[97]
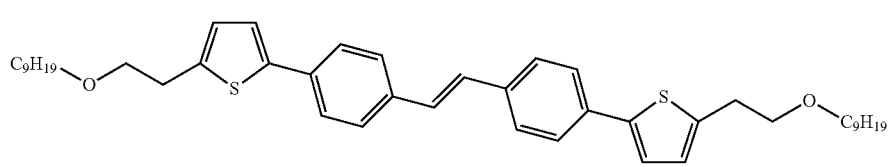
[98]
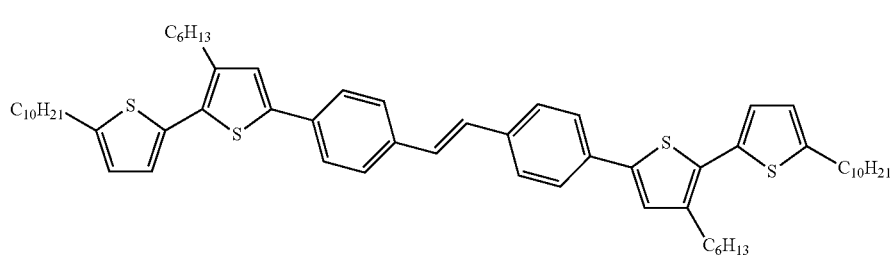
[99]
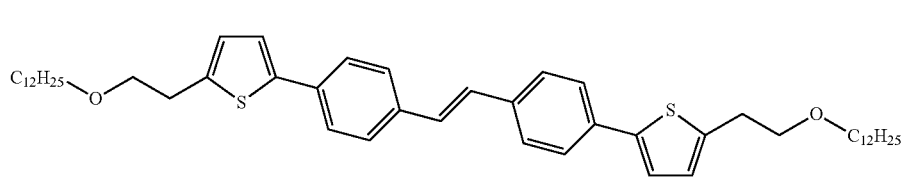
[100]
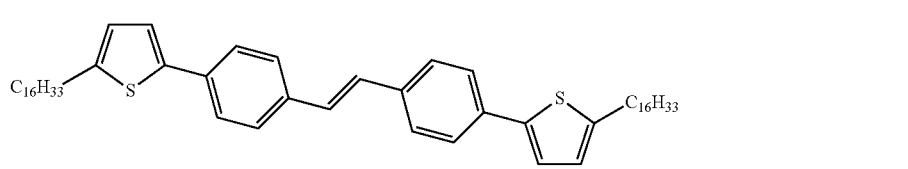
[101]
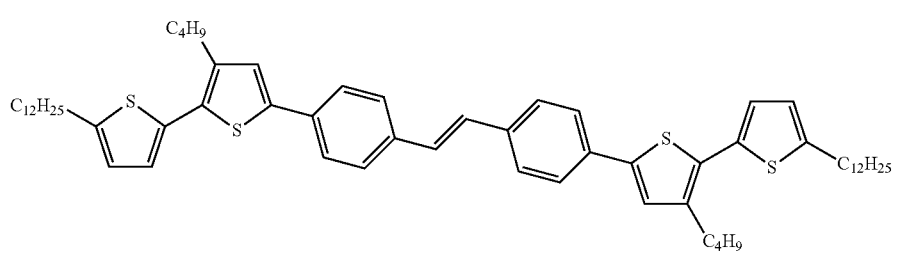
[102]

[103]
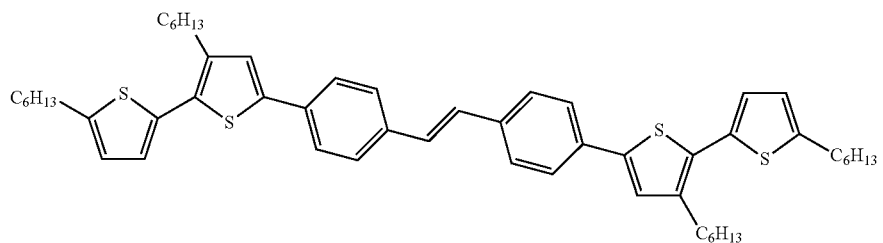
[104]
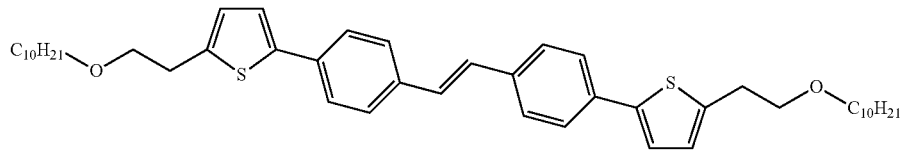
[Formula 33]
[105]
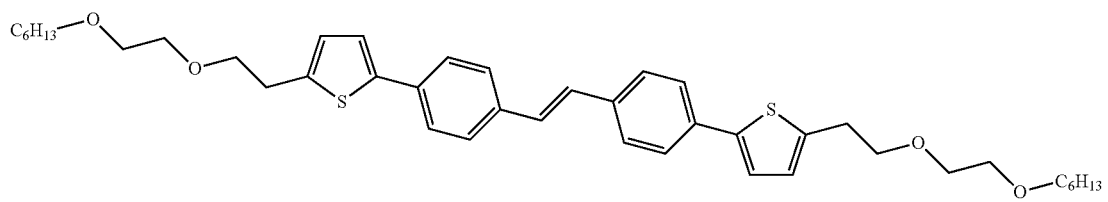
[106]
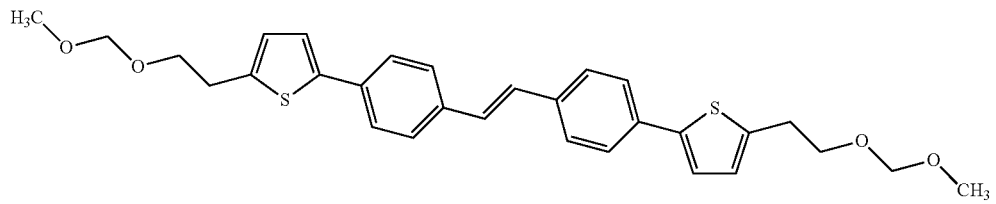
[107]
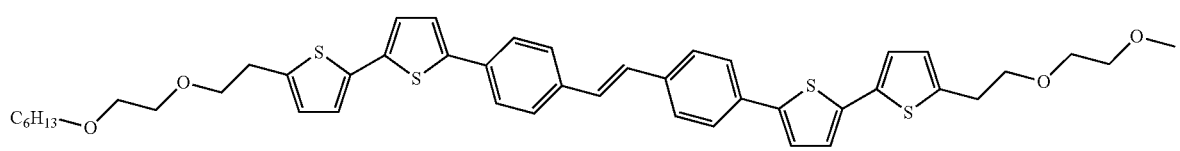
[108]
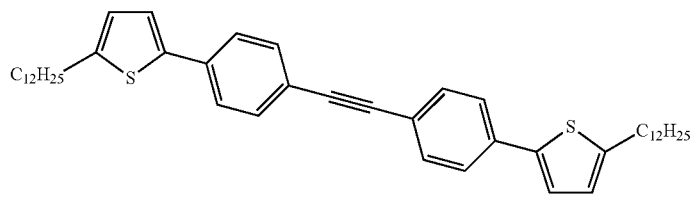
[109]
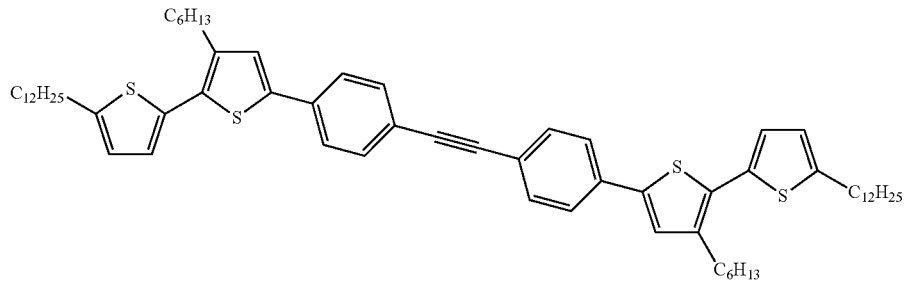

-continued
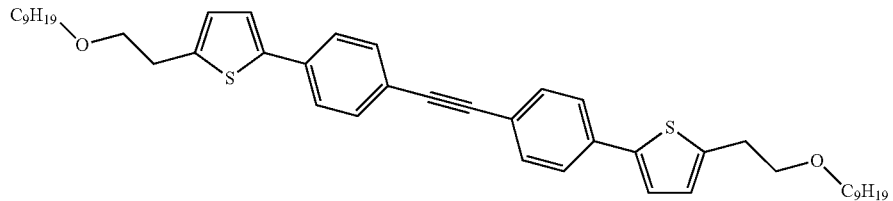
[110]
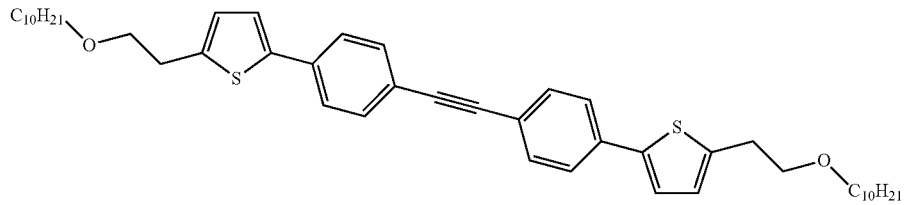
[111]
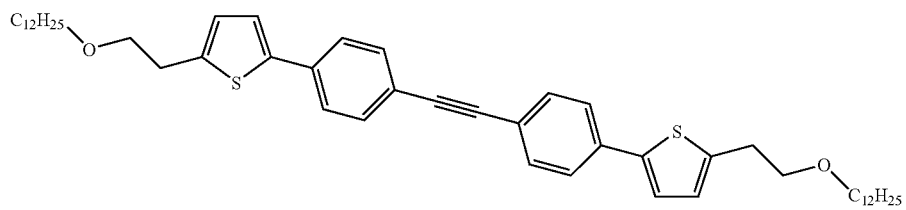
[112]
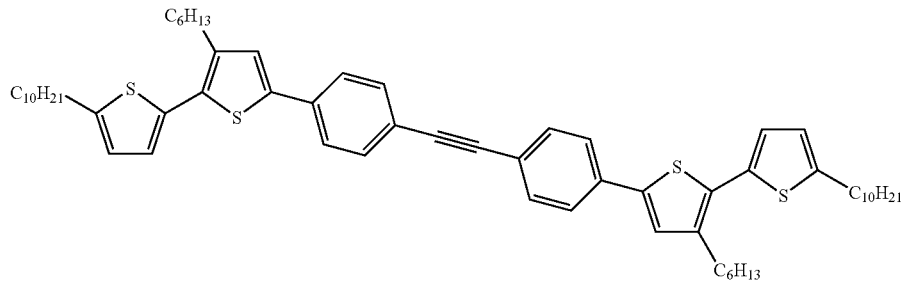
[113]
[Formula 34]
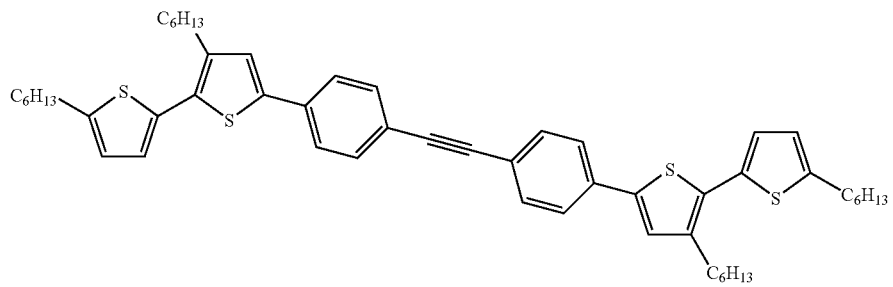
[114]
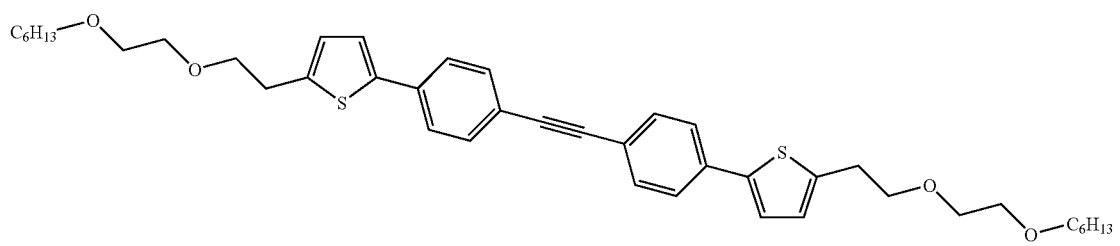
[115]

[116]
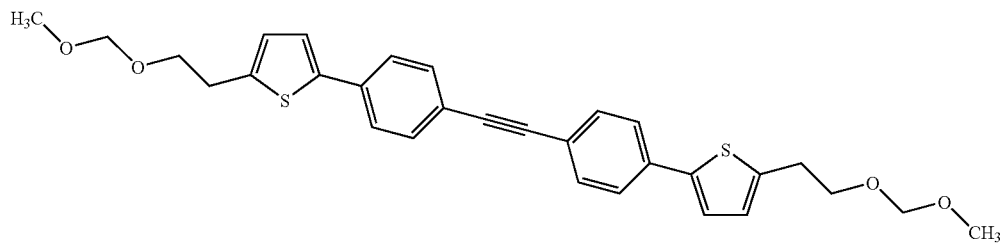
[117]
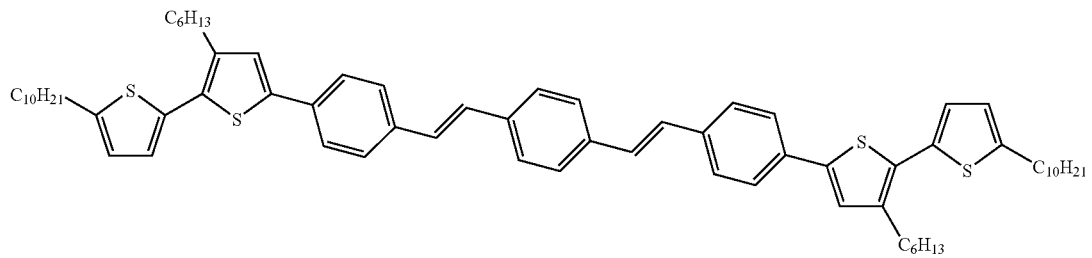
[118]
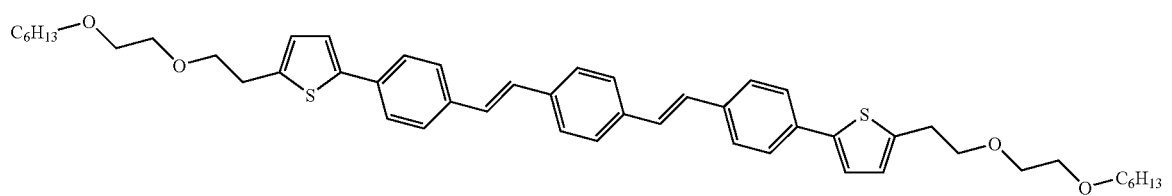
[119]
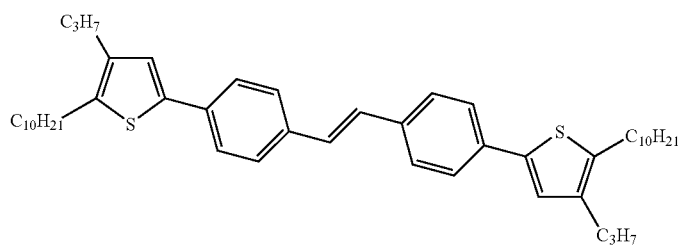
[120]
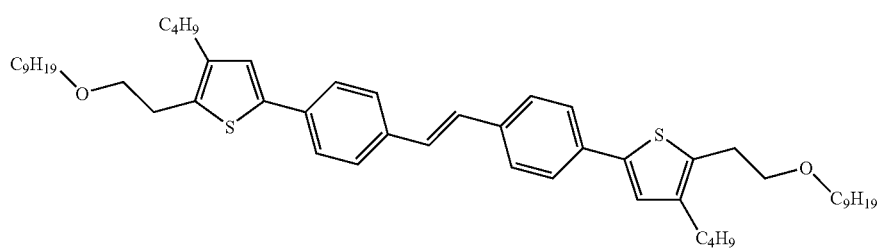
[Formula 35]
[121]
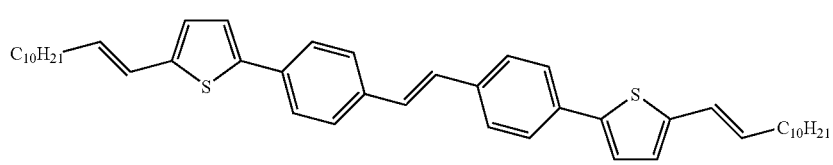
[122]
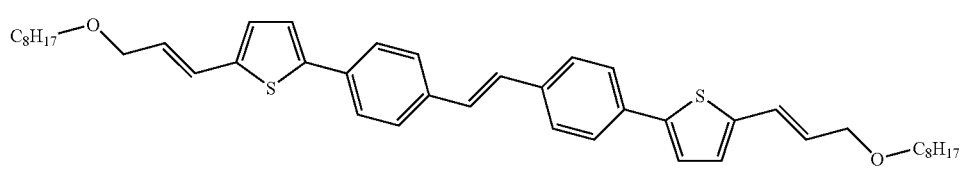

[123]
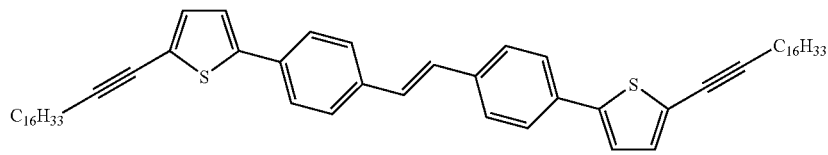
[124]
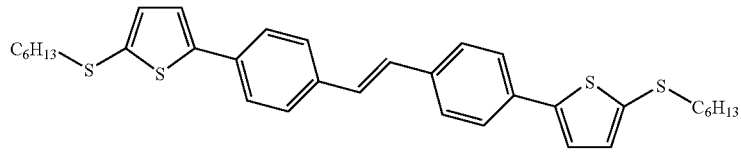
[125]
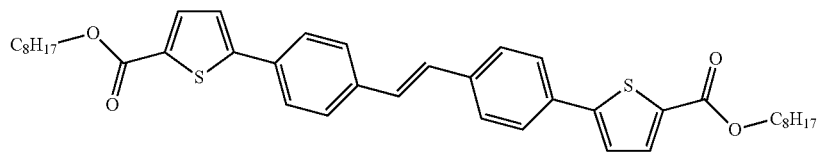
[126]
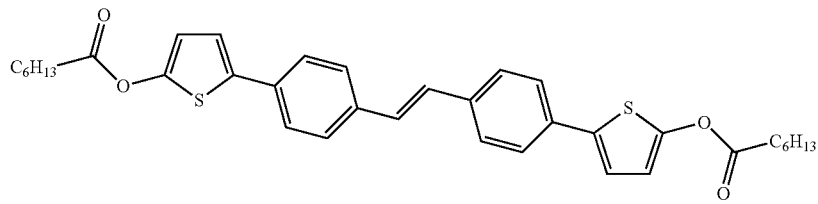
[127]
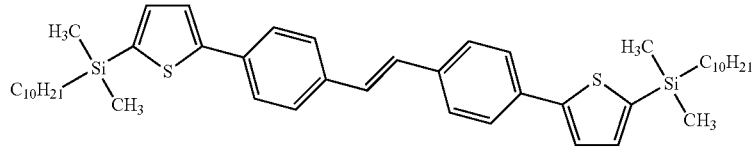
[128]
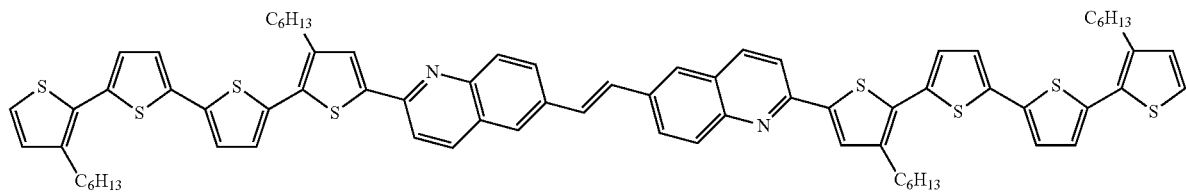
[Formula 36]
[129]
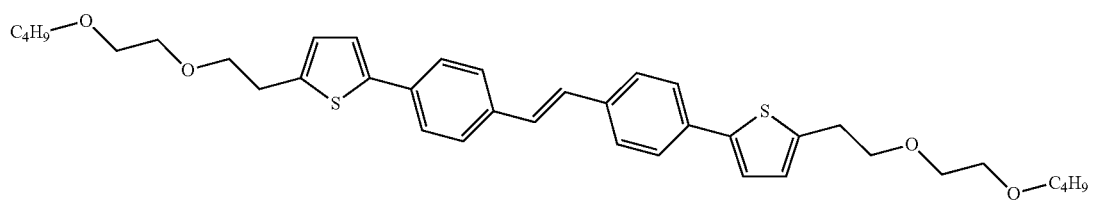
[130]
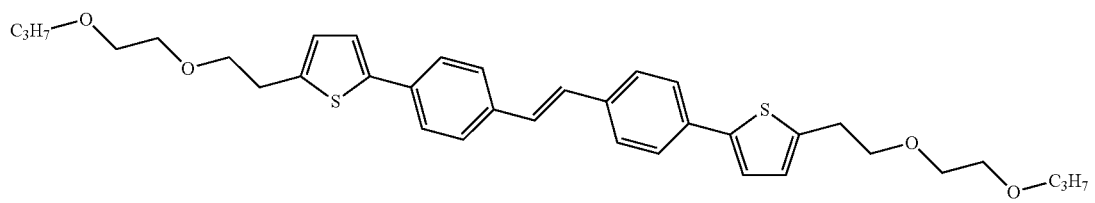

-continued
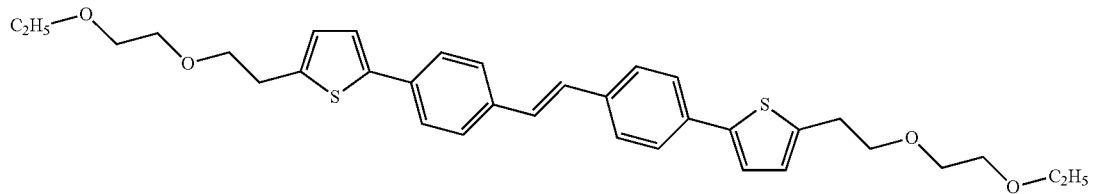
[131]
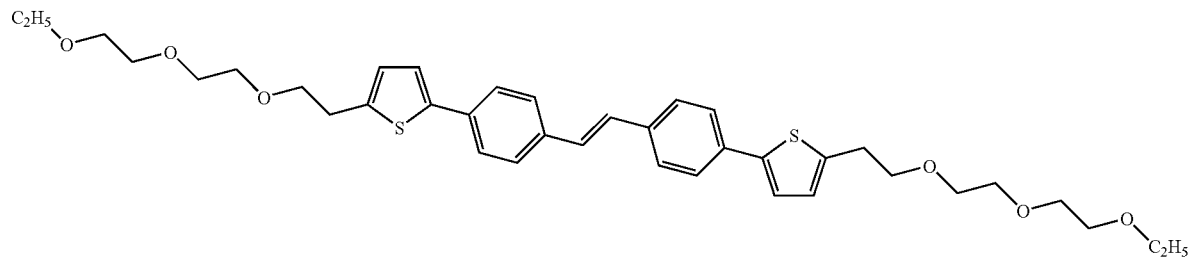
[132]
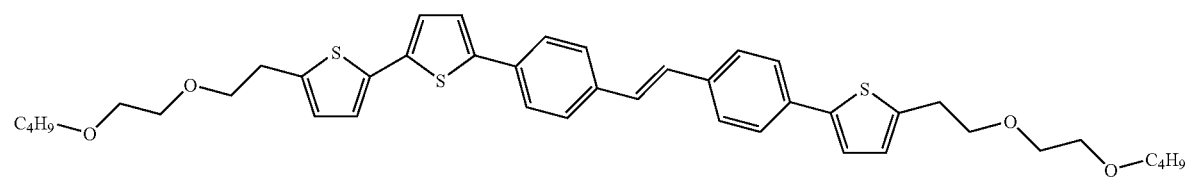
[133]
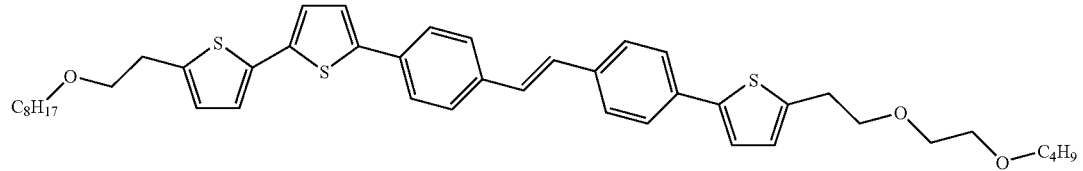
[134]
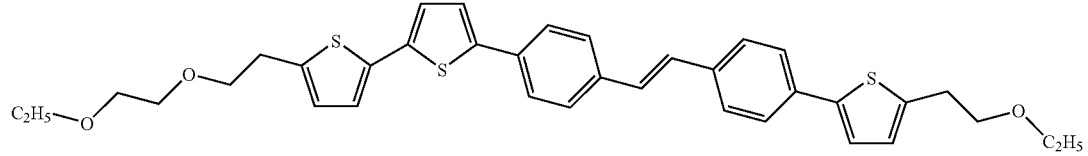
[135]
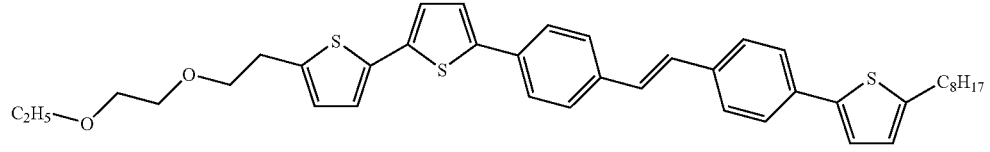
[136]
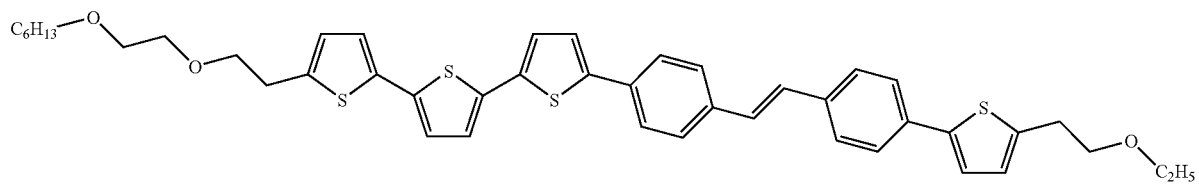
[137]

-continued
[Formula 37]
[138]
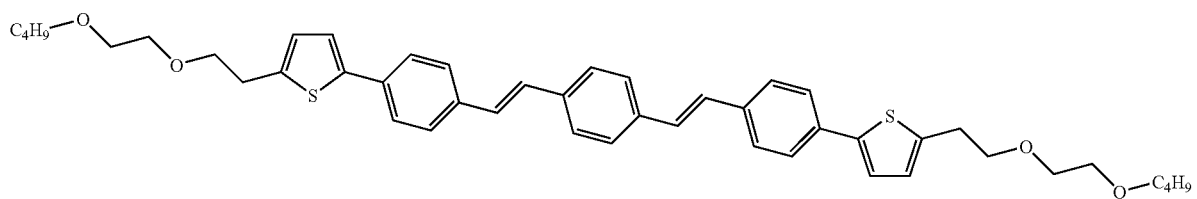
[139]
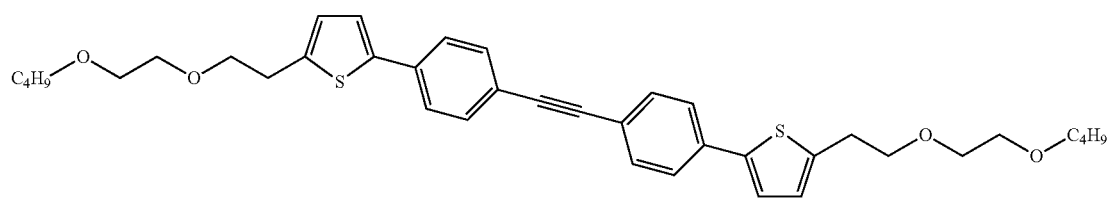
[140]
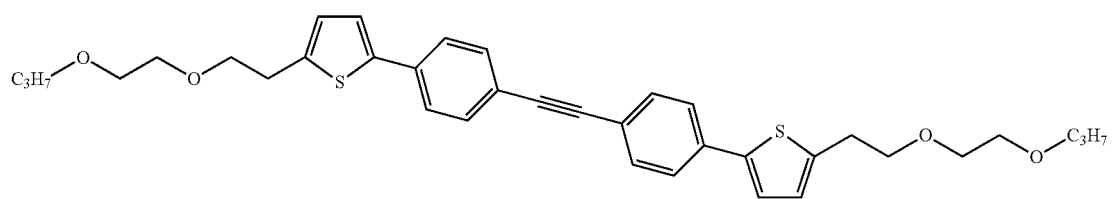
[141]
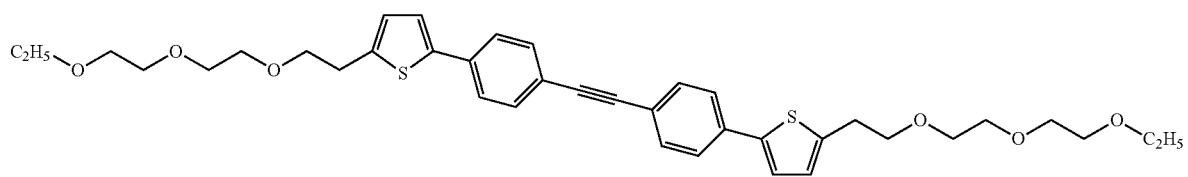
[142]
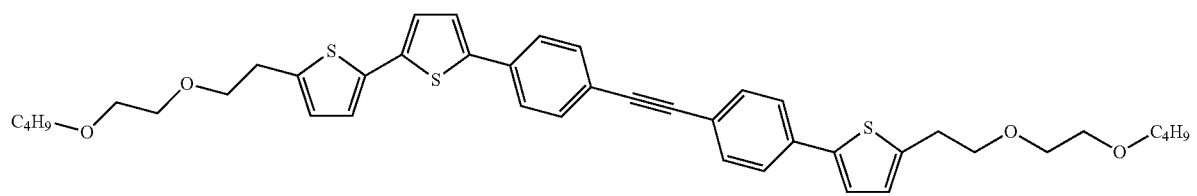
[143]
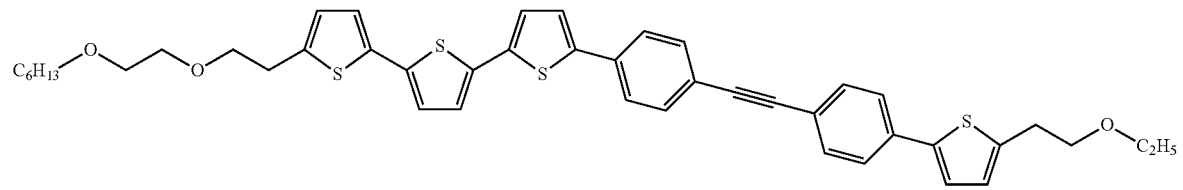
[144]
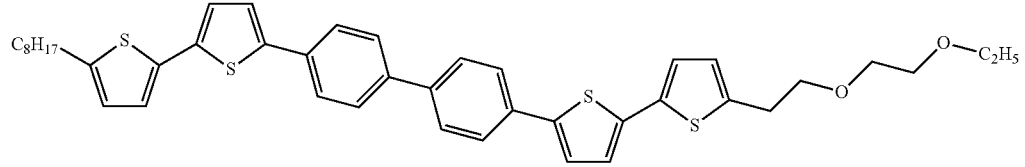

[145]
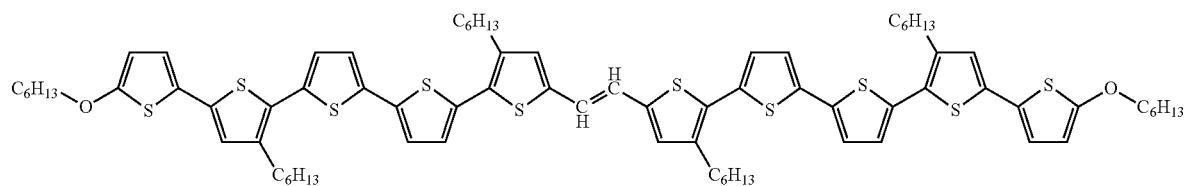
[Formula 38]
[146]
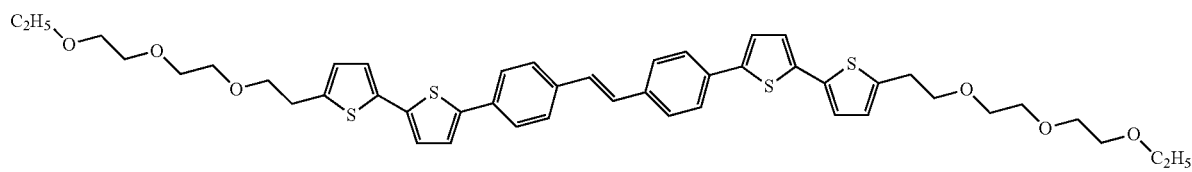
[147]
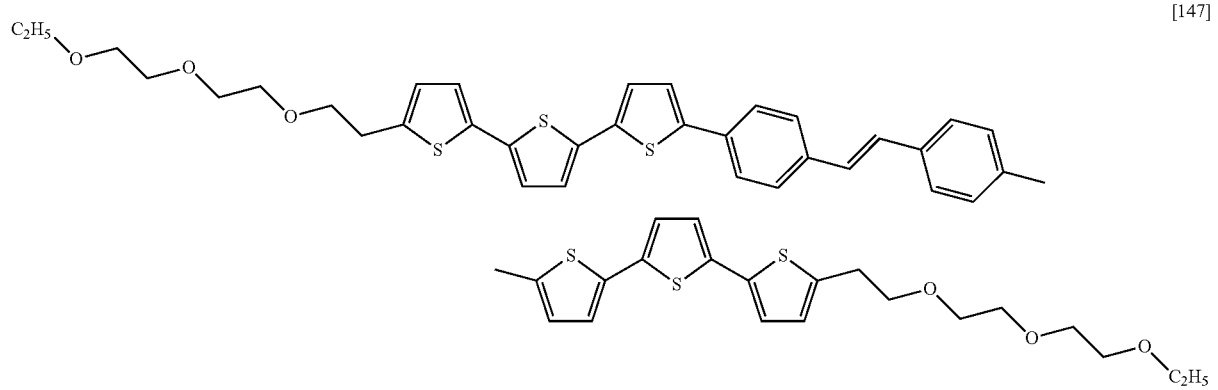
[148]
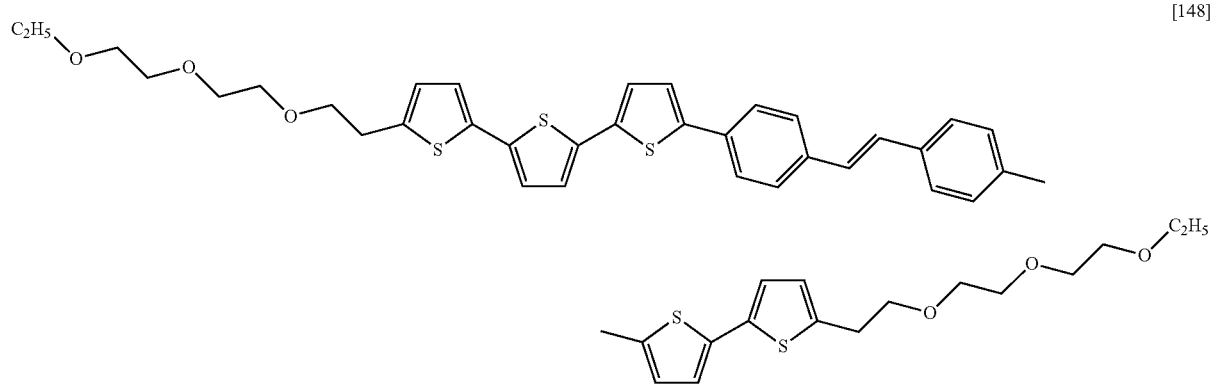
[149]
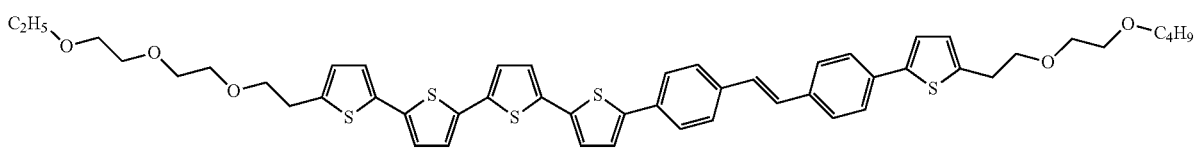
[150]
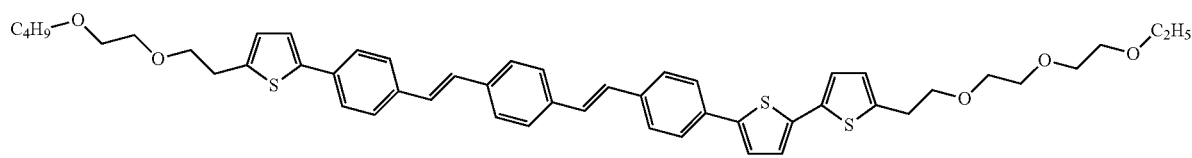

-continued
[Formula 39]
[151]
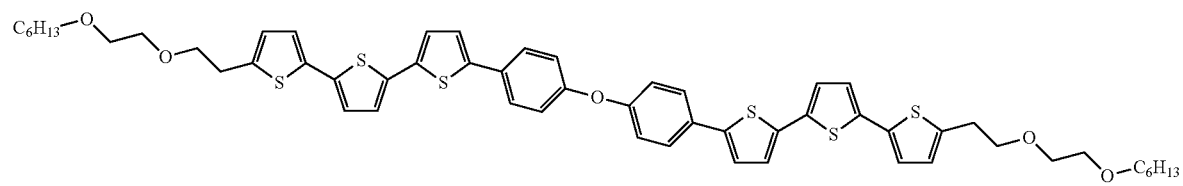
[152]
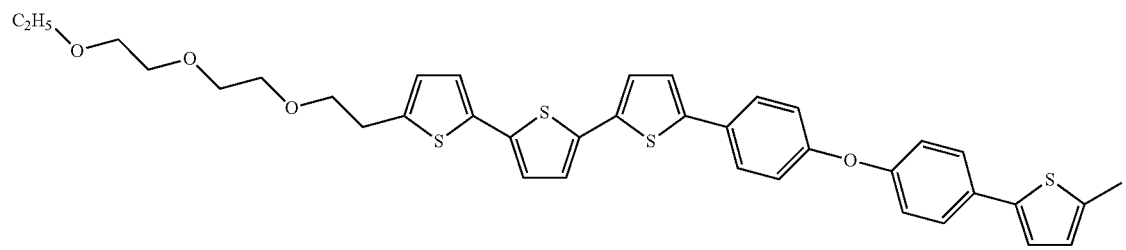
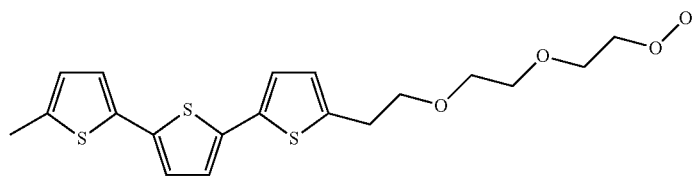
[153]
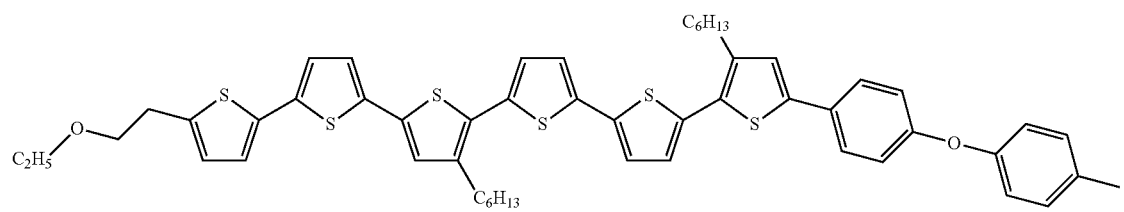
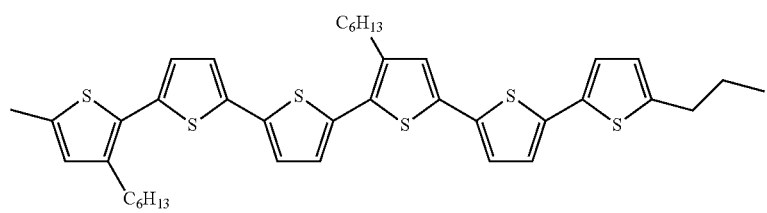
[154]
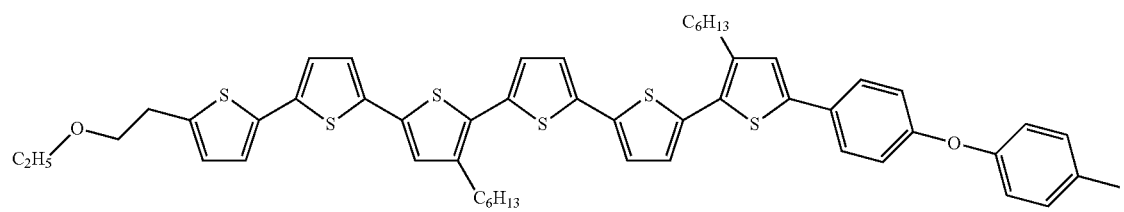
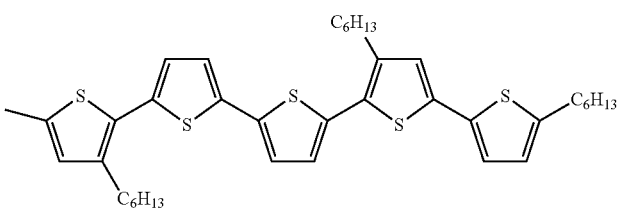

-continued
[155]
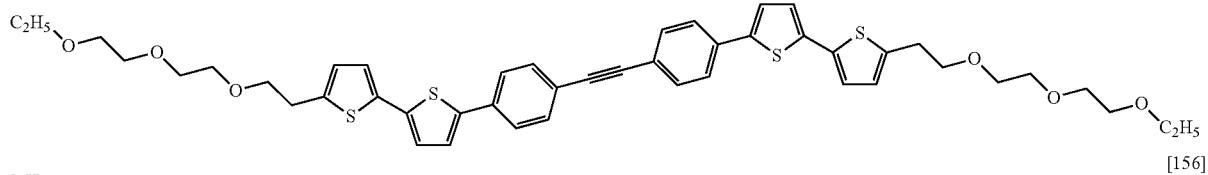
[156]
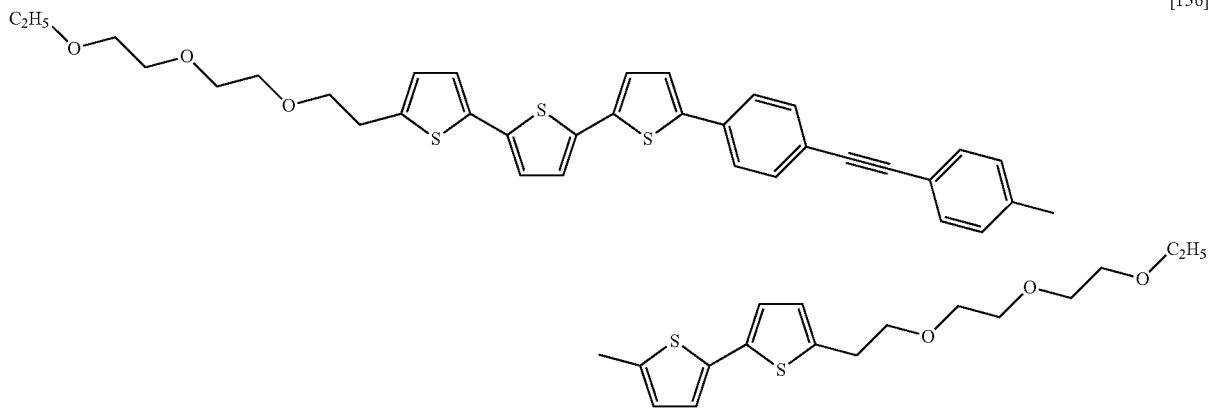
[Formula 40]
[157]
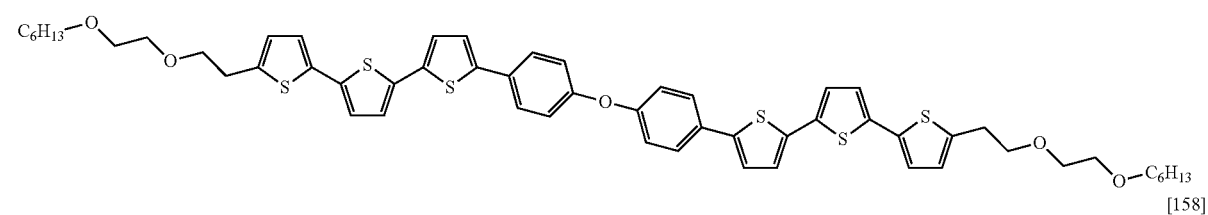
[158]
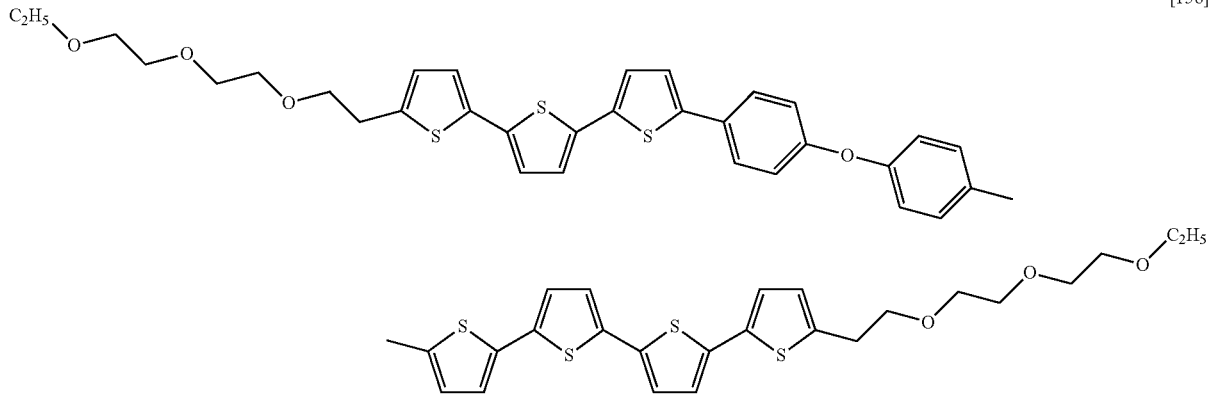
[159]
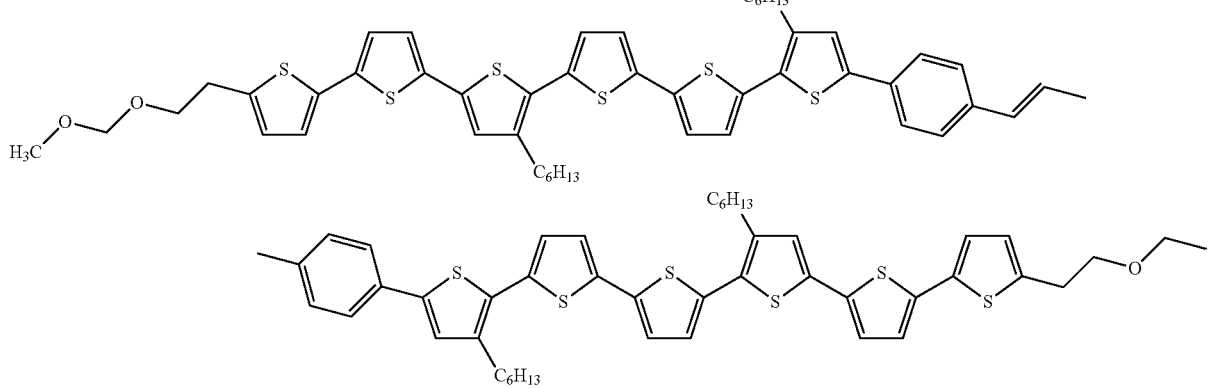

-continued
[160]
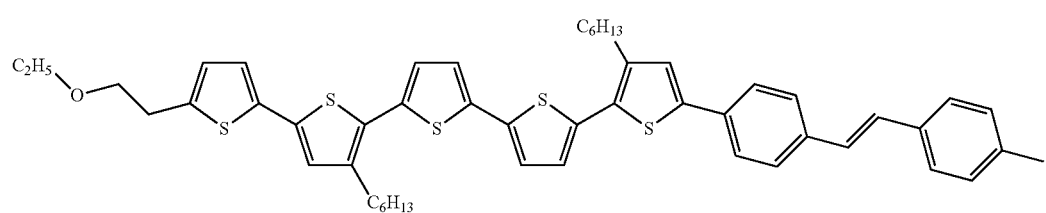
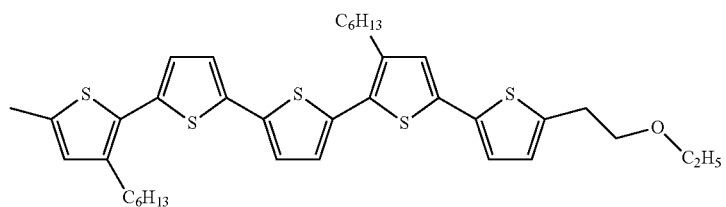
[161]
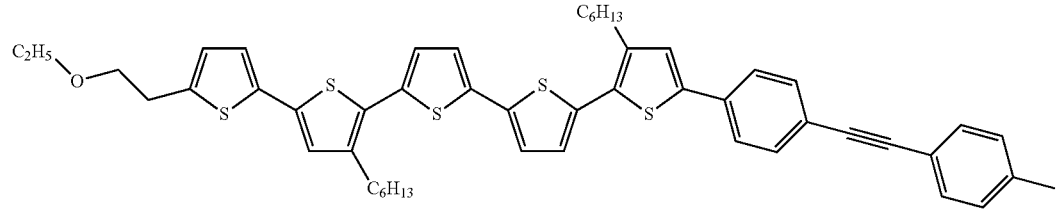
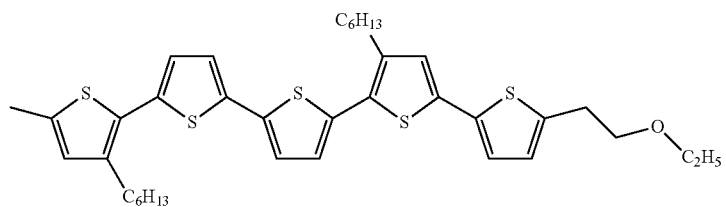
[Formula 41]
[162]
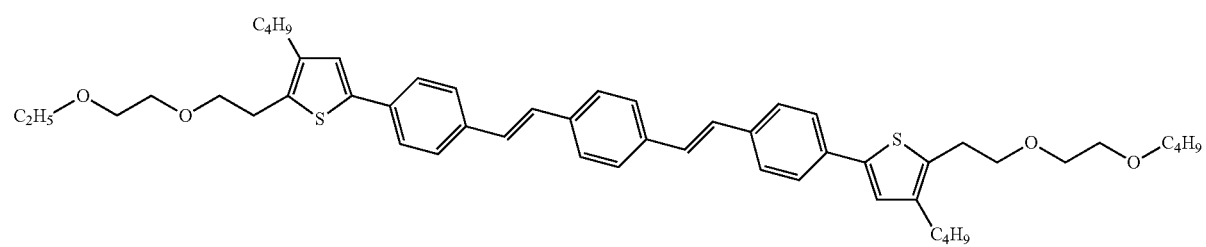
[163]
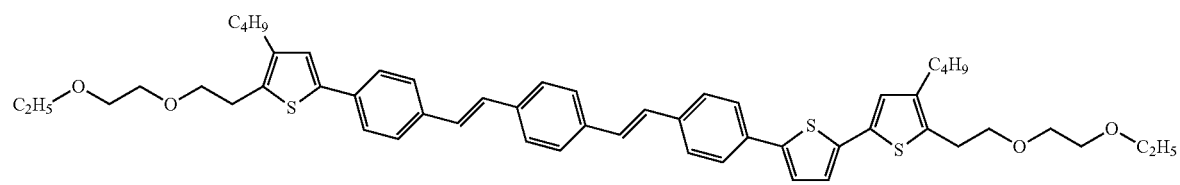
[164]
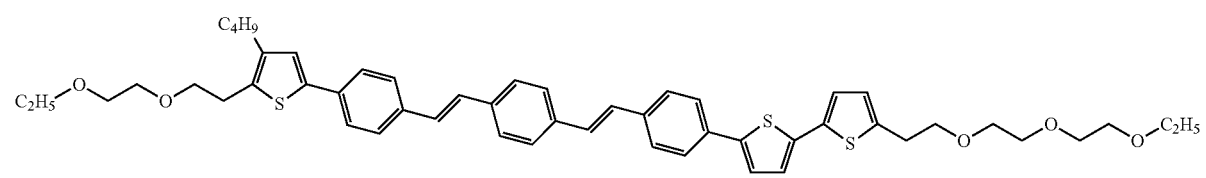

[165]

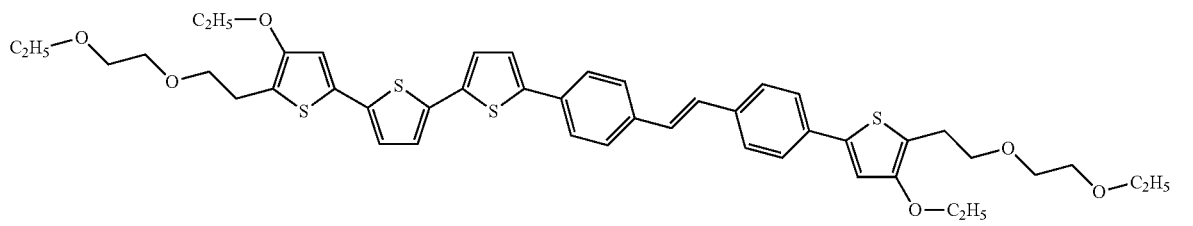

[166]

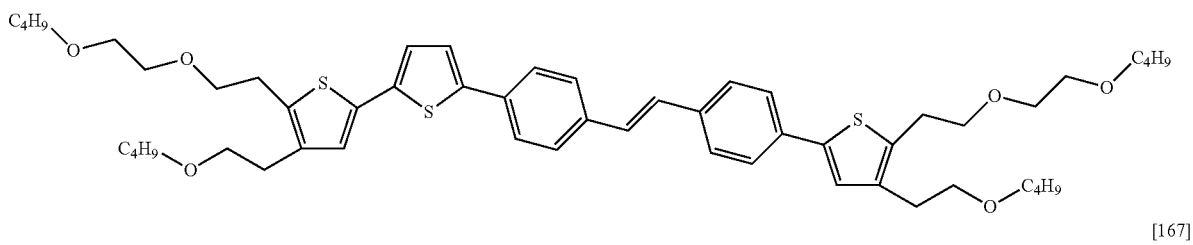

[167]

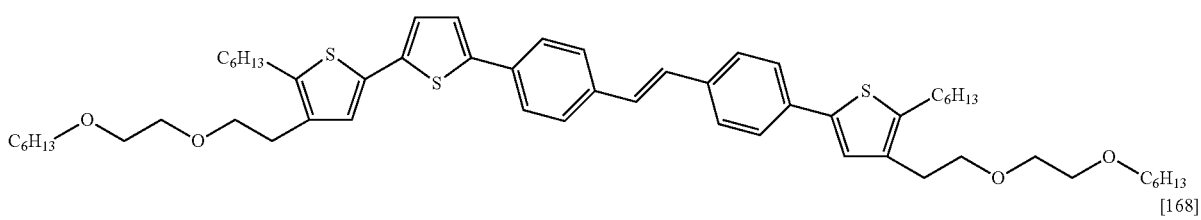

[168]

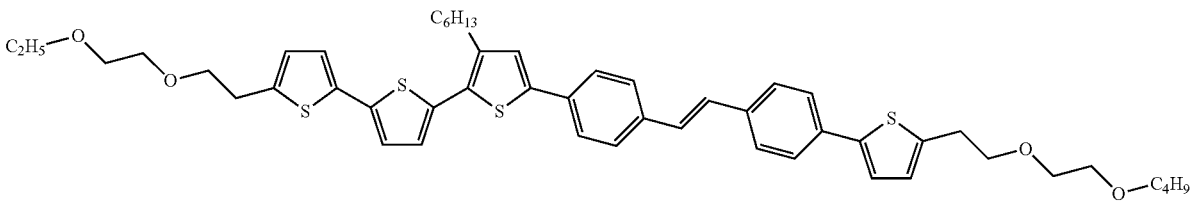

Publicly known methods can be used for synthesizing compounds represented by the general formula (1). Examples of the method of linking thiophenes with one another include a method of coupling halogenated thiophene with thiopheneboronic acid or thiopheneboronic acid ester in the presence of a palladium catalyst, a method of coupling halogenated thiophene with a thiophene Grignard reagent in the presence of a nickel or palladium catalyst, and the like. Examples of the method of linking a thiophene skeleton with a linking group include a method of coupling a halogenated linking group with thiopheneboronic acid or thiopheneboronic acid ester in the presence of a palladium catalyst, a method in which a dihalomethylated aryl compound is reacted with trialkyl phosphite and then the reaction product is coupled with formylthiophene by a condensation reaction, and the like.

In the present invention, it is also possible to use an organic semiconductor composite which is formed by adding the carbon nanotubes (hereinafter, abbreviated to CNTs) to the thiophene compound represented by the general formula (1). By using such organic semiconductor composite containing a thiophene compound and CNTs, it becomes possible to realize higher mobility while maintaining the characteristics of the thiophene compound itself. The organic semiconductor composite may contain plural kinds of the thiophene compounds represented by the above general formula (1). Examples of the method of forming an organic semiconductor composite include a method of mixing CNTs or a solution containing CNTs with an organic semiconductor or a solution thereof. Further, the process of heating or applying an ultrasonic wave may be added for accelerating mixing as required, or the process of removing solid components, such as filtration, may be added.

Preferably, the weight fraction of CNTs with respect to the thiophene compound in the organic semiconductor composite is 0.01 to 3% by weight in order to obtain semiconductor characteristics. If the weight fraction is smaller than 0.01% by weight, the effect of adding CNTs is small, and if the weight fraction is larger than 3% by weight, the organic semiconductor composite becomes unsuitable for being used as a semiconductor layer since the electric conductivity of the organic semiconductor composite increases excessively. The weight fraction is more preferably 1% by weight or less. It becomes easy to achieve high mobility and a high on/off ratio simultaneously by setting the weight fraction at 1% by weight or less.

The CNT includes a single-layer CNT in which one carbon film (graphene sheet) is rolled up in the shape of a cylindrical tube, a two-layer CNT in which two graphene sheets are concentrically rolled up, and a multi-layer CNT in which plural graphene sheets are concentrically rolled up. In the present invention, any one CNT of the single-layer CNT, the two-layer CNT and the multi-layer CNT may be used singly, or two or three CNTs may be used simultaneously. The method for synthesizing the CNTs includes an arc discharge method, a chemical vapor deposition method (CVD method), a laser abrasion method and the like, and the diameter, the length or linearity of the CNTs varies a little with synthesis methods. The CNT used in the present invention may be obtained by any method.

When the organic semiconductor composite is used for the FET device, preferably, the length of the CNTs is shorter than the distance (channel length) between the source electrode and the drain electrode. If the length of the CNTs is longer than the channel length, it may cause a short circuit between electrodes and the organic semiconductor composite is unsuitable for preparing the FET device. Therefore, it is preferable to use the CNTs whose length is shorter than the distance (channel length) between the source electrode and the drain electrode or to undergo a process in which the length of the CNTs becomes shorter than the channel length. Depending on the channel length, an average length of the CNTs is preferably 2 μm or less, and more preferably 0.5 μm or less.

Generally, commercial available CNTs have a distribution of length, the CNTs longer than the channel length may be included. Therefore, it is more preferable to add a process in which the length of the CNTs becomes shorter than the channel length since the short circuit between electrodes can be prevented with certainty. For example, since the CNTs are generally produced in the shape of strings, preferably, they are cut to be used in the shape of short fibers. An acid treatment by sulfuric acid or nitric acid, an ultrasonic wave treatment, or a freeze-pulverizing method is effective for cutting the CNTs into short fibers. Further, it is more preferable in point of improving the purity to use these methods in combination with the separation by a filter. In addition, not only the cut CNTs but also the CNTs synthesized in the shape of short fibers are preferably used.

Further, a diameter of the CNT is not particularly limited but a diameter of 1 nm or more and 100 nm or less is preferable, and more preferably 50 nm or less.

In the present invention, it is preferable to provide a process of dispersing uniformly CNTs in the solvent and filtering the dispersion with a filter. By obtaining CNTs smaller than the filter pore size from the filtrate, CNTs smaller than the channel length can be obtained efficiently.

As a filter to be used for filtration, any kinds of filter, such as a membrane filter, a cellulose filter paper and a glass fiber filter paper, can be used. Among them, the membrane filter is preferably used because it can reduce the amount of CNTs adsorbed within the filter paper and can obtain CNTs from the filtrate efficiently.

The pore size of the filter used for filtration may be smaller than the channel length and it can be selectively used in accordance with the channel length. For example, when the channel length is 20 μm, a short circuit between electrodes can be prevented with certainty by using a filter with a pore size of 10 μm. Practically, filters with a pore size of 0.5 to 10 μm can be preferably used.

As other methods of shortening CNTs, there is a method of shortening CNTs themselves by an acid treatment and this can be used in the present invention. In this case, shortened CNTs can be obtained by putting CNTs in a mixed acid of sulfuric acid and nitric acid, and applying ultrasonic wave or a heat treatment at 100° C. or higher. Further, a method of heating CNTs in hydrogen peroxide can also be used. When performing these methods, CNTs shorter than the distance between the source electrode and the drain electrode can be obtained by filtering off the CNTs treated using a filter with a pore size of 0.1 to 1 μm as a post-treatment and washing them with water.

Further, as another method, CNTs shorter than a distance between the source electrode and the drain electrode can be obtained by undergoing a freeze-pulverizing process.

In the present invention, preferably, CNTs having a conjugated polymer adhering to at least a part of the surface thereof are used. Thereby, the CNTs can be dispersed more uniformly in the matrix (low molecular organic semiconductor), and high mobility and a high on/off ratio can be realized. The state in which a conjugated polymer adheres to at least a part of the CNT means the state in which a conjugated polymer covers a part of or all of surface of the CNT. An interaction induced by an overlap of respective at electron clouds resulting from their conjugated structures is thought to be the reason why the conjugated polymer can cover the CNT. It is possible to determine whether the CNT is covered with a conjugated polymer or not based on whether the reflected color of covered CNT changes from the color of uncovered CNT to the color of the conjugated polymer. The presence of adherents and the weight ratio of adherents to the CNT can be quantitatively identified by elemental analysis or X-ray photoelectron spectroscopy (XPS). Further, as the conjugated polymer adhering to the CNT, any polymers can be used irrespective of the molecular weight, the molecular weight distribution and the structure as long as it is a conjugated polymer. Hereinafter, the above-mentioned "CNT having a conjugated polymer adhering to the CNT" is referred to as a "CNT complex".

Examples of the method by which a conjugated polymer adheres to the CNT include (I) a method of adding CNTs to a melted conjugated polymer and mixing them, (II) a method in which a conjugated polymer is dissolved in a solvent, CNTs are added thereto and mixed, (III) a method in which CNTs have been previously dispersed with ultrasonic wave treatment, and a conjugated polymer is added thereto and mixed, and (IV) a method in which a conjugated polymer and CNTs are added in a solvent and ultrasonic wave is applied to this mixture to mix them. In the present invention, selection of the methods is not particularly limited, and any one method may be employed singly or plural methods may be used in combination.

Examples of the conjugated polymer covering the CNT include polythiophene-based polymers, polypyrrole-based polymers, polyaniline-based polymers, polyacetylene-based polymers, poly-p-phenylene-based polymers, and poly(p-phenylene vinylene)-based polymers, but not particularly limited thereto. As such polymers, polymers which are consist of a single monomer unit are preferably used, but polymers obtained by block copolymerization or random copolymerization of different monomer units are used. Further, polymers obtained by graft polymerization of different monomer units are also used. Among the polymers, polythiophene-based polymers, which easily adhere to the CNT and forms a CNT complex, are particularly preferably used in the present invention.

The polythiophene-based polymers have a structure in which the polymer has a thiophene skeleton and has side chains. Specific examples of the polythiophene-based polymers include poly(3-alkylthiophene) (number of carbon atoms of the alkyl group is preferably 1 to 12) such as poly(3-methylthiophene), poly(3-butylthiophene), poly(3-hexylthiophene), poly(3-octylthiophene) and poly(3-dodecylthiophene); poly(3-alkoxythiophene) (number of carbon atoms of the alkoxy group is preferably 1 to 12) such as poly(3-methoxythiophene), poly(3-ethoxythiophene) and poly(3-dodecyloxythiophene); poly(3-alkoxy-4-alkylthiophene)

(number of carbon atoms of the alkoxy group and number of carbon atoms of the alkyl group are preferably 1 to 12, respectively) such as poly(3-methoxy-4-methylthiophene) and poly (3-dodecyloxy-4-methylthiophene); and poly(3-thioalkylthiophene) (number of carbon atoms of the alkyl group is preferably 1 to 12) such as poly(3-thiohexylthiophene) and poly(3-thiododecylthiophene), and these compounds may be used singly or in combination of two or more species. Among them, poly(3-alkylthiophene) or poly(3-alkoxythiophene) is preferable. As the former, poly(3-hexylthiophene) is particularly preferable. The preferable molecular weight of the polythiophene-based polymer is 800 to 100000 in terms of the number average molecular weight. Further, the polymer does not always have to be a polymer with high molecular weight and it may be an oligomer composed of a straight chain conjugated system.

The method of removing impurities of the conjugated polymer used in the present invention are not particularly limited, but it is fundamentally a purification process which removes raw materials used in the synthesis process or by-products, and a reprecipitation method, a Soxhlet extraction method, a filtration method, an ion-exchange method, and a chelate method can be employed. Among them, the reprecipitation method or the Soxhlet extraction method are preferably used in the case of removing low molecular components. The reprecipitation method, the chelate method or the ion-exchange method is preferably used for removing metal components. Selection of these methods is not particularly limited, and one of these methods may be used singly or these methods may be used in combination.

The organic semiconductor composite of the present invention, which contains a thiophene compound represented by the general formula (1) and carbon nanotubes, is suitably used as an organic transistor material since it has oxidation stability and high charge transporting ability. Further, this organic semiconductor composite has high solubility in a solvent and can be formed into a film by a coating process such as an inkjet process. The organic transistor material of the present invention may contain plural kinds of the organic semiconductor composites or may further contain a known organic semiconductor.

Further, the thiophene compound represented by the general formula (12) can be suitably used as an organic transistor material since it particularly has high oxidation stability and high charge transporting ability. The thiophene compound represented by the general formula (12) can be suitably used as an organic transistor material even when not adding the carbon nanotubes. This thiophene compound has high solubility in a solvent and can be formed into a film by a coating process such as an inkjet process. The organic transistor material of the present invention may contain plural kinds of the thiophene compounds represented by the general formula (12) or may further contain a known organic semiconductor.

Next, the FET device, for which the organic transistor material of the present invention is used, will be described. The FET device of the present invention is an organic field effect transistor having a gate electrode, an insulating layer, semiconductor layer, a source electrode and a drain electrode, and the semiconductor layer contains the organic transistor material of the present invention.

Figure 2:
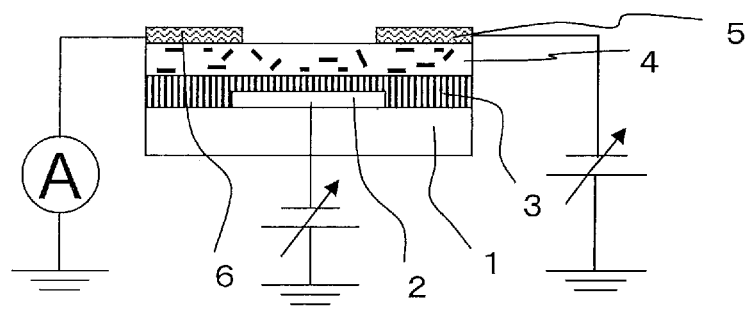
FIG. 2 is a schematic sectional view showing an FET device which is another aspect of the present invention.

FIGS. 1 and 2 are schematic sectional views showing examples of the FET device of the present invention. In FIG. 1, the source electrode 5 and the drain electrode 6 are formed on the substrate 1 having the gate electrode 2 covered with the insulating layer 3, and then the semiconductor layer 4 containing the organic transistor material of the present invention is further formed thereon. In FIG. 2, the semiconductor layer 4 containing the organic transistor material of the present invention is formed on the substrate 1 having the gate electrode 2 covered with the insulating layer 3, and then the source electrode 5 and the drain electrode 6 are further formed thereon.

Examples of the material used for the substrate 1 include inorganic materials such as a silicon wafer, glass, sintered alumina and the like, and organic materials such as polyimide, polyester, polycarbonate, polysulfone, polyethersulfone, polyethylene, polyphenylenesulfide, and polyparaxylene.

Examples of the material used for the gate electrode 2, the source electrode 5 and the drain electrode 6 include conductive metal oxides such as tin oxide, indium oxide and indium-tin oxide (ITO); metals such as platinum, gold, silver, copper, iron, tin, zinc, aluminum, indium, chromium, lithium, sodium, potassium, cesium, calcium, magnesium, palladium, molybdenum, amorphous silicon and polysilicon, and alloys thereof; inorganic conductive substances such as copper iodide and copper sulfide; and conductive polymers, in which conductivity is improved by doping of iodine or the like, such as polythiophene, polypyrrole, polyaniline, complexes of polyethylenedioxythiophene and polystyrenesulfonic acid, but the electrode material is not limited thereto. These electrode materials may be used singly, or may be used as a stacked structure or a mixture of plural materials.

The method of forming the gate electrode 2, source electrode 5 and drain electrode 6 includes a resistance heating deposition method, an electron beam method, a sputtering method, a plating method, a chemical vapor deposition (CVD) method, an ion plating method, a coating method, an ink-jet method and a printing method, but it is not particularly limited as long as it is a method capable of conduction. Further, as for a method of forming an electrode pattern, a method, in which an electrode thin film prepared by the method described above is patterned into a desired pattern by photolithography, or a method, in which a pattern is formed through a mask having a desired shape in depositing or sputtering electrode materials, may be employed.

The material used for the insulating layer 3 (gate insulating film) is not particularly limited, and inorganic materials such as silicon oxide, alumina and the like, organic polymer materials such as polyimide, polyvinyl alcohol, polyvinyl chloride, polyethylene terephthalate, poly(vinylidene fluoride), polysiloxane, polyvinylphenol (PVP) and the like, and mixtures of inorganic material powders and organic polymer materials can be used. The method of forming the insulating layer is not particularly limited, and examples of the method include a resistance heating deposition method, an electron beam method, a sputtering method, a chemical vapor deposition (CVD) method, an ion plating method, a coating method, an ink-jet method and a printing method and the method can be selected depending on materials.

The film thickness of the insulating layer 3 is not particularly limited, but it is preferably 50 nm to 3 μm, and more preferably 100 nm to 1 μm. The insulating layer may be a single-layer or a multi-layer. In the case of the single-layer, the single-layer may be formed from a mixture of a plurality of insulating materials. Further, in the case of the multi-layer, the multi-layer may be formed by stacking a plurality of insulating materials.

In the FET device of the present invention, the semiconductor layer 4 contains the organic transistor material of the present invention. The semiconductor layer 4 may contain a plurality of the organic transistor materials of the present invention or may contain a known organic semiconductor. The known organic semiconductor is not particularly limited, but a material having high carrier mobility is preferable, and specific examples thereof include polythiophenes such as poly(3-hexylthiophene), polybenzothiophene and the like; polypyrroles; poly(p-phenylene vinylene) such as poly(p-phenylene vinylene) and the like; polyanilines; polyacetylenes; polydiacetylenes; polycarbazoles; polyfurans such as polyfuran, polybenzofuran and the like; polyheteroaryls, in which a nitrogen-containing aromatic ring, such as pyridine, quinoline, phenanthroline, oxazole, oxadiazole and the like, is a building block; condensed polycyclic aromatic compounds such as anthracene, pyrene, naphthacene, pentacene, hexacene, rubrene and the like; nitrogen-containing aromatic compounds such as furan, thiophene, benzothiophene, dibenzofuran, pyridine, quinoline, phenanthroline, oxazole, oxadiazole and the like; aromatic amine derivatives typified by 4,4'-bis(N-(3-methylphenyl)-N-phenylamino)biphenyl; bis-carbazole derivatives such as bis(N-allylcarbazole) and bis(N-alkylcarbazole); pyrazoline derivatives, stilbene-based compounds, hydrazone-based compounds, metal phthalocyanines such as copper phthalocyanine, metal porphyrins such as copper porphyrin, distyrylbenzene derivatives, aminostyryl derivatives, aromatic acetylene derivatives, fused ring tetracarboxylic acid diimides such as naphthalene-1,4,5,8-tetracarboxylic acid diimide, perylene-3,4,9,10-tetracarboxylic acid diimide, and organic dyes such as merocyanine, phenoxazine and rhodamine.

Further, the semiconductor layer 4 may contain an insulating material in addition to the organic transistor material of the present invention. Examples of the insulating material used herein include poly(methylmethacrylate), polycarbonate, and polyethylene terephthalate, but the insulating material is not limited thereto.

The semiconductor layer 4 is constructed from a single-layer or a multi-layer. In the case of the multi-layer, a plurality of organic transistor materials of the present invention may be stacked, or the organic transistor material of the present invention and the known organic semiconductor may be stacked.

As a method of forming the semiconductor layer 4, dry methods such as a resistance heating deposition method, an electron beam method, a sputtering method and a CVD method can be employed, but preferably, a method of coating type is used from the viewpoint of the production cost or the adaptability for large area. Specifically, a spin coating method, a blade coating method, a slit die coating method, a screen printing method, a bar coating method, a casting method, a transfer printing method, a dipping and extrusion method, and an ink-jet method can be preferably used and a coating method can be selected depending on aimed coated film characteristics such as controls of the thickness or orientation of the coated film. For example, when performing spin coating, when the concentration of the organic transistor material solution is 1 to 20 g/l, a coated film having a thickness of 5 to 200 nm can be obtained. Examples of the solvent in which the organic transistor material is dissolved include tetrahydrofuran, toluene, xylene, 1,2,3-trimethylbenzene, 1,2,3,5-tetramethylbenzene, 1,2,3,5-tetramethylbenzene, 1,3-diethylbenzene, 1,4-diethylbenzene, 1,3,5-triethylbenzene, 1,3-diisopropylbenzene, 1,4-isopropylbenzene, 1,4-dipropylbenzene, butylbenzene, isobutylbenzene, 1,3,5-triisopropylbenzene, dichloromethane, dichloroethane, chloroform, chlorobenzene, diochlorobenzene, o-chlorotoluene, 1,2-dihydronaphthalene, 1,2,3,4-tetrahydronaphthalene, ethyl benzoate, ethyl 2,4,6-trimethylbenzoate, ethyl 2-ethoxybenzoate, o-toluidine, m-toluidine, and p-toluidine. These solvents may be used singly or may be used as a mixture of plural solvents. The coated film may be subjected to an annealing process under air pressure, under reduced pressure, or under an inert gas atmosphere (under a nitrogen or argon atmosphere).

Preferably, the film thickness of the semiconductor layer 4 is 5 nm or more and 100 nm or less. A film thickness within this range makes it easy to form a uniform thin film and makes it possible to suppress the current between source and drain which cannot be controlled by the gate voltage and enhance the on/off ratio of the FET device more. The film thickness can be measured by an atomic force microscope or an ellipsometry.

Further, an orientation layer can also be provided between the insulating layer 3 and the semiconductor layer 4. The organic transistor material of the present invention exhibits high mobility even if the orientation layer is not provided, but it is preferable to provide the orientation layer since this enables higher mobility. As the orientation layer, publicly known materials, such as silane compounds, titanium compounds, organic acids and heteroorganic acids, can be used, and among these compounds, organic silane compounds are preferable. Among them, silane compounds represented by the following general formula (20) are suitably used.

[Formula 42]

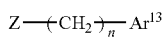

(20)

Herein, $Ar^{25}$ represents an aryl group or a heteroaryl group and Z represents a silane residue. n represents an integer of 0 to 20. The descriptions of the aryl group and the heteroaryl group are similar to those of $R^1$ to $R^5$ described above.

The Silane compound represented by the general formula (20) forms a thin film by the reaction of a part or all of silane residue represented by Z with the surface of the insulating layer to form a chemical bond. Preferably, the silane residue represented by Z has a halogen atom, a hydroxyl group or an alkoxy group in order to promote the reaction smoothly. The descriptions of the halogen atom and the alkoxy group are similar to those of $R^1$ to $R^5$ described above.

The orientation layer not only improves the wettability of the surface of the insulating layer and the film-forming ability of the semiconductor layer, but also has effects of enhancing the orientation of the organic transistor material and further improving the mobility by virtue of the presence of an aryl group or a heteroaryl group represented by $Ar^{13}$ in the general formula (20). If the number n of methylene groups in the general formula (20) is too large, the effect of improving the orientation is decreased, and therefore the number n is preferably within the range of 0 to 12, and more preferably within the range of 0 to 6.

The silane compounds represented by the general formula (20) are not particularly limited and specific examples thereof include phenyltridhlorosilane, naphthyltrichlorosilane, anthracenetrichlorosilane, pyrenetrichlorosilane, perylenetrichlorosilane, coronenetrichlorosilane, thiophenetrichlorosilane, pyrroletrichlorosilane, pyridinetrichlorosilane, phenyltrimethoxysilane, phenyltriethoxysilane, naphthyltrimethoxysilane, naphthyltriethoxysilane, anthracenetrimethoxysilane, anthracenetriethoxysilane, pyrenetrimethoxysilane, pyrenetriethoxysilane, thiophenetrimethoxysilane, thiophenetriethoxysilane, phenylmethyltrichlorosilane, phenylethyltrichlorosilane, phenylpropyltrichlorosilane, phenylbutyltrichlorosilane, phenylhexyltrichlorosilane, phenyloctyltrichlorosilane, naphthylmethyltrichlorosilane, naphthylethyltrichlorosilane, anthracenemethyltrichlorosilane, anthraceneethyltrichlorosilane, pyrenemethyltrichlorosilane, pyreneethyltrichlorosilane, thiophenemethyltrichlorosilane, thiopheneethyltrichlorosilane, aminophenyltrichlorosilane, hydroxyphenyltrichlorosilane, chlorophenyltrichlorosilane, dichlorophenyltrichlorosilane, trichlorophenyltrichlorosilane, bromophenyltrichlorosilane, fluorophenyltrichlorosilane, difluorophenyltrichlorosilane, trifluorophenyltrichlorosilane, tetrafluorophenyltrichlorosilane, pentafluorophenyltrichlorosilane, iodephenyltrichlorosilane, and cyanophenyltrichlorosilane.

In consideration of the resistance of the orientation layer, preferably, the film thickness of the orientation layer is 10 nm or less, and more preferably, is composed of a monomolecular film. Further, the orientation layer containing a silane compound represented by the general formula (20) also includes a layer formed by chemical bonding between the functional group represented by Z in the general formula (20) and the surface of the insulating layer. A closely packed and robust film can be formed when the functional group (for example, a halogenated silyl group) represented by Z in the general formula (20) is chemically reacted with the surface of the insulating layer. When an unreacted silane compound is layered on the robust film reacted, it is possible to remove the unreacted silane compound by cleaning the film and obtain a monomolecular film formed by chemical bonding between the functional group represented by Z in the general formula (20) and the surface of the insulating layer.

The method of forming the orientation layer is not particularly limited, and examples thereof include a vapor phase method such as a CVD method and the like, and a method of using a liquid phase such as a spin coating method, a dipping and extrusion method and the like.

Before forming the orientation layer, the surface of the insulating layer which is an underlying layer of the orientation layer may be subjected to a hydrophilization treatment using a UV/ozone method or an oxygen plasma method. This treatment can makes it easy to undergo the chemical reaction between the functional group represented by Z in the general formula (20) and the surface of the insulating layer.

When the organic transistor material of the present invention contains a thiophene compound having a liquid crystalline state, it is effective to use an orientation method, which orients molecules to a certain direction, between the insulating layer 3 and the semiconductor layer 4. Installation of the orientation method is preferable because this enables further improvement in mobility of the organic transistor material. Examples of the orientation method include a method in which an orientation treatment such as rubbing is performed on the insulating film and a method in which minute relief structure is formed on the surface of the insulating layer in addition to the method of forming an orientation layer between the insulating layer and the semiconductor layer described above. Further, it is also possible to utilize external fields such as an electric field or a magnetic field.

The FET device thus formed can control a current flowing between the source electrode and the drain electrode through changing the gate voltage. The mobility of the FET device can be calculated by use of the following equation (a):

$$\mu = (\delta Id/\delta Vg) L \cdot D / (w \cdot \in_r \cdot \in \cdot Vsd) \tag{a}$$

wherein Id is the current between the source and the drain, Vsd is the voltage between the source and the drain, Vg is the gate voltage, D is the thickness of the insulating layer, L is the channel length, W is the channel width, $\in_r$ is the dielectric constant (herein, 3.9 of $SiO_2$ or 3.8 of PVP is used) of the insulating layer, and $\in$ is the dielectric constant ($8.85 \times 10^{-12}$ F/m) in vacuum.

Further, the on/off ratio can be determined from the ratio of the value of Id (on-current) at a certain negative gate voltage to the value of Id (off-current) at a certain positive gate voltage.

The organic transistor material of the present invention can be advantageously used for manufacturing various devices such as a thin film field effect transistor, a photovoltaic element and a switching element.

EXAMPLES

Hereinafter, the present invention will be described by way of examples, but the present invention is not limited to these examples. In addition, the numbers of compounds in the following examples refer to the numbers of the compounds described in the aforementioned chemical formulas.

As $^1$H-NMR for identification of synthesized compounds, a superconducting FT-NMR "EX-270" (manufactured by JEOL Ltd.) was employed and measurement was conducted using a deuterated chloroform solution.

Further, whether the thiophene compound has a liquid crystalline state or not was checked by differential scanning calorimetry (DSC). Using a differential scanning calorimeter "DSC-50" (manufactured by Shimadzu Corp.), measurement was carried out over a temperature range from room temperature to the melting point of the compound under the conditions that the temperature raising rate and the temperature falling rate were both 5° C./min, and the presence or absence of a phase transition point between liquid crystal phase and crystal phase was checked.

Synthesis Example 1

Synthesis of Compound [7]

60 g of 3-n-hexylthiophene was dissolved in 400 ml of dimethylformamide, and to this, 50 g of N-bromosuccinimide was added. The resulting solution was stirred at room temperature for 4 hours under a nitrogen atmosphere. 200 ml of water and 200 ml of hexane were added to the resulting solution to separate the organic layer. The organic layer was washed with 200 ml of water and dried over magnesium sulfate, and then the solvent was distilled off under reduced pressure with a rotary evaporator to obtain 60 g of 2-bromo-3-n-hexylthiophene.

Next, 4.3 g of magnesium powder and 10 mg of iodine were added to 100 ml of tetrahydrofuran and stirred for 30 minutes under a nitrogen atmosphere. To this, a mixture of 42 g of 2-bromo-3-n-hexylthiophene described above and 100 ml of tetrahydrofuran was added dropwise, and heated to reflux for 1 hour. The mixture was cooled to room temperature and a mixture of 20 g of 5,5'-dibromo-2,2'-bithiophene and 200 ml of tetrahydrofuran was added thereto, and further 0.48 g of [(diphenylphosphino)propane]nickel (II) dichloride was added in small portions, and the resulting solution was heated to reflux for 3 hours under a nitrogen atmosphere. 800 ml of a 1N aqueous solution of ammonium chloride and 600 ml of hexane were added to the resulting solution to separate the organic layer. The organic layer was washed with 200 ml of a saturated aqueous solution of sodium hydrogencarbonate and 200 ml of water and then dried over magnesium sulfate. The resulting solution was concentrated by a rotary evaporator and was purified by a column chromatography (filler: silica gel, eluent: hexane) to obtain 28 g of 4T represented by the following formula.

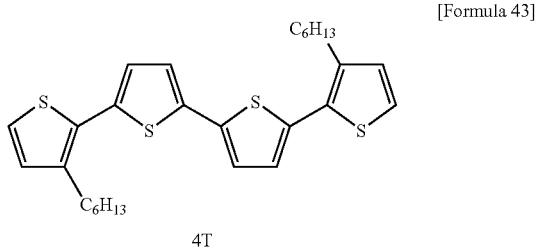

4T

[Formula 43]

0.75 ml of dimethylformamide and 0.90 g of phosphorous oxychloride were added to a mixture of 4.0 g of 4T described above and 50 ml of 1,2-dichloroethane and stirred at 80° C. for 6 hours under a nitrogen atmosphere. 50 ml of a saturated aqueous solution of sodium acetate was added to the resulting solution and heated to reflux for 10 minutes. The mixture was cooled to room temperature, and then to this, 50 ml of dichloromethane was added to separate the organic layer. The organic layer was washed with 100 ml of water and then dried over magnesium sulfate. The resulting solution was concentrated by a rotary evaporator and was purified by a column chromatography (filler: silica gel, eluent: hexane/dichloromethane) to obtain 2.6 g of 4T-CHO represented by the following formula.

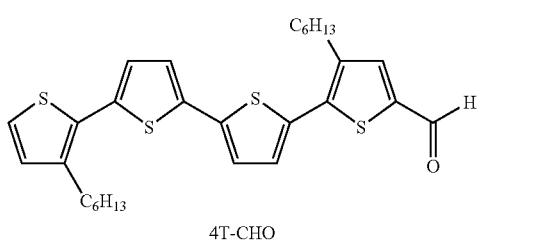

4T-CHO

[Formula 44]

A mixture of 0.12 g of α,α'-dichloro-p-xylene and 0.46 ml of triethylphosphite was stirred at 150° C. for 5 hours. The resulting solution was cooled to room temperature, and then 50 ml of dimethylsulfoxide and 0.15 g of potassium t-butoxide were added thereto and stirred at room temperature for 10 minutes. Subsequently, 0.68 g of 4T-CHO described above was added to the solution and stirred at room temperature for 5 hours. 30 ml of ethanol was added to the resulting solution, and the precipitate was filtered and washed with 20 ml of ethanol to obtain a solid. The obtained solid was purified by a column chromatography (filler: silica gel, eluent: hexane/dichloromethane), and vacuum-dried to obtain 0.28 g of red powder. The results of $^1$H-NMR analysis of the obtained powder are as follows and it was confirmed that this powder was compound [7]

$^1$H-NMR (CDCl$_3$ (d=ppm)):0.89-0.92 (t, 12H), 1.33-1.42 (m, 24H), 1.54-1.68 (m, 8H), 2.74-2.82 (m, 8H), 6.90-6.96 (m, 6H), 7.03 (d, 2H), 7.06 (d, 2H), 7.13-7.19 (m, 8H), 7.44 (d, 4H)

Further, DSC measurement was carried out and consequently the compound [7] did not exhibit any phase transition point between liquid crystal phase and crystal phase.

Synthesis Example 2

Synthesis of Compound [6]

After a mixture of 16.3 g of 4T described above and 20 ml of tetrahydrofuran was cooled to −30° C., 21 ml of n-butyl-lithium solution (1.6 mol/l hexane solution) was added dropwise, and stirred at room temperature for 1 hour. The resulting mixture was cooled to −10° C., and 5.7 g of 2-isoporopoxy-4,4,5,5-tetramethyl-[1,3,2]dioxaborolane was added thereto and stirred at room temperature, for 3 hours. 33 ml of a 1N aqueous solution of hydrochloric acid, 200 ml of water and 200 ml of dichloromethane were added to the resulting solution to separate the organic layer. The organic layer was washed with 100 ml of water and then dried over magnesium sulfate. The resulting solution was concentrated by a rotary evaporator and was purified by a column chromatography (filler: silica gel, eluent: hexane/dichloromethane) to obtain 11 g of 4T-BPin represented by the following formula.

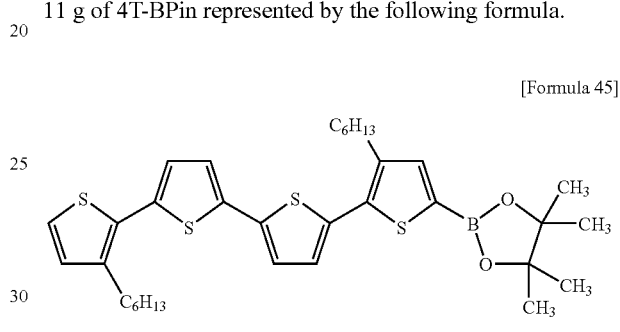

4T-BPin

[Formula 45]

7.2 ml of ethanol, 12 ml of a 2N aqueous solution of sodium carbonate and 30 mg of tetrakis(triphenylphosphine)palladium(0) were added to a mixture of 1.8 g of 4T-BPin described above, 0.33 g of 4,4'-dibromophenyl ether and 36 ml of toluene, and refluxed at 110° C. for 9 hours under a nitrogen stream. 100 ml of water and 100 ml of dichloromethane were added to the resulting solution to separate the organic layer. The organic layer was washed with 300 ml of water and then dried by magnesium sulfate. The resulting solution was concentrated by a rotary evaporator, purified by a column chromatography (filler: silica gel, eluent: hexane/dichloromethane), and vacuum-dried to obtain 0.25 g of orange powder. The results of $^1$H-NMR analysis of the obtained powder are as follows and it was confirmed that this powder was compound [6].

$^1$H-NMR (CDCl$_3$ (d=ppm)): 0.82-0.92 (t, 12H), 1.27-1.42 (m, 24H), 1.62-1.75 (m, 8H), 2.76-2.82 (m, 8H), 6.93-6.95 (d, 2H), 7.01-7.06 (m, 8H), 7.10 (s, 2H), 7.12 (d, 4H), 7.16 (d, 2H), 7.55-7.59 (dd, 4H)

Further, DSC measurement was carried out and consequently the compound [6] did not exhibit any phase transition point between liquid crystal phase and crystal phase.

Synthesis Example 3

Synthesis of Compound [34]

A mixture of 3.1 g of 4,4'-bis(chloromethyl)biphenyl and 8.6 ml of triethylphosphite was stirred at 150° C. for 5 hours. The mixture was cooled to room temperature, and 50 ml of dimethylsulfoxide and 2.8 g of potassium t-butoxide were added to the mixture and stirred at room temperature for 10 minutes. Subsequently, 4.9 g of 3-hexyl-2-thiophene aldehyde was added thereto and stirred at room temperature for 5 hours. 30 ml of ethanol was added to the resulting solution and the precipitate was filtered to obtain a solid. The obtained solid was washed with 20 ml of ethanol to obtain 2.8 g of TPV represented by the following formula.

[Formula 46]

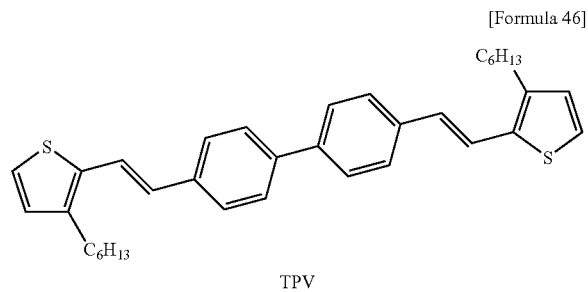

TPV 1.78 g of N-bromosuccinimide was added to a mixture of 2.8 g of TPV described above and 30 ml of dimethylformamide, and stirred at room temperature for 10 hours under a nitrogen stream. The resulting solution was filtered and the precipitate was washed with 10 ml of dimethylformamide and 20 ml of methanol to obtain 1.4 g of TPV-Br represented by the following formula.

[Formula 47]

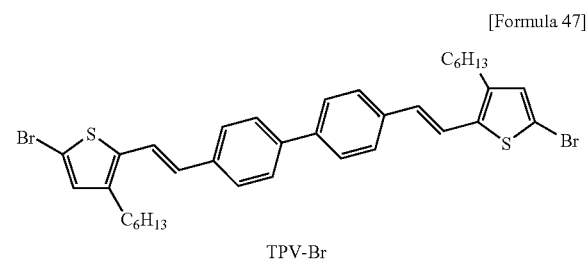

TPV-Br 3 ml of ethanol, 5 ml of a 2N aqueous solution of sodium carbonate and 10 mg of tetrakis(triphenylphosphine)palladium(0) were added to a mixture of 0.53 g of 4T-BPin described above, 0.2 g of TPV-Br described above and 15 ml of toluene, and refluxed at 110° C. for 6 hours under a nitrogen stream. 20 ml of water and 50 ml of dichloromethane were added to the resulting solution to separate the organic layer. The organic layer was washed with 20 ml of water and then dried over magnesium sulfate. The resulting solution was concentrated by a rotary evaporator, purified by a column chromatography (filler: silica gel, eluent: hexane/dichloromethane), and vacuum-dried to obtain 70 mg of red-orange powder. The results of $^1$H-NMR analysis of the obtained powder are as follows and it was confirmed that this powder was compound [34].

$^1$H-NMR (CDCl$_3$ (d=ppm)): 0.87-0.94 (t, 18H), 1.28-1.36 (m, 36H), 1.60-1.68 (m, 12H), 2.65-2.81 (m, 12H), 6.91-6.95 (m, 6H), 7.02-7.05 (m, 6H), 7.13 (d, 4H), 7.18 (d, 2H), 7.26 (d, 2H), 7.53-7.64 (dd, 8H)

Further, DSC measurement was carried out and consequently the compound [34] did not exhibit any phase transition point between liquid crystal phase and crystal phase.

Synthesis Example 4

Synthesis of Compound [33]

After a mixture of 10 g of bithiophene and tetrahydrofuran was cooled to −80° C., 37 ml of n-butyllithium solution (1.6 mol/l hexane solution) was added dropwise thereto and stirred at room temperature for 1 hour. The resulting solution was cooled to −60° C., and 11.7 g of 2-isoporopoxy-4,4,5,5-tetramethyl-[1,3,2]dioxaborolane was added thereto and stirred at room temperature for 8 hours. 100 ml of water and 150 ml of dichloromethane were added to the resulting solution to separate the organic layer. The organic layer was washed with 300 ml of water and then dried over magnesium sulfate. The resulting solution was concentrated by a rotary evaporator to obtain 5.68 g of 5-(4,4,5,5-tetramethyl-[1,3,2] dioxaborolane-2-yl)-2,2'-bithiophene.

Next, 40 ml of ethanol, 50 ml of a 2N aqueous solution of sodium carbonate and 300 mg of tetrakis(triphenylphosphine)palladium(0) were added to a mixture of 5.2 g of 5-(4,4,5,5-tetramethyl-[1,3,2]dioxaborolane-2-yl)-2,2'-bithiophene, 5.5 g of 2-bromo-5-n-hexylthiophene and 200 ml of toluene, and refluxed at 90° C. for 10.5 hours under a nitrogen stream. 100 ml of water and 100 ml of dichloromethane were added to the resulting solution to separate the organic layer. The organic layer was washed with 300 ml of water and then dried over magnesium sulfate. The resulting solution was concentrated by a rotary evaporator and the resulting solid was recrystallized from hexane to obtain 1.5 g of iso3HT represented by the following formula.

[Formula 48]

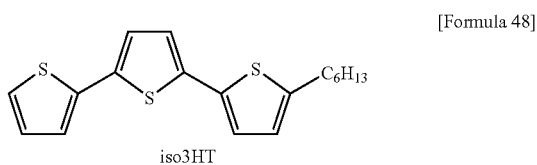

iso3HT

After a mixture of 1.5 g of iso3HT described above and 20 ml of tetrahydrofuran was cooled to −80° C., 3.3 ml of n-butyllithium solution (1.6 mol/l hexane solution) was added dropwise thereto and stirred at room temperature for 3.5 hours. The resulting solution was cooled to −60° C., and 1.0 g of 2-isoporopoxy-4,4,5,5-tetramethyl-[1,3,2]dioxaborolane was added thereto and stirred at room temperature for 7 hours. 100 ml of saturated salt water and 150 ml of dichloromethane were added to the resulting solution to separate the organic layer. The organic layer was washed with 300 ml of saturated salt water and then dried over magnesium sulfate. The resulting solution was concentrated by a rotary evaporator and purified by a column chromatography (filler: silica gel, eluent: hexane/dichloromethane) to obtain 1.2 g of iso3HT-BPin represented by the following formula.

[Formula 49]

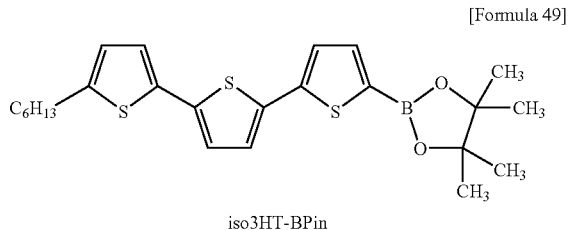

iso3HT-BPin 5 ml of ethanol, 6 ml of a 2N aqueous solution of sodium carbonate and 18 mg of tetrakis(triphenylphosphine)palladium(0) were added to a mixture of 0.31 g of TPV-Br described above, 0.41 g of iso3HT-BPin described above and 18 ml of toluene, and refluxed at 100° C. for 11 hours under a nitrogen stream. The solid precipitated in the resulting solution was filtered and recrystallized from toluene. The obtained solid was vacuum-dried to obtain 0.25 g of red-orange powder. The results of $^1$H-NMR analysis of the obtained powder are as follows and it was confirmed that this powder was compound [33].

$^1$H-NMR (CDCl$_3$ (d=ppm)): 0.86-0.91 (t, 12H), 1.28-1.35 (m, 24H), 1.65-1.68 (m, 8H), 2.65-2.78 (m, 4H), 2.77-2.82 (m, 4H), 6.68 (d, 2H), 6.85-6.91 (d, 2H), 6.95 (s, 2H), 6.98 (t, 4H), 7.04-7.09 (m, 8H), 7.53-7.56 (d, 4H), 7.61-7.64 (d, 4H)

Further, DSC measurement was carried out and consequently the compound [33] did not exhibit any phase transition point between liquid crystal phase and crystal phase.

Synthesis Example 5

Synthesis of Compound [44]

68 mg of N-bromosuccinimide was added to a mixture of 0.18 g of compound [6] described above and 30 ml of dimethylformamide, and stirred at room temperature for 5 hours under a nitrogen stream. 150 ml of ethylacetate and 150 ml of water were added to the resulting solution to separate the organic layer. The organic layer was washed with 300 ml of water and dried over magnesium sulfate. The resulting solution was concentrated by a rotary evaporator, purified by a column chromatography (filler: silica gel, eluent: hexane/dichloromethane), and vacuum-dried to obtain 0.18 g of compound [6]-Br represented by the following formula.

Synthesis Example 6

Synthesis of Compound [8]

10 ml of ethanol, 15 ml of a 2N aqueous solution of sodium carbonate and 31 mg of tetrakis(triphenylphosphine)palladium(0) were added to a mixture of 1.6 g of 4T-BPin described above, 0.30 g of 4,4'-dibromostilbene and 50 ml of toluene, and refluxed at 110° C. for 9 hours under a nitrogen stream. The solid precipitated in the resulting solution was filtered and washed with 20 ml of water, 20 ml of ethanol and 20 ml of toluene, and then recrystallized from toluene. The obtained solid was vacuum-dried to obtain 0.90 g of orange powder. The results of $^1$H-NMR analysis of the obtained powder are as follows and it was confirmed that this powder was compound [8].

$^1$H-NMR (CDCl$_3$ (d=ppm)):0.89-0.93 (t, 12H), 1.26-1.42 (m, 24H), 1.57-1.68 (m, 8H), 2.74-2.82 (m, 8H), 6.93-6.96 (m, 6H), 7.02 (d, 2H), 7.06 (d, 2H), 7.13-7.24 (m, 8H), 7.52-7.63 (dd, 8H)

Further, DSC measurement was carried out and consequently the compound [8] did not exhibit any phase transition point between liquid crystal phase and crystal phase.

[Formula 50]

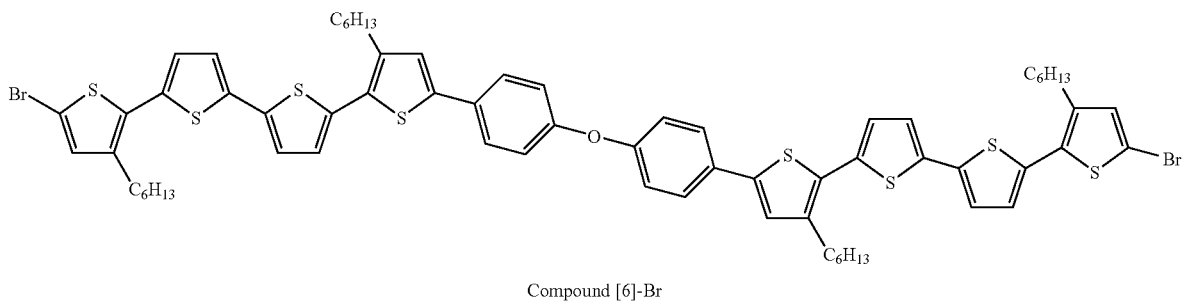

Compound [6]-Br 10 ml of ethanol, 15 ml of a 2N aqueous solution of sodium carbonate and 5.3 mg of tetrakis(triphenylphosphine)palladium(0) were added to a mixture of 0.20 g of compound [6]-Br described above, 0.30 g of iso3HT-BPin described above and 30 ml of toluene, and refluxed at 100° C. for 10 hours under a nitrogen stream. The solid precipitated in the resulting solution was filtered and recrystallized from toluene. The obtained solid was vacuum-dried to obtain 0.12 g of red-orange powder. The results of $^1$H-NMR analysis of the obtained powder are as follows and it was confirmed that this powder was compound [44].

$^1$H-NMR (CDCl$_3$ (d=ppm)): 0.90 (m, 18H), 1.28-1.33 (m, 36H), 1.62-1.78 (m, 12H), 2.72-2.87 (m, 12H), 6.66-6.72 (m, 2H), 6.97-7.03 (m, 6H), 7.08 (m, 12H), 7.15-8.18 (m, 8H), 7.56-7.58 (d, 4H)

Further, DSC measurement was carried out and consequently the compound [44] did not exhibit any phase transition point between liquid crystal phase and crystal phase.

Synthesis Example 7

Synthesis of Compound [48]

3.0 g of 3-n-hexylthiophene was dissolved in 40 ml of tetrahydrofuran and was cooled to −80. To this solution, 12 ml of n-butyllithium solution (1.6 mol/l hexane solution) was added dropwise and stirred for 2 hours. The temperature of the resulting solution was raised to −20° C., and 5.5 g of 2-isoporopoxy-4,4,5,5-tetramethyl-[1,3,2]dioxaborolane was added dropwise thereto and stirred at room temperature for 4.5 hours. 100 ml of water and 100 ml of dichloromethane were added to the resulting solution to separate the organic layer. The organic layer was washed with 300 ml of saturated salt water and dried over anhydrous magnesium sulfate. The solvent was distilled off from the resulting solution under reduced pressure with a rotary evaporator to obtain 4.6 g of 4-HT-BPin represented by the following formula.

[Formula 51]

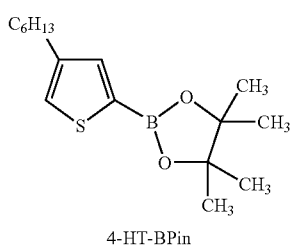

4-HT-BPin 120 mg of tetrakis(triphenylphosphine)palladium(0) was added to a mixture of 0.41 g of 4,4'-dibromostilbene, 1.8 g of 4-HT-BPin thiophene described above, 50 ml of toluene, 15 ml of ethanol and 20 ml of a 2M aqueous solution of sodium carbonate, and stirred at 100° C. for 19 hours under a nitrogen atmosphere. The produced solid was filtered and washed with methanol and hexane, and recrystallized from toluene. The obtained solid was vacuum-dried to obtain 0.44 g of BTS represented by the following formula.

[Formula 52]

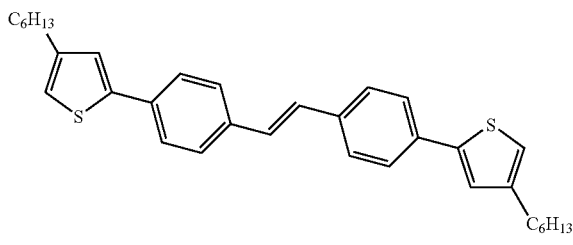

BTS 0.44 g of BTS described above was dissolved in 50 ml of chloroform by heating, and to this, 200 ml of dimethylformamide was added. To this solution, 0.34 g of N-bromosuccinimide was added, and stirred at room temperature for 4.5 hours under a nitrogen atmosphere. The precipitated solid was filtered and washed with methanol to obtain 0.51 g of BTS-Br represented by the following formula.

[Formula 53]

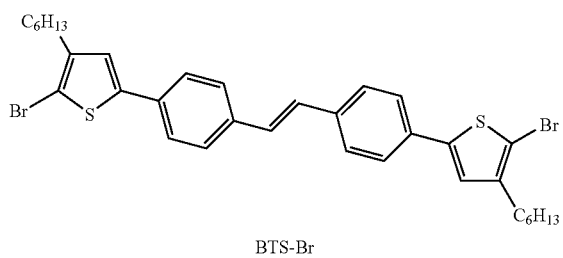

BTS-Br 10 ml of thiophene was dissolved in 150 ml of tetrahydrofuran and was cooled to −80° C. To this solution, 78 ml of n-butyllithium solution (1.6 mol/l hexane solution) was added dropwise and stirred for 3 hours. The temperature of the mixture was raised to −60° C., and 28 g of 2-isoporopoxy-4,4,5,5-tetramethyl-[1,3,2]dioxaborolane was added dropwise thereto and stirred at room temperature for 6 hours. 300 ml of water and 300 ml of dichloromethane were added to the resulting solution to separate the organic layer. The organic layer was washed with 600 ml of water and dried over anhydrous magnesium sulfate. The solvent was distilled off from the resulting solution under reduced pressure with a rotary evaporator to obtain 5.4 g of 2-thienyl-4,4,5,5-tetramethyl-[1,3,2]-dioxaborolane.

12 mg of tetrakis(triphenylphosphine)palladium(0) was added to a mixture of 0.1 g of BTS-Br described above, 86 mg of 2-thienyl-4,4,5,5-tetramethyl-[1,3,2]-dioxaborolane, 35 ml of toluene, 10 ml of ethanol and 15 ml of a 2M aqueous solution of sodium carbonate, and stirred at 90° C. for 12 hours under a nitrogen atmosphere. 100 ml of water and 200 ml of dichloromethane were added to the resulting solution to separate the organic layer. The organic layer was washed with 300 ml of water and then dried over anhydrous magnesium sulfate. The resulting solution was concentrated by a rotary evaporator and purified by a column chromatography (filler: silica gel, eluent: hexane) to obtain 76 mg of BTTS represented by the following formula.

[Formula 54]

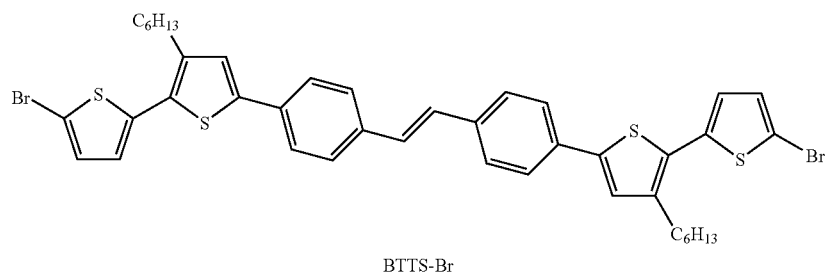

BTTS 75 mg of BITS described above was dissolved in 4 ml of chloroform by heating, and to this, 10 ml of dimethylformamide was added. To this solution, 51.0 mg of N-bromosuccinimide was added and stirred at room temperature for 4 hours under a nitrogen atmosphere. The precipitated solid was filtered and purified by a column chromatography (filler: silica gel, eluent: hexane/dichloromethane) to obtain 20 mg of BTTS-Br represented by the following formula.

[Formula 55]

BTTS-Br 2.3 mg of tetrakis(triphenylphosphine)palladium(0) was added to a mixture of 20 mg of BTTS-Br described above, 60 mg of 4T-BPin described above, 20 ml of toluene, 5 ml of ethanol and 5 ml of a 2M aqueous solution of sodium carbonate, and stirred at 110° C. for 12 hours under a nitrogen atmosphere. 100 ml of water and 200 ml of chloroform were added to the resulting solution to separate the organic layer. The organic layer was washed with 400 ml of water and dried over anhydrous magnesium sulfate. The solvent was distilled off from the resulting solution under reduced pressure with a rotary evaporator, and the obtained solid was recrystallized from toluene to obtain 18 mg of red powder. The results of $^1$H-NMR analysis of the obtained powder are as follows and it was confirmed that this powder was compound [48].

$^1$H-NMR (CDCl$_3$ (d=ppm)):0.89 (m, 18H), 1.33 (m, 36H), 1.56-1.68 (m, 12 H), 2.75-2.83 (m, 12H), 6.93 (d, 2H), 7.02-7.07 (m, 8H), 7.11-7.14 (m, 8H), 7.17 (m, 4H), 7.51-7.61 (dd, 8H)

Further, DSC measurement was carried out and consequently the compound [48] did not exhibit any phase transition point between liquid crystal phase and crystal phase.

Synthesis Example 8

Synthesis of Compound [43]

52 mg of tetrakis(triphenylphosphine)palladium(0) was added to a mixture of 2.3 g of 2-bromo-5-hexylthiophene, 2.7 g of 2-thienyl-4,4,5,5-tetramethyl-[1,3,2]-dioxaborolane, 60 ml of toluene, 15 ml of ethanol and 20 ml of a 2M aqueous solution of sodium carbonate, and stirred at 110° C. for 20.5 hours under a nitrogen atmosphere. 100 ml of ethyl acetate and 100 ml of water were added to the resulting solution to separate the organic layer. The organic layer was washed with 300 ml of water and then dried over anhydrous magnesium sulfate. The resulting solution was concentrated by a rotary evaporator and purified by a column chromatography (filler: silica gel, eluent: hexane) to obtain 1.2 g of iso2HT represented by the following formula.

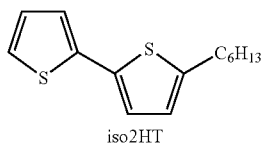

[Formula 56]

iso2HT 1.2 g of iso2HT was dissolved in 50 ml of tetrahydrofuran and cooled to −80° C. To this solution, 3.5 ml of n-butyllithium solution (1.6 mol/l hexane solution) was added dropwise and stirred at −80° C. for 3 hours. The temperature of the mixture was raised to −60° C., and 1.1 g of 2-isoporopoxy-4,4,5,5-tetramethyl-[1,3,2]dioxaborolane was added dropwise thereto and stirred at room temperature for 6 hours. 100 ml of water and 100 ml of dichloromethane were added to the resulting solution to separate the organic layer. The organic layer was washed with 200 ml of water and dried over anhydrous magnesium sulfate. The solvent was distilled off from the resulting solution under reduced pressure with a rotary evaporator to obtain 1.5 g of iso2HT-BPin represented by the following formula.

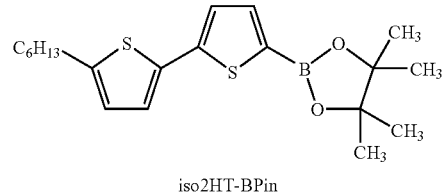

[Formula 57]

iso2HT-BPin 4.5 mg of tetrakis(triphenylphosphine)palladium(0) was added to a mixture of 0.17 g of compound [6]-Br described above, 0.14 g of iso2HT-BPin described above, 20 ml of toluene, 7.0 ml of ethanol and 10 ml of a 2M aqueous solution of sodium carbonate, and stirred at 110° C. for 10 hours under a nitrogen atmosphere. The solid precipitated in the resulting solution was filtered and recrystallized from toluene to obtain 0.12 g of red-orange powder. The results of $^1$H-NMR analysis of the obtained powder are as follows and it was confirmed that this powder was compound [43].

$^1$H-NMR (CDCl$_3$ (d=ppm)):0.90 (m, 18H), 1.28-1.33 (m, 36H), 1.62-1.78 (m, 12H), 2.72-2.87 (m, 12H), 6.66-6.72 (m, 2H), 6.97-7.03 (m, 6H), 7.08 (m, 8H), 7.15-7.18 (m, 8H), 7.56-7.58 (d, 4H)

Further, DSC measurement was carried out and consequently the compound [43] did not exhibit any phase transition point between liquid crystal phase and crystal phase.

Synthesis Example 9

Synthesis of Compound [82]

8.0 g of thiophene was dissolved in 150 ml of tetrahydrofuran and cooled to 0° C. To this solution, 62 ml of n-butyllithium solution (1.6 mol/l hexane solution) was added dropwise, and stirred for 3 hours. 25.0 g of n-dodecylbromide was added dropwise to the solution, and was stirred at room temperature for 18 hours. 150 ml of water and 150 ml of dichloromethane were added to the resulting solution to separate the organic layer. The organic layer was washed with 300 ml of water and dried over anhydrous magnesium sulfate. The solvent was distilled off from the resulting solution under reduced pressure with a rotary evaporator and then the solution was distilled under reduced pressure to obtain 13 g of 2-n-dodecylthiophene.

8.0 g of 2-n-dodecylthiophene was dissolved in 100 ml of tetrahydrofuran and cooled to −80° C. To this solution, 20 ml of n-butyllithium solution (1.6 mol/l hexane solution) was added dropwise and stirred for 4 hours. The temperature of the resulting solution was raised to −30° C., and 6.6 g of 2-isoporopoxy-4,4,5,5-tetramethyl-[1,3,2]dioxaborolane was added dropwise thereto and stirred at room temperature for 4.5 hours. 100 ml of water and 150 ml of dichloromethane were added to the resulting solution to separate the organic layer. The organic layer was washed with 200 ml of saturated salt water and dried over anhydrous magnesium sulfate. The solvent was distilled off from the resulting solution under reduced pressure with a rotary evaporator to obtain 10 g of 5-DDT-BPin represented by the following formula.

[Formula 58]

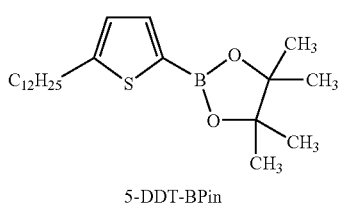

5-DDT-BPin 52 mg of tetrakis(triphenylphosphine)palladium(0) was added to a mixture of 0.34 g of 4,4'-dibromostilbene, 1.1 g of 5-DDT-BPin thiophene described above, 36 ml of toluene, 7.20 ml of ethanol and 10 ml of a 2M aqueous solution of sodium carbonate, and stirred at 100° C. for 17.5 hours under a nitrogen atmosphere. 50 ml of water and 100 ml of dichloromethane were added to the resulting solution and the solid was filtered. The obtained solid was washed with methanol and hexane, and recrystallized from 50 ml of toluene. The solid was vacuum-dried to obtain 0.47 g of yellow lustrous powder.

The results of $^1$H-NMR analysis of the obtained powder are as follows and it was confirmed that this powder was compound [82].

$^1$H-NMR (CDCl$_3$ (d=ppm)):0.86-0.90 (t, 6H), 1.27 (m, 36H), 1.68-1.73 (m, 4H), 2.78-2.84 (m, 4H), 6.73-6.74 (d, 2H), 7.08 (s, 2H), 7.12-7.14 (d, 2H), 7.46-7.56 (dd, 8H)

Further, DSC measurement was carried out and consequently the compound [82] exhibited a phase transition point between liquid crystal phase and crystal phase at 96.3° C. during temperature falling.

Synthesis Example 10

Synthesis of Compound [97]

31 mg of tetrakis(triphenylphosphine)palladium(0) was added to a mixture of 88 mg of BTS-Br described above, 0.97 mg of 5-DDT-BPin described above, 10 ml of toluene, 2.0 ml of ethanol and 3.0 ml of a 2M aqueous solution of sodium carbonate, and stirred at 100° C. for 9 hours under a nitrogen atmosphere. 50 ml of water and 100 ml of dichloromethane were added to the resulting solution to separate the organic layer. The organic layer was washed with 100 ml of water and then dried over anhydrous sodium sulfate. The solvent was distilled off from the resulting solution under reduced pressure with a rotary evaporator to obtain an orange solid. The obtained solid was recrystallized from toluene to obtain 48 mg of yellow solid.

The results of $^1$H-NMR analysis of the obtained powder are as follows and it was confirmed that this powder was compound [97]

$^1$H-NMR (CDCl$_3$ (d=ppm)): 0.86-0.90 (m, 48H), 1.27 (m, 36H), 1.62-1.70 (m, 8H), 2.72-2.84 (m, 8H), 6.72-6.73 (d, 2H), 6.95-6.96 (d, 2H), 7.11-7.16 (d, 4H), 7.49-7.59 (dd, 8H)

Further, DSC measurement was carried out and consequently the compound [97] did not exhibit any phase transition point between liquid crystal phase and crystal phase.

Synthesis Example 11

Synthesis of Compound [98]

17 g of 2-thiopheneethanol was cooled to 0° C., and to this, a suspension formed by adding 7.1 g of sodium hydride (60% in oil) to 110 ml of tetrahydrofuran was added dropwise. The solution was stirred at 0° C. for 20 minutes under a nitrogen atmosphere, and to this, 27 g of 1-bromononane was added dropwise. The resulting solution was heated to 90° C. and stirred for 8 hours. 100 ml of water and 100 ml of dichloromethane were added to the reaction solution to separate the organic layer. The organic layer was washed with 300 ml of saturated salt water and then dried over anhydrous magnesium sulfate. The resulting solution was concentrated by a rotary evaporator and purified by a column chromatography (filler: silica gel, eluent: hexane/dichloromethane) to obtain 20 g of 2-(2-nonyloxyethyl)thiophene.

12 g of 2-(2-nonyloxyethyl)thiophene was dissolved in 90 ml of tetrahydrofuran and cooled to −80° C. To this solution, 34 ml of n-butyllithium solution (1.6 mol/l hexane solution) was added dropwise and stirred for 6 hours. The temperature of the resulting solution was raised to −30° C., and 10 g of 2-isoporopoxy-4,4,5,5-tetramethyl-[1,3,2]dioxaborolane was added dropwise thereto and stirred at room temperature for 18 hours. 100 ml of water and 100 ml of hexane were added to the resulting solution to separate the organic layer. The organic layer was washed with 300 ml of water and dried over anhydrous magnesium sulfate. The solvent was distilled off from the resulting solution under reduced pressure with a rotary evaporator to obtain 8.8 g of 5-NOET-BPin represented by the following formula.

[Formula 59]

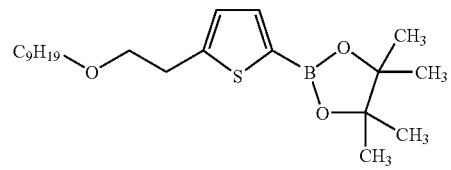

5-NOET-BPin 67 mg of tetrakis(triphenylphosphine)palladium(0) was added to a mixture of 0.21 g of 4,4'-dibromostilbene, 0.69 g of 5-NOTE-BPin described above, 20 ml of toluene, 4 ml of ethanol and 5 ml of a 2N aqueous solution of sodium carbonate, and stirred at 100° C. for 10 hours under a nitrogen atmosphere. 70 ml of dichloromethane and 50 ml of water were added to the resulting solution to separate the organic layer. The organic layer was washed with 150 ml of water and then dried over anhydrous magnesium sulfate. The resulting solution was concentrated by a rotary evaporator and purified by a column chromatography (filler: silica gel, eluent: hexane/dichloromethane) to obtain 80 mg of light yellow powder. The results of $^1$H-NMR analysis of the obtained powder are as follows and it was confirmed that this powder was compound [98].

$^1$H-NMR (CDCl$_3$ (d=ppm)):0.85-0.90 (m, 6H), 1.27 (m, 24H), 1.57-1.63 (m, 4H), 3.07-3.12 (t, 4H), 3.45-3.50 (t, 4H), 3.66-3.70 (t, 4H), 6.81-6.82 (d, 2H), 7.10 (s, 2H), 7.15-7.17 (d, 2H), 7.48-7.57 (dd, 8H)

Further, DSC measurement was carried out and consequently the compound [98] exhibited a phase transition point between liquid crystal phase and crystal phase at 99.0° C. during temperature falling.

Synthesis Example 12

Synthesis of Compound [100]

13 g of 2-thiopheneethanol was cooled to 0° C., and to this, a suspension formed by adding 5.8 g of sodium hydride (60% in oil) to 100 ml of tetrahydrofuran was added dropwise. The solution was stirred at 0° C. for 20 minutes under a nitrogen atmosphere, and to this, 25 g of 1-bromododecane was added dropwise. The resulting solution was heated to 90° C. and stirred for 11.5 hours. 100 ml of water and 150 ml of dichloromethane were added to the reaction solution to separate the organic layer. The organic layer was washed with 300 ml of water and then dried over anhydrous magnesium sulfate. The resulting solution was concentrated by a rotary evaporator and purified by a column chromatography (filler: silica gel, eluent: hexane/dichloromethane) to obtain 16 g of 2-(2-dodecyloxyethyl)thiophene.

10 g of 2-(2-dodecyloxyethyl)thiophene was dissolved in 90 ml of tetrahydrofuran and cooled to −80° C. To this solution, 25 ml of n-butyllithium solution (1.6 mol/l hexane solution) was added dropwise and stirred for 2.5 hours. The temperature of the resulting solution was raised to −30° C., and 7.6 g of 2-isoporopoxy-4,4,5,5-tetramethyl-[1,3,2]dioxaborolane was added dropwise and stirred at room temperature for 6.5 hours. 100 ml of water and 100 ml of hexane were added to the resulting solution to separate the organic layer. The organic layer was washed with 280 ml of water and dried over anhydrous magnesium sulfate. The solvent was distilled off from the resulting solution under reduced pressure with a rotary evaporator to obtain 12 g of 5-DDOET-BPin represented by the following formula.

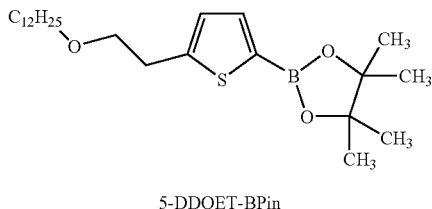

[Formula 60]

5-DDOET-BPin 0.11 g of tetrakis(triphenylphosphine)palladium(0) was added to a mixture of 0.34 g of 4,4'-dibromostilbene, 1.4 g of 5-DDOTE-BPin described above, 40 ml of toluene, 10 ml of ethanol and 12 ml of a 2M aqueous solution of sodium carbonate, and stirred at 100° C. for 16 hours under a nitrogen atmosphere. 50 ml of toluene and 50 ml of water were added to the resulting solution and stirred, and the produced solid was filtered. The obtained solid was recrystallized from toluene to obtain 0.61 g of light yellow powder.

The results of $^1$H-NMR analysis of the obtained powder are as follows and it was confirmed that this powder was compound [100]

$^1$H-NMR (CDCl$_3$ (d=ppm)): 0.85-0.90 (m, 6H), 1.26 (m, 36H), 1.53-1.62 (m, 4H), 3.07-3.12 (t, 4H), 3.45-3.50 (t, 4H), 3.66-3.71 (t, 4H), 6.81-6.82 (d, 2H), 7.10 (s, 2H), 7.15-7.16 (d, 2H), 7.48-7.57 (dd, 8H)

Further, DSC measurement was carried out and consequently the compound [100] exhibited a phase transition point between liquid crystal phase and crystal phase at 105.5° C. during temperature falling.

Synthesis Example 13

Synthesis of Compound [101]

7.2 g of thiophene was dissolved in 100 ml of tetrahydrofuran and cooled to 0° C. To this solution, 56 ml of n-butyllithium solution (1.6 mol/l hexane solution) was added dropwise and stirred for 3.5 hours. To this solution, 25 g of hexadecylbromide was added dropwise and stirred at room temperature for 5.5 hours. 100 ml of water and 100 ml of dichloromethane were added to the resulting solution to separate the organic layer. The organic layer was washed with 300 ml of water and dried over anhydrous magnesium sulfate. The resulting solution was concentrated by a rotary evaporator and purified by a column chromatography (filler: silica gel, eluent: hexane) to obtain 4.4 g of 2-n-hexadecylthiophene represented by the following formula.

4.40 g of 2-n-hexadecylthiophene was dissolved in 30 ml of tetrahydrofuran and was cooled to −20° C. To this solution, 11 ml of n-butyllithium solution (1.6 mol/l hexane solution) was added dropwise and stirred for 3 hours. Furthermore, to this solution, 3.3 g of 2-isoporopoxy-4,4,5,5-tetramethyl-[1,3,2]dioxaborolane was added dropwise and stirred at room temperature for 6.5 hours. 100 ml of water and 100 ml of dichloromethane were added to the resulting solution to separate the organic layer. The organic layer was washed with 400 ml of saturated salt water and dried over anhydrous magnesium sulfate. The solvent was distilled off from the resulting solution under reduced pressure with a rotary evaporator to obtain 5.5 g of 5-HDT-Bpin represented by the following formula.

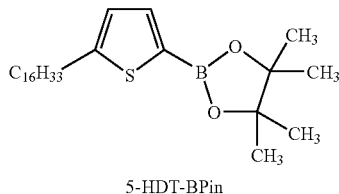

[Formula 61]

5-HDT-BPin 52 mg of tetrakis(triphenylphosphine)palladium(0) was added to a mixture of 0.34 g of dibromostilbene, 1.1 g of 5-HDT-BPin thiophene described above, 36.0 ml of toluene, 7.2 ml of ethanol and 10 ml of a 2M aqueous solution of sodium carbonate, and stirred at 100° C. for 17.5 hours under a nitrogen atmosphere. 50 ml of water and 100 ml of dichloromethane were added to the resulting solution and the solid was filtered. The obtained solid was washed with methanol and hexane, and the solid was recrystallized from 50 ml of toluene. The solid was vacuum-dried to obtain 0.47 g of yellow lustrous powder.

The results of $^1$H-NMR analysis of the obtained powder are as follows and it was confirmed that this powder was compound [101].

$^1$H-NMR (CDCl$_3$ (d=ppm)):0.85-0.87 (m, 6H), 1.26 (m, 52H), 1.70 (m, 4H) 2.78-2.84 (t, 4H), 6.72-6.74 (d, 2H), 7.08 (s, 2H), 7.12-7.13 (d, 2H), 7.46-7.55 (dd, 8H)

Further, DSC measurement was carried out and consequently the compound [101] exhibited a phase transition point between liquid crystal phase and crystal phase at 95.7° C. during temperature falling.

Synthesis Example 14

Synthesis of Compound [106]

Synthesis was performed with the same method as in Synthesis Example 11 except for using bromomethoxymethane in place of 1-bromononane to obtain 508 mg of yellow powder. The results of $^1$H-NMR analysis of the obtained powder are as follows and it was confirmed that this powder was compound [106].

$^1$H-NMR (CDCl$_3$ (d=ppm)):3.10-3.15 (t, 4H), 3.37 (s, 6H), 3.78-3.84 (t, 4H), 4.67 (s, 4H), 6.83-6.84 (d, 2H), 7.10 (s, 2H), 7.16-7.17 (d, 2H), 7.47-7.52 (dd, 8H)

Further, DSC measurement was carried out and consequently the compound [106] exhibited a phase transition point between liquid crystal phase and crystal phase at 71.4° C. during temperature falling.

Synthesis Example 15

Synthesis of Compound [130]

Synthesis was performed with the same method as in Synthesis Example 11 except for using 1-(2-bromoethoxy)-propane in place of 1-bromononane to obtain 110 mg of yellow powder. The results of $^1$H-NMR analysis of the obtained powder are as follows and it was confirmed that this powder was compound [130].

$^1$H-NMR (CDCl$_3$ (d=ppm)):0.90-0.95 (t, 6H), 1.57-1.69 (m, 4H), 3.10-3.15 (t, 4H), 3.42-3.47 (t, 4H), 3.60-3.68 (m, 8H), 3.73-3.78 (t, 4H), 6.82-6.83 (d, 2H), 7.10 (s, 2H), 7.15-7.17 (d, 2H), 7.48-7.57 (dd, 8H)

Further, DSC measurement was carried out and consequently the compound [130] exhibited a phase transition point between liquid crystal phase and crystal phase at 70.0° C. during temperature falling.

Synthesis Example 16

Synthesis of Compound [129]

Synthesis was performed with the same method as in Synthesis Example 11 except for using 1-(2-bromoethoxy)-butane in place of 1-bromononane to obtain 238 mg of yellow powder. The results of $^1$H-NMR analysis of the obtained powder are as follows and it was confirmed that this powder was compound [129].

$^1$H-NMR (CDCl$_3$ (d=ppm)):0.89-0.94 (t, 6H), 1.32-1.41 (m, 4H), 1.54-1.60 (t, 4H), 3.09-3.14 (t, 4H), 3.44-3.49 (t, 4H), 3.57-3.64 (m, 8H), 3.69-3.74 (t, 4H), 6.83-6.84 (d, 2H), 7.08 (s, 2H), 7.15-7.16 (d, 2H), 7.48-7.55 (dd, 8H)

Further, DSC measurement was carried out and consequently the compound [129] exhibited a phase transition point between liquid crystal phase and crystal phase at 66.1° C. during temperature falling.

Synthesis Example 17

Synthesis of Compound [133]

6.1 g of 2-thiopheneethanol was cooled to 0° C., and to this, a suspension formed by adding 2.8 g of sodium hydride (60% in oil) to 50 ml of tetrahydrofuran was added dropwise. The solution was stirred at 0° C. for 20 minutes under a nitrogen atmosphere, and to this, 8.2 g of 1-(2-bromo-ethoxy)-butane was added dropwise. Thereafter, the solution was heated to 90° C. and stirred for 9 hours. 100 ml of water and 100 ml of hexane were added to the reaction solution to separate the organic layer. The organic layer was washed with 300 ml of water and then dried over anhydrous magnesium sulfate. The resulting solution was concentrated by a rotary evaporator and purified by a column chromatography (filler: silica gel, eluent: hexane/dichloromethane) to obtain 3.5 g of 2-[2-(2-butoxy-ethoxy)ethyl]-thiophene.

3.5 g of 2-[2-(2-butoxy-ethoxy)ethyl]-thiophene was dissolved in 40 ml of tetrahydrofuran and cooled to −80° C. To this solution, 12 ml of n-butyllithium solution (1.6 mol/l hexane solution) was added dropwise and stirred for 3 hours. The temperature of the solution was raised to −30° C., and 4.0 g of 2-isoporopoxy-4,4,5,5-tetramethyl-[1,3,2]dioxaborolane was added dropwise thereto and stirred at room temperature for 20 hours. 2 ml of water was added to the resulting solution and stirred, and then dried over anhydrous magnesium sulfate. The resulting solution was concentrated by a rotary evaporator and purified by a column chromatography (filler: silica gel, eluent: dichloromethane) to obtain 3.1 g of 5-BEET-BPin represented by the following formula.

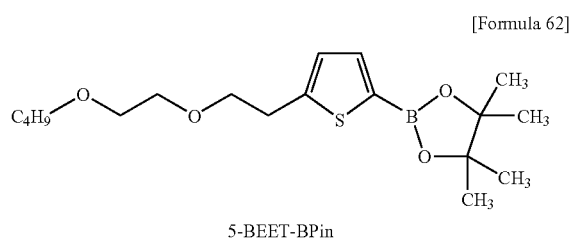

[Formula 62]

5-BEET-BPin 1.4 g of 2-bromothiophene and 2.5 g of 5-BEET-BPin described above were dissolved in 50 ml of dimethylformamide, and 8.6 g of potassium triphosphate and 0.69 g of [1,1'-bis(diphenylphosphino)ferrocene]palladium(II) dichloride were added thereto and stirred at 80° C. for 4 hours under a nitrogen atmosphere. 200 ml of toluene and 100 ml of water were added to the resulting solution to separate the organic layer. The organic layer was washed with 300 ml of water and then dried over anhydrous magnesium sulfate. The resulting solution was concentrated by a rotary evaporator and purified by a column chromatography (filler: silica gel, eluent: dichloromethane) to obtain 0.95 g of 5-BEEBT represented by the following formula.

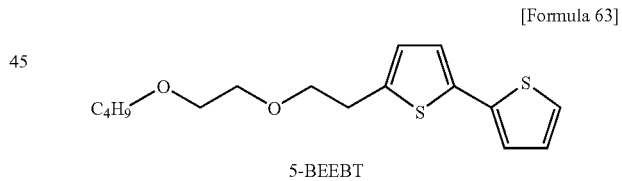

[Formula 63]

5-BEEBT 0.95 g of 5-BEEBT was dissolved in 20 ml of tetrahydrofuran and cooled to −80° C. To this solution, 2.5 ml of n-butyllithium solution (1.6 mol/l hexane solution) was added dropwise, and stirred for 3 hours. The temperature of the solution was raised to −30° C., and 4.0 g of 2-isoporopoxy-4,4,5,5-tetramethyl-[1,3,2]dioxaborolane was added dropwise thereto and stirred at room temperature for 4 hours. 2 ml of water was added to the resulting solution, and stirred and then dried over anhydrous magnesium sulfate. The resulting solution was concentrated by a rotary evaporator and purified by a column chromatography (filler: silica gel, eluent: dichloromethane) to obtain 0.60 g of 5-BEEBT-BPin represented by the following formula.

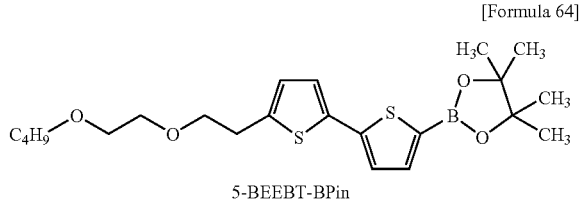

5-BEEBT-BPin 2.3 g of 4,4'-dibromostilbene and 1.2 g of 5-BEET-BPin were dissolved in 50 ml of dimethylformamide, and 7.3 g of potassium triphosphate and 0.57 g of [1,1'-bis(diphenylphosphino)ferrocene]palladium(II) dichloride were added thereto and stirred at 80° C. for 5 hours under a nitrogen atmosphere. 200 ml of toluene and 100 ml of water were added to the resulting solution to separate the organic layer. The organic layer was washed with 300 ml of water and then dried over anhydrous magnesium sulfate. The resulting solution was concentrated by a rotary evaporator and purified by a column chromatography (filler: silica gel, eluent: dichloromethane) to obtain 0.22 g of BEEBTS-Br represented by the following formula.

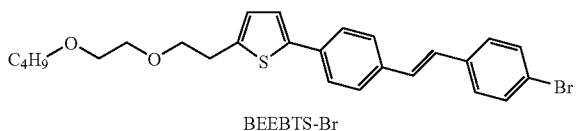

BEEBTS-Br 0.22 g of BEEBTS-Br described above and 0.60 g of 5-BEEBT-BPin described above were dissolved in 40 ml of dimethylformamide, and 0.48 g of potassium triphosphate and 37 mg of [1,1'-bis(diphenylphosphino)ferrocene]palladium(II) dichloride were added thereto and stirred at 80° C. for 5 hours under a nitrogen atmosphere. 200 ml of water was added to the resulting solution to separate the solid produced. The obtained solid was purified by a column chromatography (filler: silica gel, eluent: dichloromethane/ethyl acetate) to obtain 80 mg of yellow powder. The results of $^1$H-NMR analysis of the obtained powder are as follows and it was confirmed that this powder was compound [133].

$^1$H-NMR (CDCl3 (d=ppm)): 0.89-0.94 (t, 6H), 1.32-1.43 (m, 4H), 1.53-1.63 (m, 4H), 3.10-3.12 (t, 4H), 3.46-3.50 (t, 4H), 3.61-3.64 (m, 8H), 3.71-3.75 (m, 4H), 6.83-6.85 (d, 2H), 7.01-7.02 (d, 2H), 7.11 (s, 2H), 7.15-7.16 (d, 2H), 7.48-7.57 (dd, 8H)

Example 1

0.10 g of poly(3-hexylthiophene) (manufactured by Sigma-Aldrich, Corp., regioregular, number average molecular weight (Mn): 13,000, hereafter referred to as P3HT) being a conjugated polymer was added to 5 ml of chloroform in a flask and mixed by ultrasonic agitation in an ultrasonic cleaner (US-2 manufactured by Iuchi Seieido Co., Ltd., output 120 W) to obtain a chloroform solution of P3HT. Next, this solution was taken with a dropper and added dropwise to a mixture of 20 ml of methanol and 10 ml of 0.1 N hydrochloric acid by 0.5 ml to perform reprecipitation. The solidified P3HT was filtered through a membrane filter (manufactured by PTFE Co.: ethylene tetrafluoride) with a pore size of 0.1 μm and collected, and adequately rinsed with methanol, and the solvent remained was removed by vacuum-drying. Dissolving and reprecipitation were performed once more to obtain 90 mg of reprecipitated P3HT.

Next, 1.5 mg of CNT (manufactured by CNI Inc., single-walled CNT, purity 95%, hereinafter referred to as single-walled CNT) and 1.5 mg of P3HT described above were added to 30 ml of chloroform, and mixed at an output of 250 W for 30 minutes by ultrasonic agitation with an ultrasonic homogenizer (VCX-500 manufactured by TOKYO RIKAKI-KAI CO., LTD.) while cooling in ice. Ultrasonic application was stopped once at the time when ultrasonic wave was applied for 30 minutes, and 1.5 mg of P3HT described above was further added and ultrasonic wave is further applied thereto for 1 minute to obtain CNT complex dispersion A (the concentration of CNT to the solvent 0.05 g/l).

In order to check whether P3HT adheres to the CNTs in the CNT complex dispersion A or not, 5 ml of the dispersion A was filtered using a membrane filter to collect the CNTs on the filter. The collected CNTs were quickly transferred onto a silicon wafer before the solvent was dried to obtain dried CNTs. Elemental analysis of these CNTs was performed using X-ray photoelectron spectroscopy, and consequently a sulfur element contained in P3HT was detected. Therefore, it was confirmed that P3HT adheres to the CNT in the CNT complex dispersion A.

Next, a CNT complex dispersion for forming the semiconductor layer 4 was prepared. Chloroform was added to the dispersion A to dilute the dispersion A in such a way that the concentration of the CNT to the solvent is 0.02 g/l, and the diluted dispersion was filtered using a membrane filter (pore size 10 μm, diameter 25 mm, Omnipore membrane filter manufactured by Millipore Corp.) to eliminate the CNTs having a length of 10 μm or longer. The resulting filtrate was taken as CNT complex dispersion B. 0.90 mg of compound [8] as a organic semiconductor was added to a mixture of 0.18 ml of the CNT complex dispersion B and 0.12 ml of chloroform, and ultrasonic wave was applied thereto for 30 minutes with an ultrasonic cleaner (US-2 manufactured by Iuchi Seieido Co., Ltd., output 120 W) to prepare an organic semiconductor composite solution. Here, the concentration of compound [8] in chloroform was adjusted to 3 g/l and the concentration of CNTs to compound [8] was adjusted to 0.4% by weight.

Next, the organic semiconductor composite solution described above was coated by spin coating (800 rpm×0.3 second) to prepare an FET device shown in FIG. 1. The substrate 1 is an antimony-doped silicon wafer (specific resistance 0.02 Ωcm or less) with a thermally oxidized film (film thickness 300 nm). The silicon wafer is both the substrate and the gate electrode 2 and the thermally oxidized film is the insulating layer 3.

Next, by following the procedure described below, the gold source electrode 5 and the drain electrode 6 were formed. A positive type resist solution was dropped onto the aforementioned silicon wafer with a thermally oxidized film and coated with a spinner. Thereafter, the coated film was dried on a hot plate at 90° C. to form a resist film. Then, an ultraviolet light was irradiated to the resist film through a photomask with an exposure apparatus. Next, the wafer having the resist film was immersed in an alkaline aqueous solution and the part irradiated with the ultraviolet light was removed to obtain a resist film in which the area corresponding to comb-shaped electrodes was removed. Chrome was deposited in vacuum on the wafer having the resist film so as to be 5 nm in thickness and gold was deposited in vacuum so as to be 35 nm in thickness. Then, the wafer with the gold/chrome film and the resist film was immersed in acetone, and extra gold/chrome on the resist was removed by applying ultrasonic wave with an ultrasonic cleaner. Both gold comb-shaped electrodes were formed on the wafer in this way.

The width (channel width) of each of these both electrodes was set at 0.5 cm, the distance (channel length) between both electrodes was set at 20 μm, and the height of the electrodes was set at 40 nm. The organic semiconductor composite solution was dropped by 0.1 ml onto the substrate with the electrodes and coated by spin coating (800 rpm×0.3 second) to form the semiconductor layer having a thickness of 25 nm. Lead wires were attached to the electrodes, and then the resulting device was heat-treated at 100° C. for 1 hour in vacuum oven and was cooled gradually to 50° C. Thereafter, the oven was opened to the air and the FET device was moved to a measuring box and left to stand in vacuum.

Next, characteristics of current (Id) between source and drain-voltage (Vsd) between source and drain in changing a gate voltage (Vg) of the FET device were measured. The measurement was carried out in vacuum with Picoammeter/Voltage Source 4140B manufactured by Hewlett-Packard Co. The mobility in the linear region was determined from Id changes in changing Vg from +50 volts to −50 volts at Vsd of −5 volts to yield $6.5 \times 10^{-2}$ cm$^2$/V·sec. Further, the on/off ratio was determined from the ratio between the maximum value and the minimum value of Id to yield $4.0 \times 10^4$.

Next, after this device was left to stand for 24 hours in air, the FET characteristics were evaluated in air and consequently the on/off ratio was maintained at a high value of $4.5 \times 10^4$.

Comparative Example 1

An FET device was formed as in Example 1 except for using F8T2 (manufactured by American Dye Source Inc.,

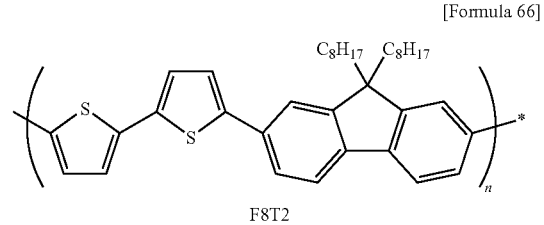

[Formula 66]

F8T2

Comparative Example 2

An FET device was prepared as in Example 1 except for using P3HT as an organic semiconductor, and the characteristics of the FET device were measured. The mobility in a linear region was determined from Id changes in changing Vg from +50 volts to −50 volts at Vsd of −5 volts to yield $1.5 \times 10^{-2}$ cm$^2$/V·sec. Further, the on/off ratio was determined from the ratio between the maximum value and the minimum value of Id to yield $3.2 \times 10^4$. Next, after this device was left to stand for 24 hours in air, the FET characteristics were evaluated in air, and consequently the on/off ratio was significantly reduced to $5.8 \times 10^1$.

Examples 2 to 5

FET devices were formed in the same manner as in Example 1 except for using compounds shown in Table 1 as organic semiconductors, and the characteristics of the FET devices were measured. The results of the evaluations in respective Examples are shown in Table 1.

TABLE 1

| | Organic semiconductor | CNT complex | Oriented layer | In vacuum Mobility (cm$^2$/V·sec) | On/off ratio | In atmosphere On/off ratio |
|---|---|---|---|---|---|---|
| Example 1 | Compound[8] | Complex with P3HT | None | $6.5 \times 10^{-2}$ | $4.0 \times 10^4$ | $4.5 \times 10^4$ |
| Example 2 | Compound[34] | Complex with P3HT | None | $1.8 \times 10^{-2}$ | $2.1 \times 10^4$ | $2.3 \times 10^4$ |
| Example 3 | Compound[44] | Complex with P3HT | None | $5.1 \times 10^{-2}$ | $1.3 \times 10^4$ | $1.4 \times 10^4$ |
| Example 4 | Compound[43] | Complex with P3HT | None | $4.5 \times 10^{-2}$ | $1.5 \times 10^4$ | $1.5 \times 10^4$ |
| Example 5 | Compound[48] | Complex with P3HT | None | $6.2 \times 10^{-2}$ | $1.2 \times 10^4$ | $1.3 \times 10^4$ |
| Example 6 | Compound[82] | Complex with P3HT | None | $7.8 \times 10^{-2}$ | $2.8 \times 10^4$ | $3.1 \times 10^4$ |
| Example 7 | Compound[97] | Complex with P3HT | None | $6.4 \times 10^{-2}$ | $1.6 \times 10^4$ | $1.5 \times 10^4$ |
| Example 8 | Compound[98] | Complex with P3HT | None | $9.5 \times 10^{-2}$ | $5.8 \times 10^4$ | $6.0 \times 10^4$ |
| Example 9 | Compound[100] | Complex with P3HT | None | $8.2 \times 10^{-2}$ | $2.3 \times 10^4$ | $2.5 \times 10^4$ |
| Example 10 | Compound[8] | Complex with P3HT | PETS | $7.5 \times 10^{-2}$ | $3.8 \times 10^4$ | $4.1 \times 10^4$ |
| Example 11 | Compound[7] | Complex with P3HT | PETS | $2.7 \times 10^{-2}$ | $1.1 \times 10^4$ | $1.0 \times 10^4$ |
| Example 12 | Compound[6] | Complex with P3HT | PETS | $4.6 \times 10^{-2}$ | $1.0 \times 10^4$ | $1.2 \times 10^4$ |
| Example 13 | Compound[33] | Complex with P3HT | PETS | $2.5 \times 10^{-2}$ | $2.4 \times 10^4$ | $2.3 \times 10^4$ |
| Example 14 | Compound[98] | Complex with P3HT | PETS | $1.3 \times 10^{-1}$ | $6.4 \times 10^4$ | $6.5 \times 10^4$ |
| Example 18 | Compound[106] | Complex with P3HT | None | $1.5 \times 10^{-1}$ | $8.5 \times 10^4$ | $8.6 \times 10^4$ |
| Example 19 | Compound[130] | Complex with P3HT | None | $1.4 \times 10^{-1}$ | $9.1 \times 10^4$ | $9.2 \times 10^4$ |
| Example 20 | Compound[129] | Complex with P3HT | None | $1.4 \times 10^{-1}$ | $9.3 \times 10^4$ | $9.5 \times 10^4$ |
| Example 21 | Compound[133] | Complex with P3HT | None | $9.2 \times 10^{-2}$ | $6.4 \times 10^4$ | $6.7 \times 10^4$ |
| Comparative Example 1 | FBT2 | Complex with P3HT | None | $2.0 \times 10^{-4}$ | $1.6 \times 10^3$ | |
| Comparative Example 2 | P3HT | Complex with P3HT | None | $1.5 \times 10^{-2}$ | $3.2 \times 10^4$ | $5.8 \times 10^1$ |

Mn: 5500), shown below, as an organic semiconductor, and the characteristics of the FET device were measured. The mobility in the linear region was determined from Id changes in changing Vg from +50 volts to −50 volts at Vsd of −5 volts to yield $2.0 \times 10^{-4}$ cm$^2$/V·sec. Further, the on/off ratio was determined from the ratio between the maximum value and the minimum value of Id to yield $1.6 \times 10^3$.

Example 6

An FET device was prepared as in Example 1 except that compound [82] was used in place of compound [8] and the prepared device was heat-treated at 120° C. for 1 hour on a hot plate in air, and the characteristics of the FET device were evaluated. The results of the evaluations are shown in Table 1.

Example 7

An FET device was prepared as in Example 1 except for using compound [97] in place of compound [8], and the characteristics of the FET device were evaluated. The results of the evaluations are shown in Table 1.

Example 8

An FET device was prepared as in Example 1 except that compound [98] was used in place of compound [8] and the prepared device was heat-treated at 150° C. for 1 hour on a hot plate in air, and the characteristics of the FET device were evaluated. The results of the evaluations are shown in Table 1.

Example 9

An FET device was prepared as in Example 1 except that compound [100] was used in place of compound [8] and the prepared device was heat-treated at 120° C. for 1 hour on a hot plate in air, and the characteristics of the FET device were evaluated. The results of the evaluations are shown in Table 1.

Example 10

An FET device was prepared as in Example 1 except for forming an orientation layer between the insulating layer 3 and the semiconductor layer 4. The procedure of preparing the orientation layer is shown below.

The surface of the substrate having the insulating layer 3 was subjected to a UV/ozone treatment for 30 minutes and then immersed for 10 minutes in a 20 mM hexane solution of phenylethyltrichlorosilane (PETS) (manufactured by Sigma-Aldrich., Corp., purity 95% or higher) under a nitrogen atmosphere. Thereafter, the substrate was taken out from the solution, washed with hexane and acetone, and then dried at 100° C. for 10 minutes on a hot plate to obtain an orientation layer.

Next, the characteristics of the resulting FET device were evaluated. The results of the evaluations are shown in Table 1.

Examples 11 to 13

FET devices were prepared as in Example 10 except for using compounds shown in Table 1 in place of compound [8], and the characteristics of the FET devices were measured. The results of the evaluations of respective Examples are shown in Table 1.

Example 14

An FET device was prepared as in Example 10 except that compound [98] was used in place of compound [8] and the prepared device was heat-treated at 150° C. for 1 hour on a hot plate in air, and the characteristics of the FET device were evaluated. The results of the evaluations are shown in Table 1.

Example 15

An FET device was formed as in Example 1 except for adjusting the concentration of CNT to compound [8] so as to be 0.2% by weight, and the characteristics of the FET device were measured. The mobility in the linear region was determined from Id changes in changing Vg from +50 volts to −50 volts at Vsd of −5 volts to yield $2.7 \times 10^{-2}$ cm$^2$/V·sec. Further, the on/off ratio was determined from the ratio between the maximum value and the minimum value of Id to yield $3.8 \times 10^4$. Next, after this device was left to stand for 24 hours in air, the FET characteristics were evaluated in air, and consequently the on/off ratio was maintained at a high value of $3.7 \times 10^4$.

Example 16

Another FET device shown in FIG. 1 was prepared. Chrome and gold were deposited in vacuum on the glass substrate 1 (film thickness 0.7 mm) through a mask so as to be 5 nm and 50 nm in thickness, respectively, with a resistance heating method to form the gate electrode 2. Next, polyvinylphenol (manufactured by Sigma-Aldrich., Corp., weight average molecular weight (Mw): 20000, hereinafter, referred to as PVP), polymelamine-co-formaldehyde (manufactured by Sigma-Aldrich., Corp., number average molecular weight (Mn): 432, hereinafter, referred to as PMF) and propylene glycol monomethyl ether acetate (manufactured by Sigma-Aldrich., Corp., hereinafter, referred to as PGMEA) were mixed. In this case, blending weight ratio (PVP:PMF:PGMEA) of components was set at 10:5:100. The resulting solution was coated by spin coating (150 rpm×30 second) onto the glass substrate on which the gate electrode was formed, and heat-treated at 200° C. for 1 hour under a nitrogen stream to form the insulating layer 3 having a thickness of 600 nm. Next, gold was deposited in vacuum through a mask so as to be 50 nm in thickness with a resistance heating method to form the source electrode 5 and the drain electrode 6.

A width (channel width) of each of these both electrodes was set at 0.1 cm, and a distance (channel length) between both electrodes was set at 100 μm. The organic semiconductor composite solution prepared as in Example 1 was dropped by 0.1 ml onto the substrate with the electrodes and coated by spin coating (800 rpm×0.3 second) to form the semiconductor layer having a thickness of 25 nm. Lead wires were attached to the electrodes, and then the resulting FET device was heat-treated at 100° C. for 1 hour in a vacuum oven and was cooled gradually to 50° C. Thereafter, the oven was opened to air, and the FET device was moved to a measuring box and left to stand in vacuum.

Next, the characteristics of the resulting FET device were evaluated. The mobility in the linear region was determined from Id changes in changing Vg from +50 volts to −50 volts at Vsd of −5 volts to yield $5.0 \times 10^{-2}$ cm$^2$/V·sec. Further, the on/off ratio was determined from the ratio between the maximum value and the minimum value of Id to yield $6.8 \times 10^3$.

Example 17

An FET device was prepared as in Example 16 except for using compound [98] in place of compound [8], and the characteristics of the FET device were evaluated. The mobility in the linear region was determined from Id changes in changing Vg from +50 volts to −50 volts at Vsd of −5 volts to yield $9.2 \times 10^{-2}$ cm$^2$/V·sec. Further, the on/off ratio was determined from the ratio between the maximum value and the minimum value of Id to yield $8.5 \times 10^3$.

Examples 18 to 21

FET devices were prepared as in Example 1 except for using compounds shown in Table 1 in place of compound [8], and the characteristics of the FET devices were measured. The results of the evaluations of respective Examples are shown in Table 1.

Example 22

An FET device was prepared as in Example 16 except for using compound [129] in place of compound [8], and the characteristics of the FET device were evaluated. The mobility in the linear region was determined from Id changes in changing Vg from +50 volts to −50 volts at Vsd of −5 volts to yield $1.4 \times 10^{-1}$ cm$^2$/V·sec. Further, the on/off ratio was determined from the ratio between the maximum value and the minimum value of Id to yield $2.4 \times 10^4$.

Comparative Example 3

An FET device was prepared as in Example 16 except for using OSC-1, shown below, in place of compound [8], and the characteristics of the FET device were measured. The mobility in the linear region was determined from Id changes in changing Vg from +50 volts to −50 volts at Vsd of −5 volts to yield $1.2 \times 10^{-2}$ cm$^2$/V·sec. Further, the on/off ratio was determined from the ratio between the maximum value and the minimum value of Id to yield $4.5 \times 10^2$.

[Formula 67]

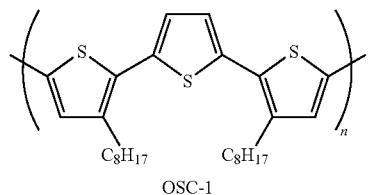

OSC-1

Example 23

An FET device was formed as in Example 16 except that P3HT was not used in preparing the organic semiconductor composite solution, and the characteristics of the FET device were measured. The mobility in the linear region was determined from Id changes in changing Vg from +50 volts to −50 volts at Vsd of −5 volts to yield $1.7 \times 10^{-2}$ cm$^2$/V·sec. Further, the on/off ratio was determined from the ratio between the maximum value and the minimum value of Id to yield $1.9 \times 10^3$.

Example 24

An FET device was formed as in Example 1 except for forming the semiconductor layer 4 by using a chloroform solution (3 g/l) of compound [8] in place of the organic semiconductor composite solution, and the characteristics of the FET device were measured. The mobility in the linear region was determined from Id changes in changing Vg from +50 volts to −50 volts at Vsd of −5 volts to yield $1.2 \times 10^{-3}$ cm$^2$/V·sec. Further, the on/off ratio was determined from the ratio between the maximum value and the minimum value of Id to yield $2.5 \times 10^4$.

Next, after this device was left to stand for 24 hours in air, the FET characteristics were evaluated in air, and consequently the on/off ratio was maintained at a high value of $2.1 \times 10^4$.

Comparative Example 4

An FET device was prepared as in Example 24 except for using poly(3-hexylthiophene) (manufactured by Sigma-Aldrich., Corp., regioregular, number average molecular weight (Mn): 13,000, hereafter referred to as P3HT) in place of compound [8], and the characteristics of the FET device were measured. The mobility in the linear region was determined from Id changes in changing Vg from +50 volts to −50 volts at Vsd of −5 volts to yield $4.3 \times 10^{-4}$ cm$^2$/V·sec. Further, the on/off ratio was determined from the ratio between the maximum value and the minimum value of Id to yield $1.6 \times 10^3$.

Next, after this device was left to stand for 24 hours in air, the FET characteristics were evaluated in air, and consequently the on/off ratio was reduced to $1.2 \times 10^1$.

Comparative Example 5

An FET device was prepared as in Example 24 except for using OSC-2, shown below, in place of compound [8], and the characteristics of the FET device were measured. The mobility in the linear region was determined from Id changes in changing Vg from +50 volts to −50 volts at Vsd of −5 volts to yield $3.5 \times 10^{-5}$ cm$^2$/V·sec. Further, the on/off ratio was determined from the ratio between the maximum value and the minimum value of Id to yield $2.4 \times 10^3$.

Next, after this device was left to stand for 24 hours in air, the FET characteristics were evaluated in air, and consequently the on/off ratio was $8.0 \times 10^2$.

[Formula 68]

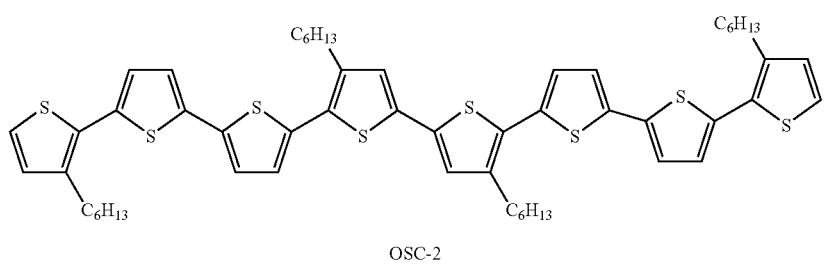

OSC-2

Comparative Example 6

An FET device was prepared as in Example 24 except for using OSC-3, shown below, in place of compound [8], and the characteristics of the FET device were measured. The mobility in the linear region was determined from Id changes in changing Vg from +50 volts to −50 volts at Vsd of −5 volts to yield $5.1 \times 10^{-5}$ cm$^2$/V·sec. Further, the on/off ratio was determined from the ratio between the maximum value and the minimum value of Id to yield $1.5 \times 10^3$.

Next, after this device was left to stand for 24 hours in air, the FET characteristics were evaluated in air, and consequently the on/off ratio was $9.5 \times 10^2$.

[Formula 69]

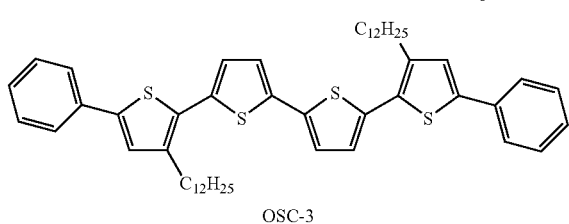

OSC-3

Example 25

An FET device was formed as in Example 11 except for forming the semiconductor layer by using a chloroform solution of compound [8] alone in place of the organic semiconductor composite solution, and the characteristics of the FET device were measured. The mobility in the linear region was determined from Id changes in changing Vg from +50 volts to −50 volts at Vsd of −5 volts to yield $4.5 \times 10^{-3}$ cm²/V·sec. Further, the on/off ratio was determined from the ratio between the maximum value and the minimum value of Id to yield $3.6 \times 10^4$.

Next, after this device was left to stand for 0.24 hours in air, the FET characteristics were evaluated in air, and consequently the on/off ratio was maintained at a high value of $3.8 \times 10^4$.

Examples 26, 27

FET devices were prepared as in Example 25 except for using compounds shown in Table 2 in place of compound [8], and the characteristics of the FET devices were evaluated. The results of the evaluations of respective Examples are shown in Table 2.

Example 28

An FET device was prepared as in Example 25 except that compound [98] was used in place of compound [8] and the prepared device was heat-treated at 150° C. for 1 hour on a hot plate, and the characteristics of the FET device were evaluated. The results of the evaluations are shown in Table 2.

Examples 29 to 31

FET devices were prepared as in Example 24 except for using compounds shown in Table 2 in place of compound [98], and the characteristics of the FET devices were evaluated. The results of the evaluations of respective Examples are shown in Table 2.

Industrial Applicability

The organic transistor material of the present invention is used for an organic field effect transistor which can be used for a smart card, a security tag, a transistor array for a flat-panel display and the like, and other organic transistors.

The invention claimed is:

1. An organic semiconductor composite containing carbon nanotubes and a thiophene compound represented by the following general formula (12):

wherein $B^3$ and $B^4$ are the same or different and each independently represents a group represented by the following general formula (13), and $A^2$ represents a bivalent linking group represented by any one of the following general formulas (14) to (18);

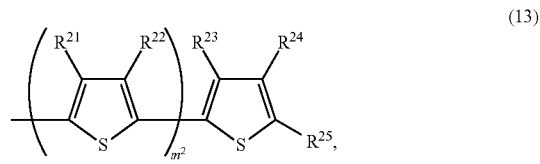

wherein $R^{21}$ to $R^{25}$ are the same or different and each of $R^{21}$ to $R^{25}$ is independently selected from the group consisting of hydrogen, an alkyl group, a cycloalkyl group, a

TABLE 2

| | Semiconductor layer | Oriented layer | In vacuum Mobility (cm²/V·sec) | On/off ratio | In atmosphere On/off ratio |
|---|---|---|---|---|---|
| Example 24 | Compound[8] | None | $1.2 \times 10^{-3}$ | $2.5 \times 10^4$ | $2.1 \times 10^4$ |
| Example 25 | Compound[8] | PETS | $4.5 \times 10^{-3}$ | $3.6 \times 10^4$ | $3.8 \times 10^4$ |
| Example 26 | Compound[48] | PETS | $3.7 \times 10^{-3}$ | $1.8 \times 10^4$ | $1.7 \times 10^4$ |
| Example 27 | Compound[43] | PETS | $8.0 \times 10^{-4}$ | $1.2 \times 10^4$ | $1.3 \times 10^4$ |
| Example 28 | Compound[98] | PETS | $7.5 \times 10^{-3}$ | $3.8 \times 10^4$ | $4.4 \times 10^4$ |
| Example 29 | Compound[106] | None | $2.4 \times 10^{-3}$ | $2.6 \times 10^4$ | $2.3 \times 10^4$ |
| Example 30 | Compound[129] | None | $2.1 \times 10^{-3}$ | $2.8 \times 10^4$ | $2.8 \times 10^4$ |
| Example 31 | Compound[133] | None | $1.3 \times 10^{-3}$ | $1.7 \times 10^4$ | $1.5 \times 10^4$ |
| Comparative Example 4 | P3HT | None | $4.3 \times 10^{-4}$ | $1.6 \times 10^3$ | $1.2 \times 10^1$ |
| Comparative Example 5 | [OSC-1] | None | $3.5 \times 10^{-5}$ | $2.4 \times 10^3$ | $8.0 \times 10^2$ |
| Comparative Example 6 | [OSC-2] | None | $5.1 \times 10^{-5}$ | $1.5 \times 10^3$ | $9.5 \times 10^2$ | heterocyclic group, an alkenyl group, a cycloalkenyl group, an alkynyl group, an alkoxy group, an alkylthio group, an aryl ether group, an arylthio ether group, an aryl group, a heteroaryl group, a halogen atom, a cyano group, a formyl group, an alkylcarbonyl group, an arylcarbonyl group, a carboxyl group, an alkoxycarbonyl group, an aryloxycarbonyl group, an alkylcarbonyloxy group, an arylcarbonyloxy group, a carbamoyl group, an amino group and a silyl group, and in $R^{21}$ to $R^{25}$, adjacent substituents may form a ring with each other, $m^2$ is an integer of 0 to 11, and $R^{21}$s and $R^{22}$s are the same or different when $m^2$ is 2 or more; and

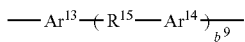 (14)

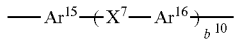 (15)

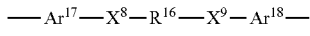 (16)

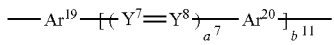 (17)

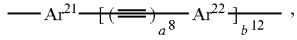 (18), wherein $R^{15}$ and $R^{16}$ are the same or different and each independently represents an alkylene group, a cycloalkylene group, a bivalent heterocyclic group, a carbonyl group, an oxycarbonyl group or a carbonyloxy group, $Ar^{13}$ to $Ar^{22}$ are the same or different and each independently represents an arylene group or a heteroarylene group having a six-membered ring, $X^7$ to $X^9$ are the same or different and each independently represents —O—, —S— or —SiR$^{18}$R$^{19}$—, $Y^7$ and $Y^8$ may be the same or different and each independently represents —CR$^{20}$= or —N=, $R^{18}$ to $R^{20}$ are selected from the same group as $R^1$ to $R^5$, $a^7$ and $a^8$ represent 1 or 2, and $b^9$ to $b^{12}$ represent an integer of 1 to 4.

2. The organic semiconductor composite according to claim 1, wherein said $B^3$ and said $B^4$ in the general formula (12) are the same group.

3. The organic semiconductor composite according to claim 1, wherein said $R^{25}$ in the general formula (13) is an alkyl group substituted by a group containing one or more oxygen atoms.

4. The organic semiconductor composite according to claim 1, wherein said thiophene compound represented by the general formula (12) is a compound having one or more liquid crystalline states.

5. The organic semiconductor composite according to claim 1, wherein said carbon nanotubes are carbon nanotubes having a conjugated polymer adhering to at least a part of the surface thereof.

6. An organic transistor material containing a thiophene compound represented by the following general formula (12):

 (12), wherein $B^3$ and $B^4$ are the same or different and each independently represents a group represented by the following general formula (13), and $A^2$ represents a bivalent linking group represented by any one of the following general formulas (14), (15), (16) and (18);

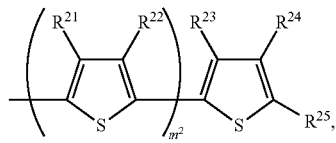 (13)

wherein $R^{21}$ to $R^{25}$ are the same or different and each is independently selected from the group consisting of hydrogen, an alkyl group, a cycloalkyl group, a heterocyclic group, an alkenyl group, a cycloalkenyl group, an alkynyl group, an alkoxy group, an alkylthio group, an aryl ether group, an arylthio ether group, an aryl group, a heteroaryl group, a halogen atom, a cyano group, a formyl group, an alkylcarbonyl group, an arylcarbonyl group, a carboxyl group, an alkoxycarbonyl group, an aryloxycarbonyl group, an alkylcarbonyloxy group, an arylcarbonyloxy group, a carbamoyl group, an amino group and a silyl group, and in $R^{21}$ to $R^{25}$, adjacent substituents form a ring with each other, $m^2$ is an integer of 0 to 11, and $R^{21}$s and $R^{22}$s are the same or different when $m^2$ is 2 or more; and

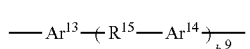 (14)

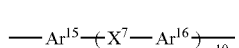 (15)

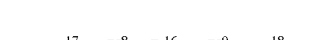 (16)

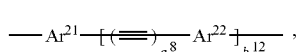 (18), wherein $R^{15}$ and $R^{16}$ are the same or different and each independently represents an alkylene group, a cycloalkylene group, a bivalent heterocyclic group, a carbonyl group, an oxycarbonyl group or a carbonyloxy group, $Ar^{13}$ to $Ar^{18}$ and $Ar^{21}$ to $Ar^{22}$ are the same or different and each independently represents an arylene group or a heteroarylene group having a six-membered ring, $X^7$ to $X^9$ are the same or different and each independently represents —O—, —S— or —SiR$^{18}$R$^{19}$—, $R^{18}$ and $R^{19}$ are selected from the same group as $R^{21}$ to $R^{25}$, and in $R^{18}$ and $R^{19}$, adjacent substituents form a ring with each other, $a^8$ represents 1 or 2, and $b^9$, $b^{10}$ and $b^{12}$ represent an integer of 1 to 4.

7. The organic transistor material according to claim 6, wherein said $B^3$ and said $B^4$ in the general formula (12) are the same group.

8. The organic transistor material according to claim 6, wherein said $R^{25}$ in the general formula (13) is an alkyl group substituted by a group containing one or more oxygen atoms.

9. The organic transistor material according to claim 6, wherein said thiophene compound represented by the general formula (12) is a compound having one or more liquid crystalline states.

10. An organic field effect transistor having a gate electrode, an insulating layer, a semiconductor layer, a source electrode and a drain electrode, wherein said semiconductor layer contains the organic semiconductor composite according to claim 1.

11. An organic field effect transistor having a gate electrode, an insulating layer, a semiconductor layer, a source electrode and a drain electrode, wherein said semiconductor layer contains an organic transistor material containing a thiophene compound represented by the following general formula (12):

 (12), wherein $B^3$ and $B^4$ are the same or different and each independently represents a group represented by the following general formula (13), and $A^2$ represents a bivalent linking group represented by any one of the following general formulas (14) to (18);

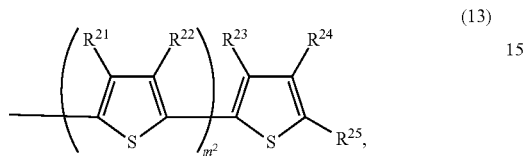 (13)

wherein $R^{21}$ to $R^{25}$ are the same or different and each is independently selected from the group consisting of hydrogen, an alkyl group, a cycloalkyl group, a heterocyclic group, an alkenyl group, a cycloalkenyl group, an alkynyl group, an alkoxy group, an alkylthio group, an aryl ether group, an arylthio ether group, an aryl group, a heteroaryl group, a halogen atom, a cyano group, a formyl group, an alkylcarbonyl group, an arylcarbonyl group, a carboxyl group, an alkoxycarbonyl group, an aryloxycarbonyl group, an alkylcarbonyloxy group, an arylcarbonyloxy group, a carbamoyl group, an amino group and a silyl group, and in $R^{21}$ to $R^{25}$, adjacent substituents form a ring with each other, $m^2$ is an integer of 0 to 11, and $R^{21}$s and $R^{22}$s are the same or different when $m^2$ is 2 or more; and

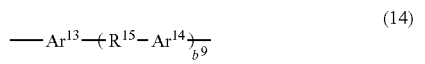 (14)

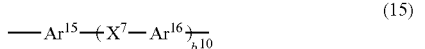 (15)

 (16)

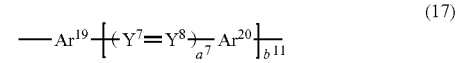 (17)

 (18)

wherein $R^{15}$ and $R^{16}$ are the same or different and each independently represents an alkylene group, a cycloalkylene group, a bivalent heterocyclic group, a carbonyl group, an oxycarbonyl group or a carbonyloxy group, $Ar^{13}$ to $Ar^{22}$ are the same or different and each independently represents an arylene group or a heteroarylene group having a six-membered ring, $X^7$ to $X^9$ are the same or different and each represents —O—, —S— or —SiR$^{18}$R$^{19}$—, $Y^7$ and $Y^8$ are the same or different and each independently represents —CR$^{20}$= or —N=, $R^{18}$ to $R^{20}$ are selected from the same group as $R^{21}$ to $R^{25}$ described above, $a^7$ and $a^8$ represent 1 or 2, and $b^9$ to $b^{12}$ represent an integer of 1 to 4.

12. An organic semiconductor composite containing carbon nanotubes and a thiophene compound represented by the following general formula (12):

 (12), wherein $B^3$ and $B^4$ are the same or different and each independently represents a group represented by the following general formula (13), and $A^2$ represents a bivalent linking group represented by any one of the following general formulas (14) and (16) to (18);

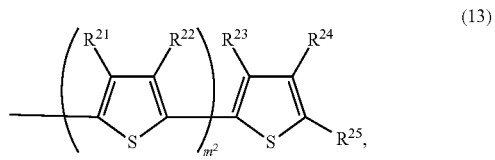 (13)

wherein $R^{21}$ to $R^{25}$ are the same or different and each of $R^{21}$ to $R^{25}$ is independently selected from the group consisting of hydrogen, an alkyl group, a cycloalkyl group, a heterocyclic group, an alkenyl group, a cycloalkenyl group, an alkynyl group, an alkoxy group, an alkylthio group, an aryl ether group, an arylthio ether group, an aryl group, a heteroaryl group, a halogen atom, a cyano group, a formyl group, an alkylcarbonyl group, an arylcarbonyl group, a carboxyl group, an alkoxycarbonyl group, an aryloxycarbonyl group, an alkylcarbonyloxy group, an arylcarbonyloxy group, a carbamoyl group, an amino group and a silyl group, and in $R^{21}$ to $R^{25}$, adjacent substituents may form a ring with each other, $m^2$ is an integer of 0 to 11, and $R^{21}$s and $R^{22}$s are the same or different when $m^2$ is 2 or more; and

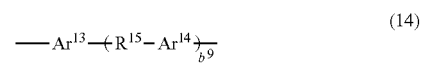 (14)

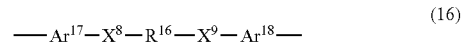 (16)

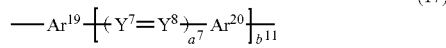 (17)

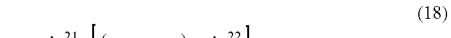 (18)

wherein $R^{15}$ and $R^{16}$ are the same or different and each independently represents an alkylene group, a cycloalkylene group, a bivalent heterocyclic group, a carbonyl group, an oxycarbonyl group or a carbonyloxy group, $Ar^{13}$ to $Ar^{14}$ and $Ar^{17}$ to $Ar^{22}$ are the same or different and each independently represents an arylene group or a heteroarylene group having a six-membered ring, $X^8$ to $X^9$ are the same or different and each independently represents —O—, —S— or —SiR$^{18}$R$^{19}$—, $Y^7$ and $Y^8$ may be the same or different and each independently represents —CR$^{20}$= or —N=, $R^{18}$ to $R^{20}$ are selected from the same group as $R^1$ to $R^5$, $a^7$ and $a^8$ represent 1 or 2, and $b^9$ and $b^{10}$ to $b^{12}$ represent an integer of 1 to 4.

* * * * *